US012588277B2

(12) United States Patent　　(10) Patent No.: US 12,588,277 B2
Katakam et al.　　(45) Date of Patent: Mar. 24, 2026

(54) FORMING WRAP AROUND CONTACT WITH SELF-ALIGNED BACKSIDE CONTACT

(71) Applicant: International Business Machines Corporation, Armonk, NY (US)

(72) Inventors: Shravana Kumar Katakam, Lehi, UT (US); Tao Li, Slingerlands, NY (US); Ruilong Xie, Niskayuna, NY (US); Nicholas Anthony Lanzillo, Wynantskill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 502 days.

(21) Appl. No.: 18/156,024

(22) Filed: Jan. 18, 2023

(65) Prior Publication Data

US 2024/0243128 A1　Jul. 18, 2024

(51) Int. Cl.
　　*H01L 27/092*　　(2006.01)
　　*H01L 21/762*　　(2006.01)
　　*H01L 21/8238*　　(2006.01)
　　*H10D 84/01*　　(2025.01)
　　*H10D 84/03*　　(2025.01)
　　*H10D 84/85*　　(2025.01)

(52) U.S. Cl.
　　CPC ....... *H10D 84/85* (2025.01); *H01L 21/76224* (2013.01); *H10D 84/0186* (2025.01); *H10D 84/0188* (2025.01); *H10D 84/038* (2025.01)

(58) Field of Classification Search
　　CPC ..................... H10D 84/0149; H10D 84/0186
　　See application file for complete search history.

(56) References Cited

U.S. PATENT DOCUMENTS

| | | | |
|---|---|---|---|
| 9,570,395 | B1 | 2/2017 | Sengupta et al. |
| 10,586,765 | B2 | 3/2020 | Smith et al. |
| 10,636,739 | B2 | 4/2020 | Beyne et al. |
| 10,700,207 | B2 | 6/2020 | Chen et al. |
| 10,734,224 | B2 | 8/2020 | Smith et al. |
| 11,133,254 | B2 | 9/2021 | Lai et al. |
| 11,289,606 | B2 | 3/2022 | Ju et al. |
| 11,450,665 | B2 | 9/2022 | Chiang et al. |

(Continued)

FOREIGN PATENT DOCUMENTS

WO　　2022015926 A1　　1/2022

OTHER PUBLICATIONS ip.com | "Self-Aligned Buried Contact to Buried Power Rail with WAC." IP.com No. IPCOM000259609D IP.com Electronic Publication Date: Aug. 27, 2019, 8 pages.

(Continued)

*Primary Examiner* — John A Bodnar
(74) *Attorney, Agent, or Firm* — Amin, Turocy & Watson, LLP

(57)　　　　　ABSTRACT

One or more systems, devices, and/or methods of fabrication provided herein relate to reduced resistance between contacts and source/drain epis. According to one embodiment, a semiconductor device can comprise a source/drain region comprising a top portion, a sidewall portion and a bottom portion, a dielectric bar located adjacent to the source/drain region, and a contact in direct contact with the top portion, the sidewall portion and the bottom portion of the source/drain region and with the dielectric bar.

13 Claims, 57 Drawing Sheets

(56) References Cited

U.S. PATENT DOCUMENTS

| | | | |
|---|---|---|---|
| 2020/0105671 A1 | 4/2020 | Lai et al. | |
| 2021/0111115 A1 | 4/2021 | Morrow et al. | |
| 2021/0134721 A1 | 5/2021 | Chiang et al. | |
| 2021/0202385 A1 | 7/2021 | Huang et al. | |
| 2021/0305252 A1 | 9/2021 | Chiang et al. | |
| 2021/0305381 A1 | 9/2021 | Chiang et al. | |
| 2021/0336019 A1* | 10/2021 | Su | H10D 30/6735 |
| 2021/0351303 A1 | 11/2021 | Ju et al. | |
| 2021/0376071 A1 | 12/2021 | Liu et al. | |
| 2021/0376093 A1 | 12/2021 | Chu et al. | |
| 2021/0399099 A1 | 12/2021 | Chu et al. | |
| 2022/0223698 A1 | 7/2022 | Xie et al. | |
| 2023/0275124 A1* | 8/2023 | Guler | H10D 30/0198 |
| | | | 257/288 |

OTHER PUBLICATIONS

Spessot, A. et al. | "Device Scaling roadmap and its implications for Logic and Analog platform." 2020 IEEE BiCMOS and Compound Semiconductor Integrated Circuits and Technology Symposium (BCICTS) | 978-1-7281-9749-4/20/$31.00 © 2020 IEEE | DOI: 10.1109/BCICTS48439.2020.9392980, 9 pages.

Ryckaert, J. et al. | "Enabling Sub-5nm CMOS Technology Scaling Thinner and Taller!" 2019 IEEE International Electron Devices Meeting (IEDM), 2019, pp. 29.4.1-29.4.4, doi: 10.1109/IEDM19573. 2019.8993631, 4 pages.

Mathur et al., "Buried Bitline for sub-5nm SRAM Design", 2020 IEEE International Electron Devices Meeting (IEDM), Dec. 2020, 04 pages.

* cited by examiner

SiGe55

SiGe30        EtchStop

Si        Hard Mask

Spacer

ILD

Gate Cut

Gate

Spacer/
BDI

PFET
S/D

Dielectric

STI

NFET
S/D

SiGe55

Spacer
Liner

Place
holder

SiGe30

EtchStop

OPL

Si

Hard
Mask

Inner
Spacer

1912

1911

1913

Deep Cut    EtchStop    Metal    Gate    Spacer/ BDI    PFET S/D    BEOL    Spacer    ILD    Gate Cut Si    Hard Mask    Inner Spacer    Dielectric    STI    NFET S/D    Top ILD    Via    Shallow Cut    Spacer Liner    Place holder

2501

Figures 25B, 25C:
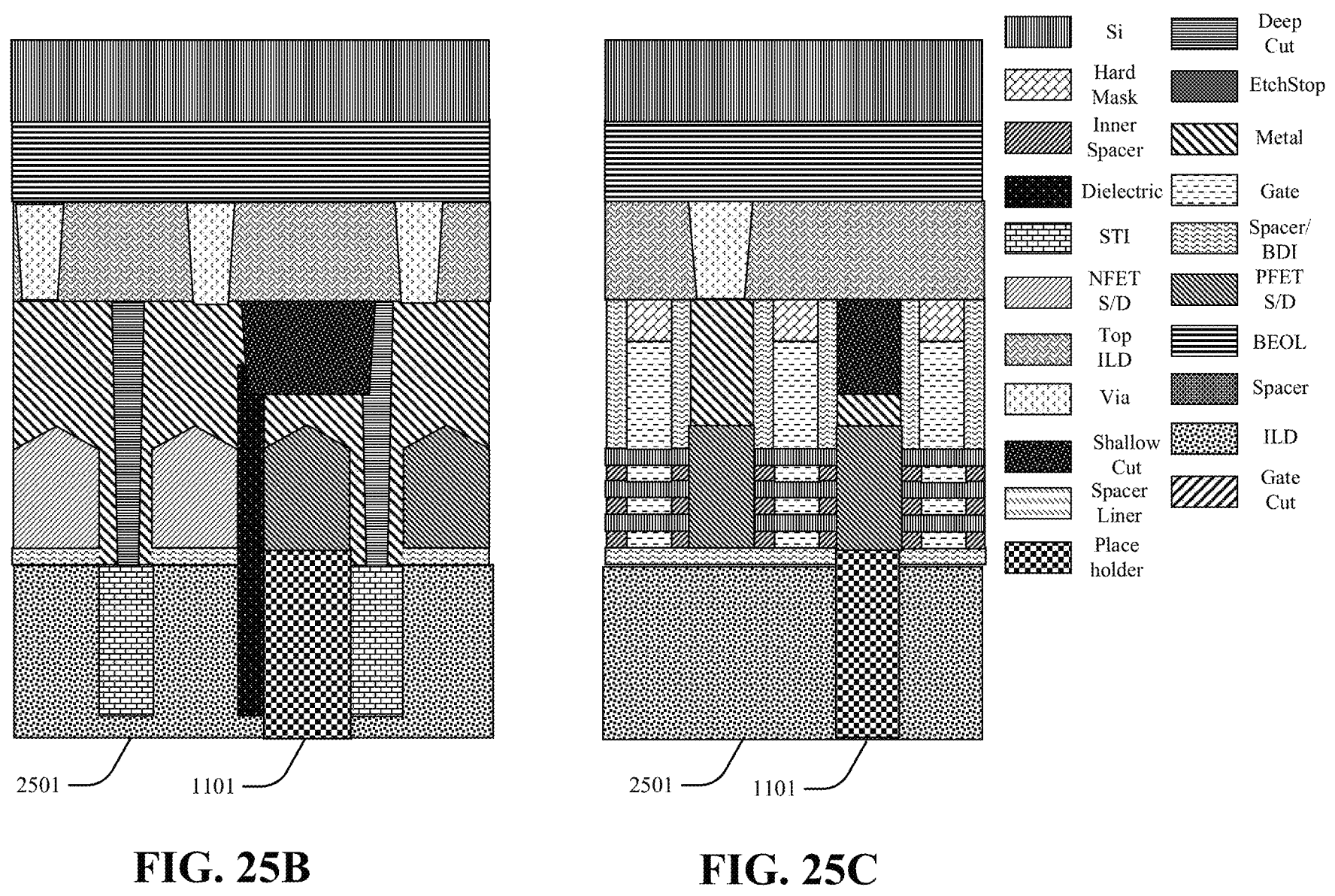

Deep Cut

EtchStop

Metal

Gate

Spacer/ BDI

PFET S/D

BEOL

Spacer

ILD

Gate Cut

Si

Hard Mask

Inner Spacer

Dielectric

STI

NFET S/D

Top ILD

Via

Shallow Cut

Spacer Liner

Place holder

FORMING WRAP AROUND CONTACT WITH SELF-ALIGNED BACKSIDE CONTACT

BACKGROUND

The subject disclosure relates to backside contacts for buried power rails, and more specifically, to backside contacts that wrap around a source/drain epi.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later.

According to an embodiment, a semiconductor device can comprise a source/drain region comprising a top portion, a sidewall portion and a bottom portion, a dielectric bar located adjacent to the source/drain region, and a contact in direct contact with the top portion, the sidewall portion and the bottom portion of the source/drain and with the dielectric bar.

According to another embodiment, a method for fabricating a semiconductor device, by a fabrication system, can comprise forming, by the fabrication system, a source/drain region comprising a top portion, a sidewall portion and a bottom portion, depositing, by the fabrication system, a dielectric bar located adjacent to the source/drain region, and forming, by the fabrication system, a contact in direct contact with the top portion, the sidewall portion and the bottom portion of the source/drain region and with the dielectric bar.

According to another embodiment, a semiconductor device can comprise a source/drain region located at a boundary between a first FET and a second FET, and a contact that surrounds the source/drain region on at least three sides.

DESCRIPTION OF THE DRAWINGS

FIGS. 25A, 25B and 25C illustrate various cross-sections of a twenty-fourth stage of production of a semiconductor device in accordance with one or more embodiments described herein.

DETAILED DESCRIPTION

Figure 1A:
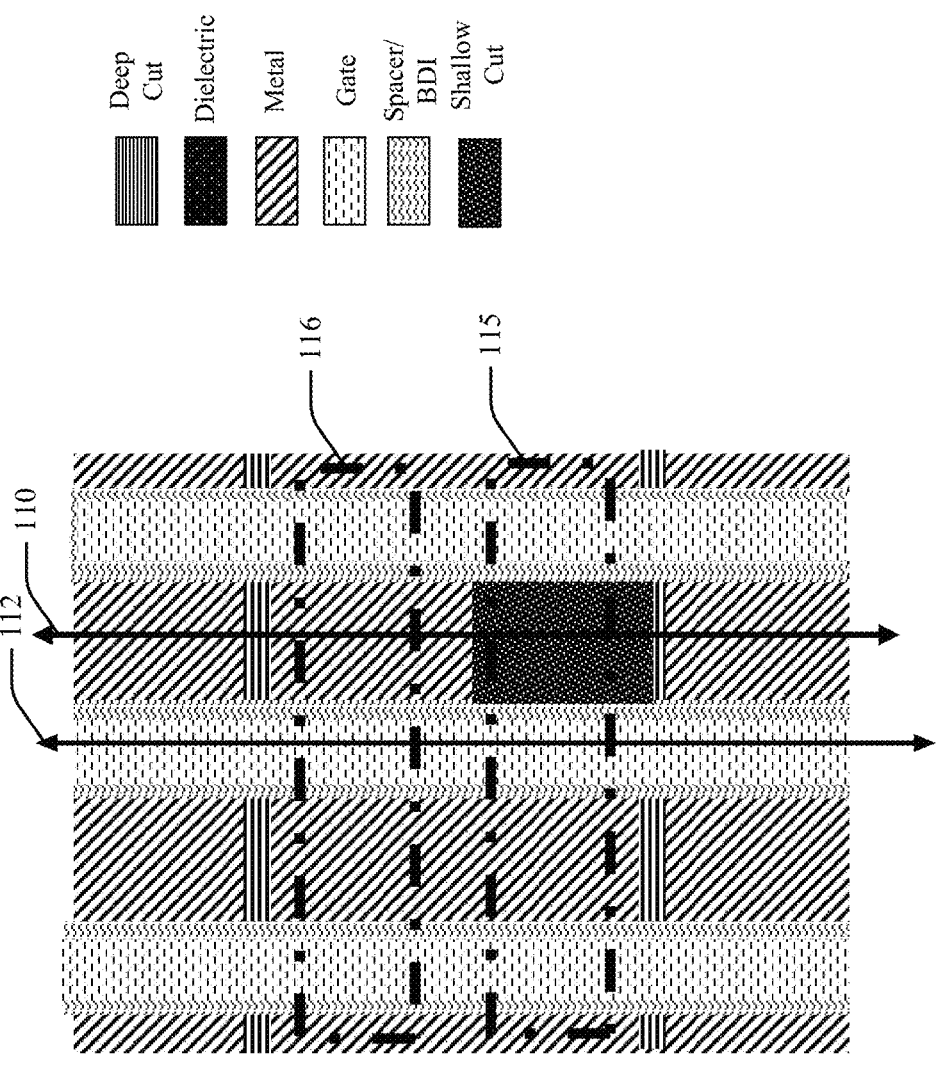
FIG. 1A illustrates a top-down view of an example, non-limiting, semiconductor device in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

Backside contacts enable operation of buried power rails in semiconductor devices. Buried power rails represent an opportunity for increases in decoupling capacitances in semiconductor devices, which in turn reduce power supply noise. However, existing backside contacts exhibit high resistance due to limited surface area between the backside contact and the source/drain region. Often, a high temperature annealing process would be used to increase the surface area of a semiconductor contact. As backside contacts are formed after a top back end of line formation (BEOL), this prevents the use of high temperature annealing. Accordingly, existing semiconductors with buried power rails exhibit high resistance between the backside contact and the source/drain region, thereby decreasing device performance. In view of the aforementioned problems with current backside contacts, the described subject matter illustrates semiconductor devices and methods of fabrication capable of decreasing contact resistance between backside contacts and source/drain epis, thereby increasing semiconductor device performance. For example, as described in greater detail below, a semiconductor device can comprise a source/drain region comprising a top portion, a sidewall portion and a bottom portion, a dielectric bar adjacent to the source/drain region, and a contact in direct contact with the top portion, the sidewall portion and the bottom portion of the source/drain region and with the dielectric bar. By having the contact wrap around the source/drain region, resistance between the contact and the source/drain region is decreased due to the increase in surface area between the contact and the source/drain region. In a further embodiment, the semiconductor device can comprise a first field-effect transistor (FET) and a second FET, wherein the dielectric bar is located between the first FET and the second FET and wherein the source/drain region is located within the first FET. In a further embodiment, the first FET can comprise a first type of FET and the second FET can comprise a second type of FET. For example, the first FET can comprise a p-channel FET (PFET) and the second FET can comprise an n-channel FET (NFET). In an alternative example, the first FET can comprise an NFET and the second FET can comprise a PFET.

One or more embodiments are now described with reference to the drawings, where like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

FIG. 1A illustrates a top-down view of a semiconductor device in accordance with one or more embodiments described herein. As shown, the semiconductor device comprises an NFET region 116 and a PFET region 115. FIG. 1A further comprises lines 110 and 112 utilized for illustration of cross-sections described below.

Figure 1B:
FIGS. 1B and 1C illustrate various cross-sections of an example, non-limiting semiconductor device in accordance with one or more embodiments described herein.
Figure 1B:
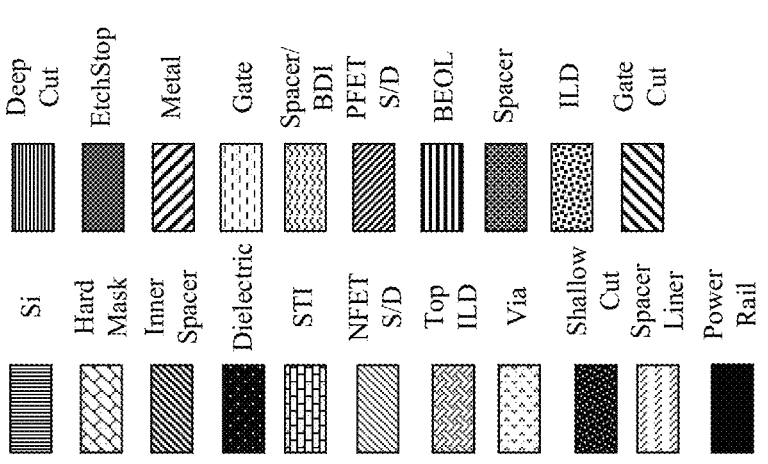
Figure 1B:
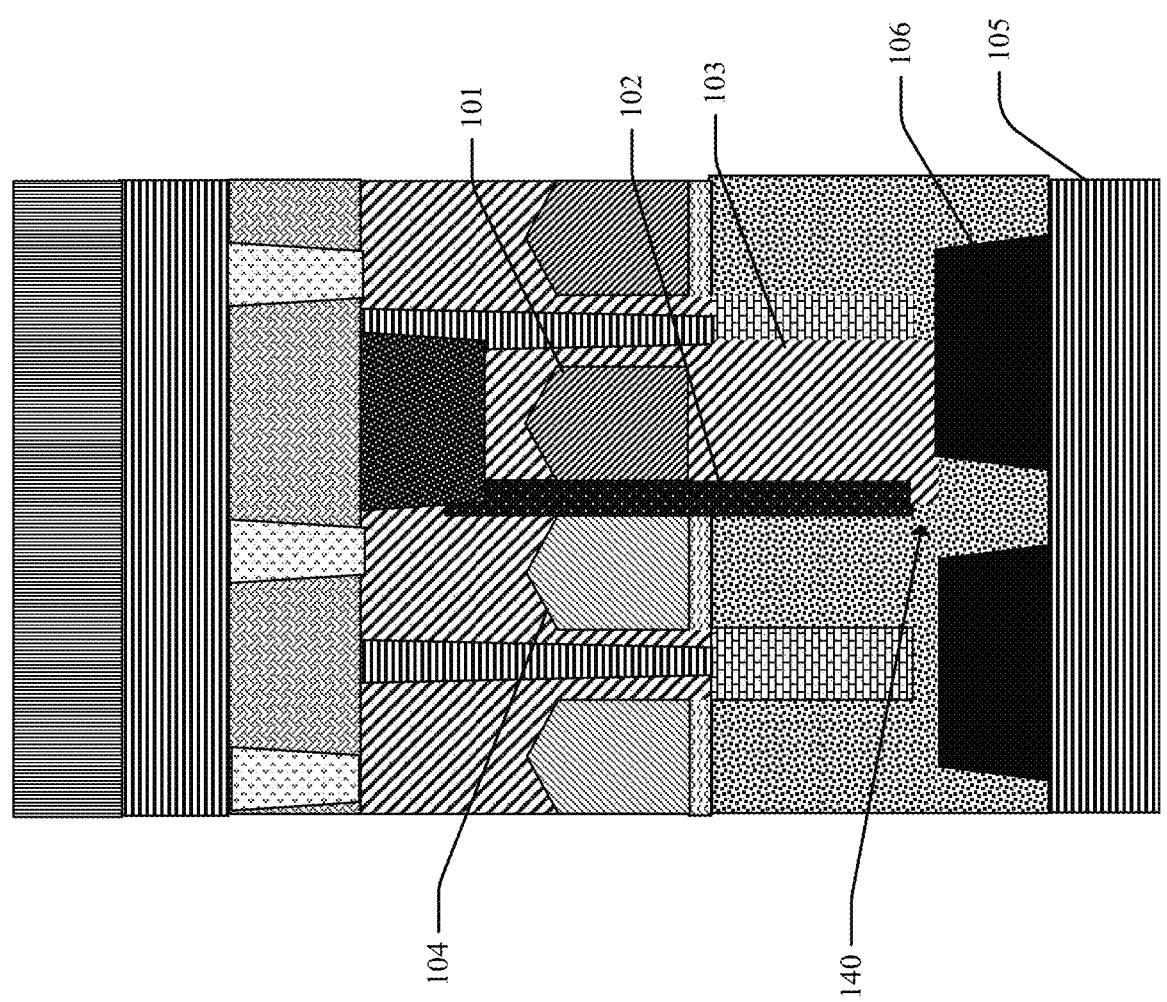
Figure 1C:
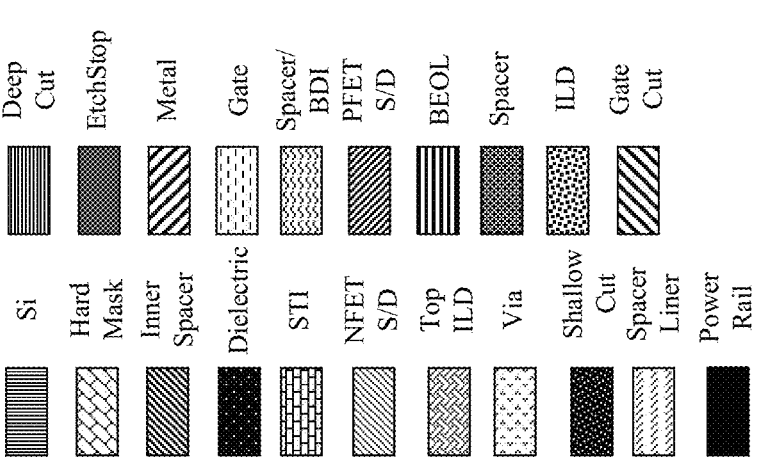
Figure 1C:
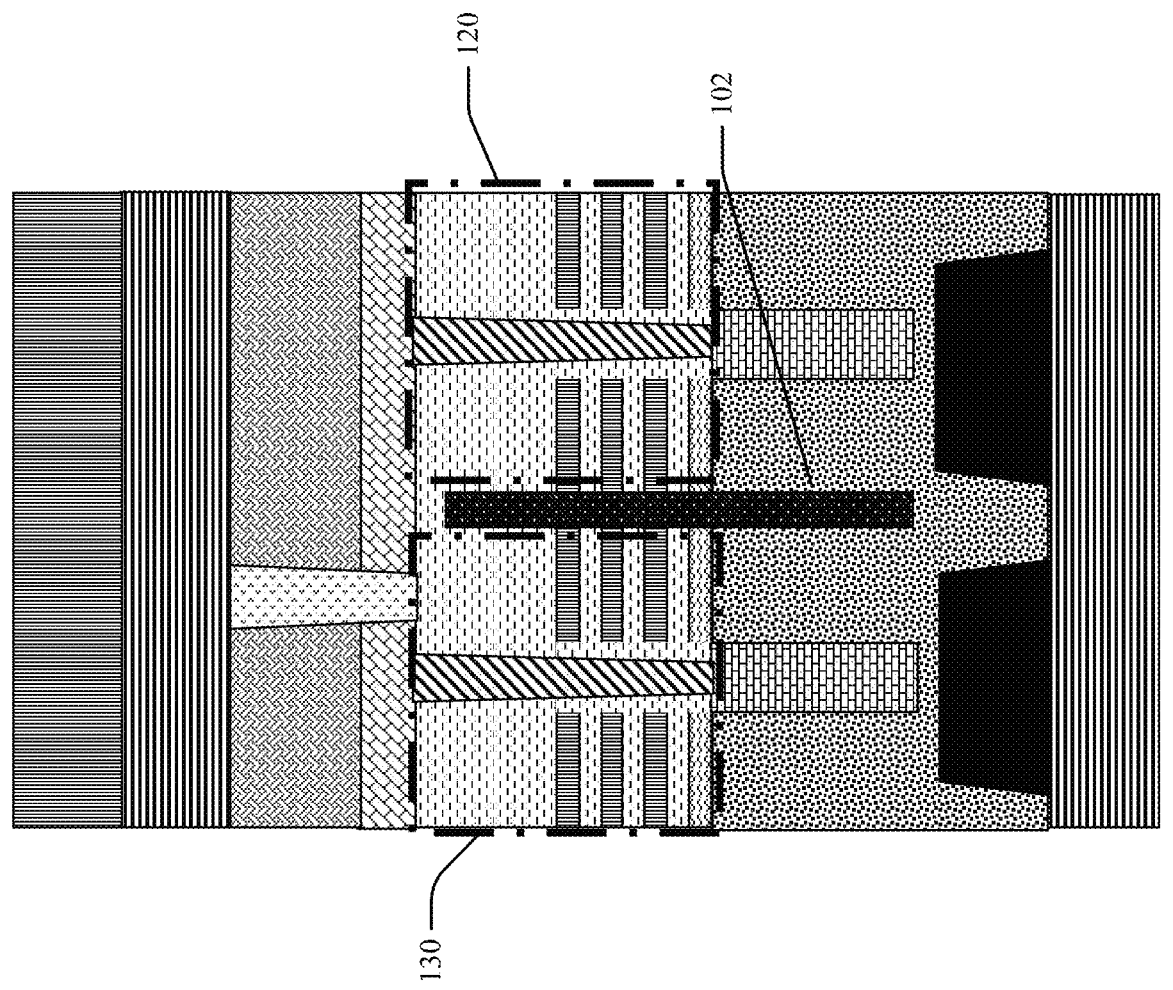

FIG. 1B illustrates a cross-section along line 110 of FIG. 1A. As shown, FIG. 1B illustrates a source/drain epi 101 of PFET 115, source/drain epi 104 of NFET 116, and dielectric bar 102, wherein dielectric bar is located between PFET 115 and NFET 116 and isolates source/drain epi 101 from source/drain epi 104. Accordingly, source/drain epi 101 is located at the boundary between PFET 115 and NFET 116. In an embodiment, dielectric bar can comprise SiN, SiCO, SiOCN, or another suitable dielectric insulation material. FIG. 1B further comprises contact 103. As shown, contact 103 wraps around source/drain epi 101 and is in contact with an upper portion, a sidewall portion and a bottom portion of source/drain epi 101. Furthermore, contact 103 is in contact with a portion of dielectric bar 102 that extends above source/drain epi 101 and a portion of dielectric bar 102 that extends below source/drain epi 101. Contact 103 can also overlap with the bottom of dielectric bar 102 as shown at point 140. In an embodiment, contact 103 can comprise a metal such as aluminum, nickel, chromium, gold, germanium, copper, silver, titanium, tungsten, platinum, tantalum or another suitable metal. Contact 103 is further coupled to backside power rail 106, which is coupled to backside power delivery network 105. Accordingly, contact 103 facilitates electrical coupling between source/drain epi 101 and backside power delivery network 105. It should be appreciated that as contact 103 wraps around source/drain epi 101, there is increased surface area between contact 103 and source/drain epi 101, relative to other designs, thereby reducing resistance between contact 103 and source/drain epi 101. FIG. 1C illustrates a cross-section along line 112. As shown, dielectric bar 102 can divide the gate region into first gate region 120 corresponding to PFET 115 and a second gate region corresponding to NFET 116.

Figure 2A:
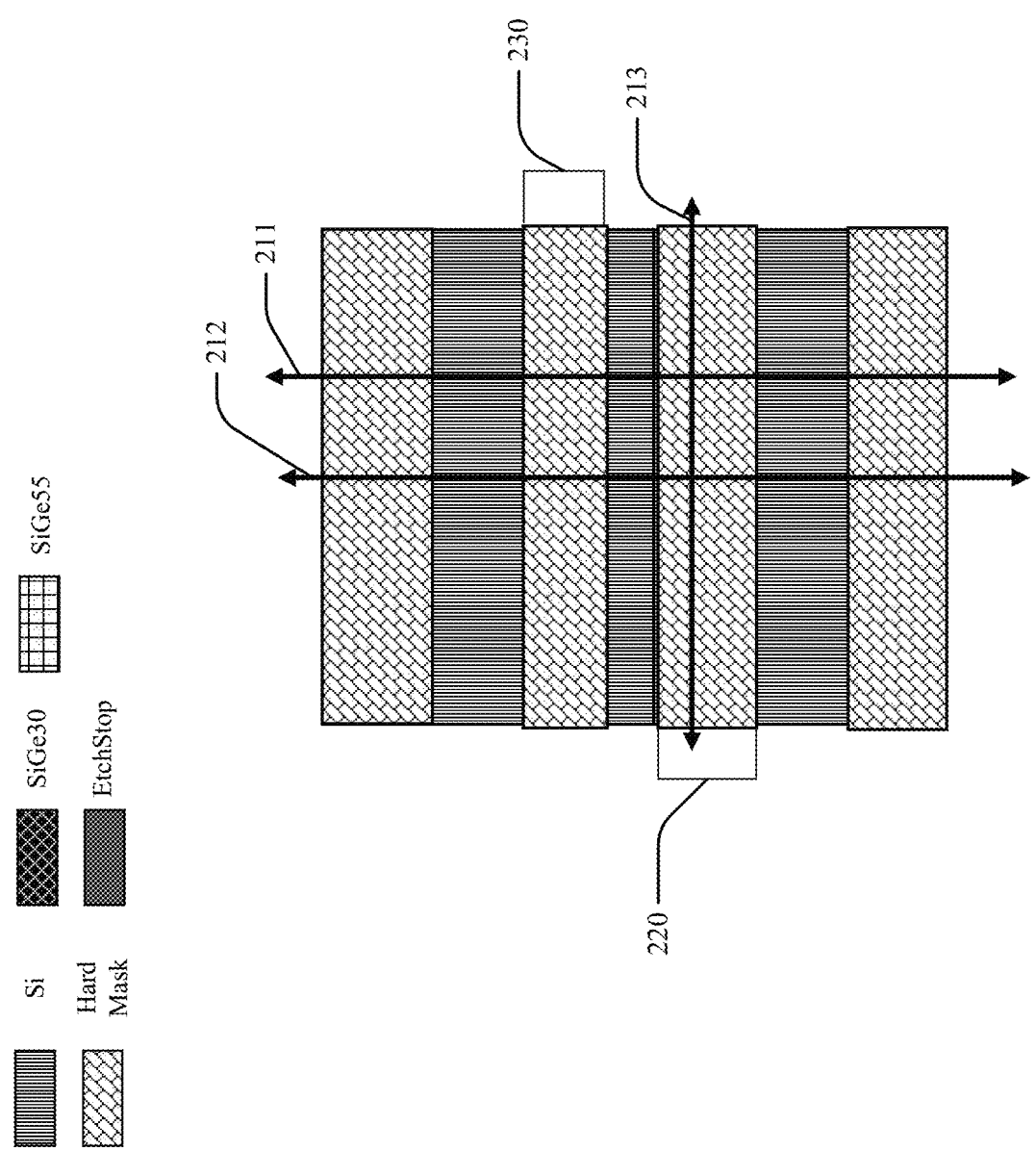
FIG. 2A illustrates a top-down view of an example, non-limiting, starting substrate for production of a semiconductor device in accordance with one or more embodiments described herein.

FIG. 2A illustrates a top-down view of an example, non-limiting starting substrate for production of a semiconductor device in accordance with one or more embodiments described herein. As shown, FIG. 2A illustrates region 220 where a first PFET will be formed and region 230 where a first NFET will be formed. FIG. 2A further comprises lines 211, 212 and 213 utilized to illustrate cross-sections below.

Figure 2B:
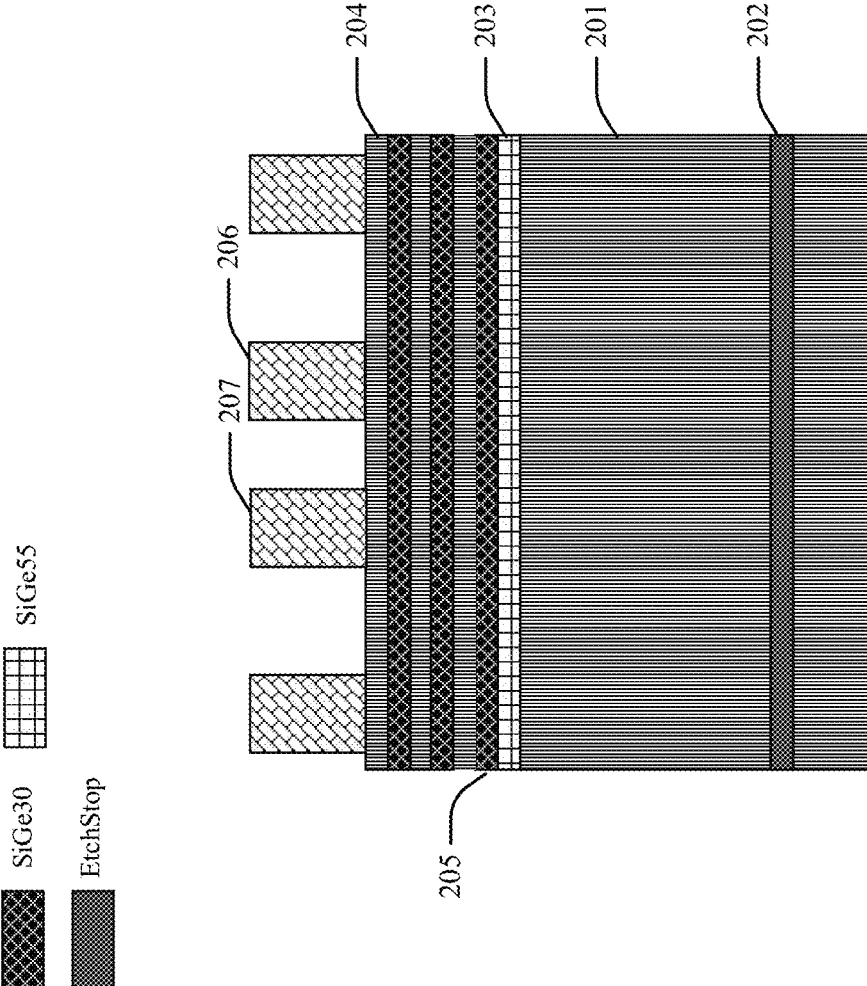
FIG. 2B illustrates a cross-section of an example, non-limiting, starting substrate for production of a semiconductor device in accordance with one or more embodiments described herein.

FIG. 2B illustrates a cross-section along line 212 of FIG. 2A. As shown, FIG. 2B illustrates a silicon substrate 201, an etch stop layer 202, an SiGe55 layer, one or more SiGe30 layers, and one or more silicon layers 204. It should be appreciated that while FIG. 2B comprises three layers of SiGe55 and three layers of silicon, use of any number of layers is envisioned. Furthermore, one or more hardmask pillars are located on top of silicon layer 204, indicating where FETs will be formed in the substrate. For example, pillar 206 is above region 220 of FIG. 2A and pillar 207 is above region 230 of FIG. 2A. In an embodiment, the hardmask can comprise materials such as silicon dioxide, silicon carbide, titanium nitride, tantalum nitride, or another suitable material.

Figure 3A:
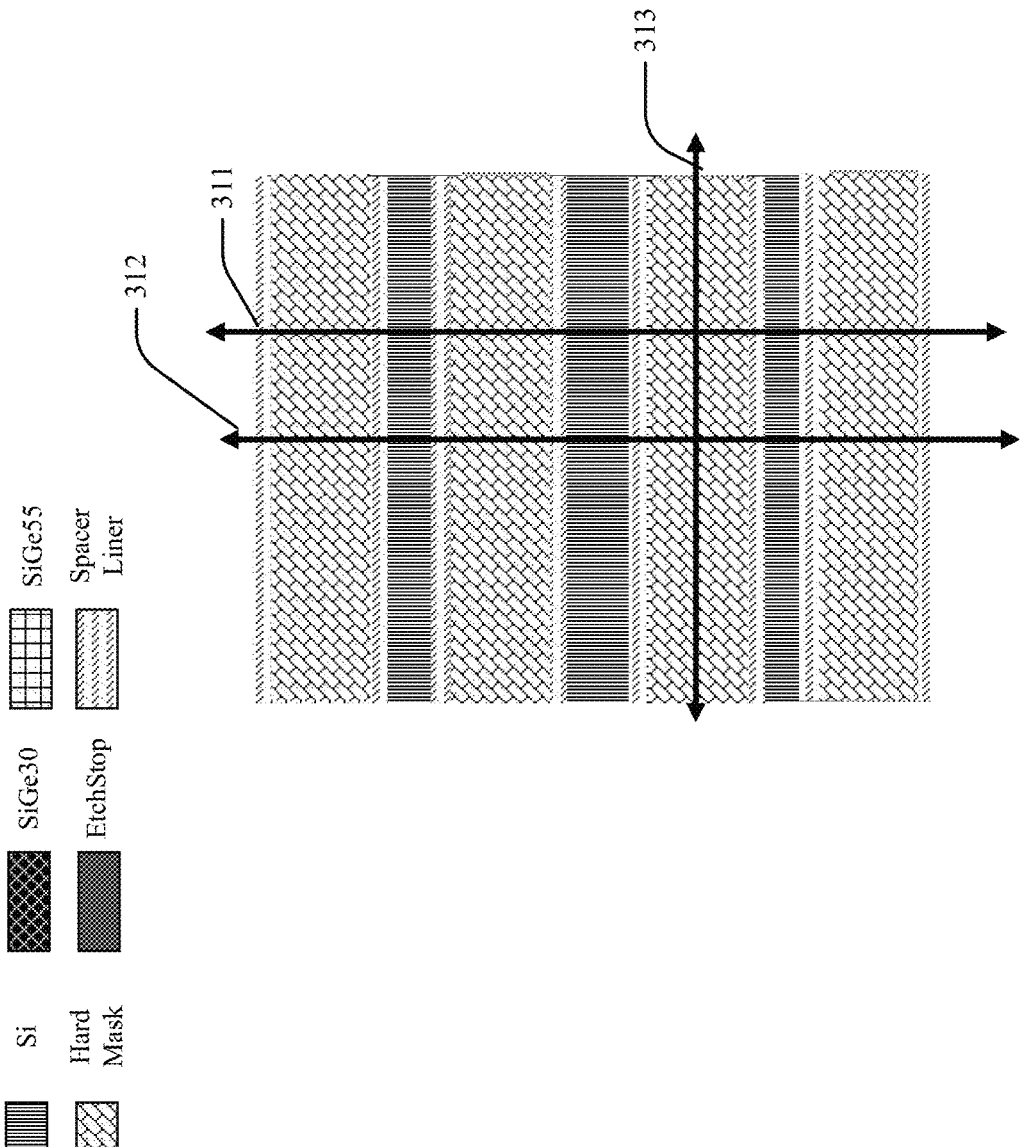
FIG. 3A illustrates a top-down view of an example, non-limiting, second stage of production of a semiconductor device in accordance with one or more embodiments described herein.

FIG. 3A illustrates a top-down view of an example, non-limiting second stage of production of a semiconductor device in accordance with one or more embodiments described herein. As shown by FIG. 3A, a spacer material has been deposited on the sidewalls of the hardmask pillars, and channels cut between the spacers, as will be shown in more detail below. FIG. 3A further comprises lines 311, 312 and 313 utilized to illustrate cross-sections below.

Figure 3B:
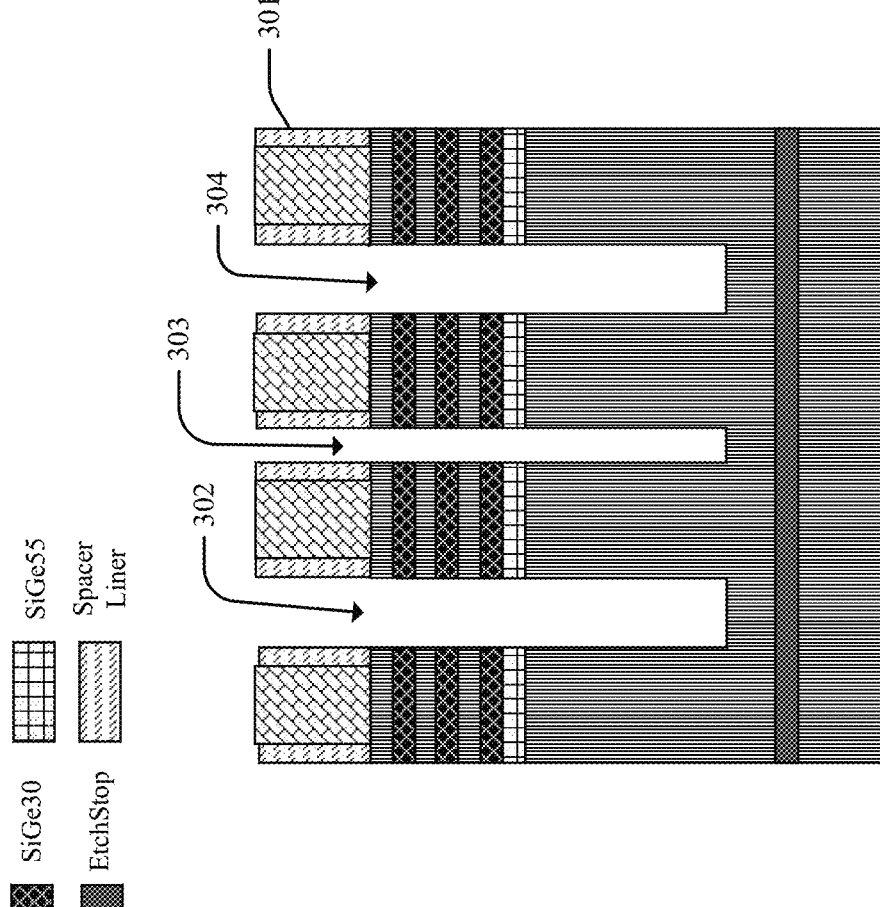
FIG. 3B illustrates a cross-section of an example, non-limiting, second stage of production of a semiconductor device in accordance with one or more embodiments described herein.

FIG. 3B illustrates a cross-section along line 312 of FIG. 3A. As shown by FIG. 3B, shallow trench isolation channels 302 and 304 and dielectric bar channel 303 can be patterned in the substrate. In an embodiment, an etching process can be utilized that does not impact the hardmask or spacer line 301, allowing for regions covered by the hardmask to be protected during etching.

Figure 4A:
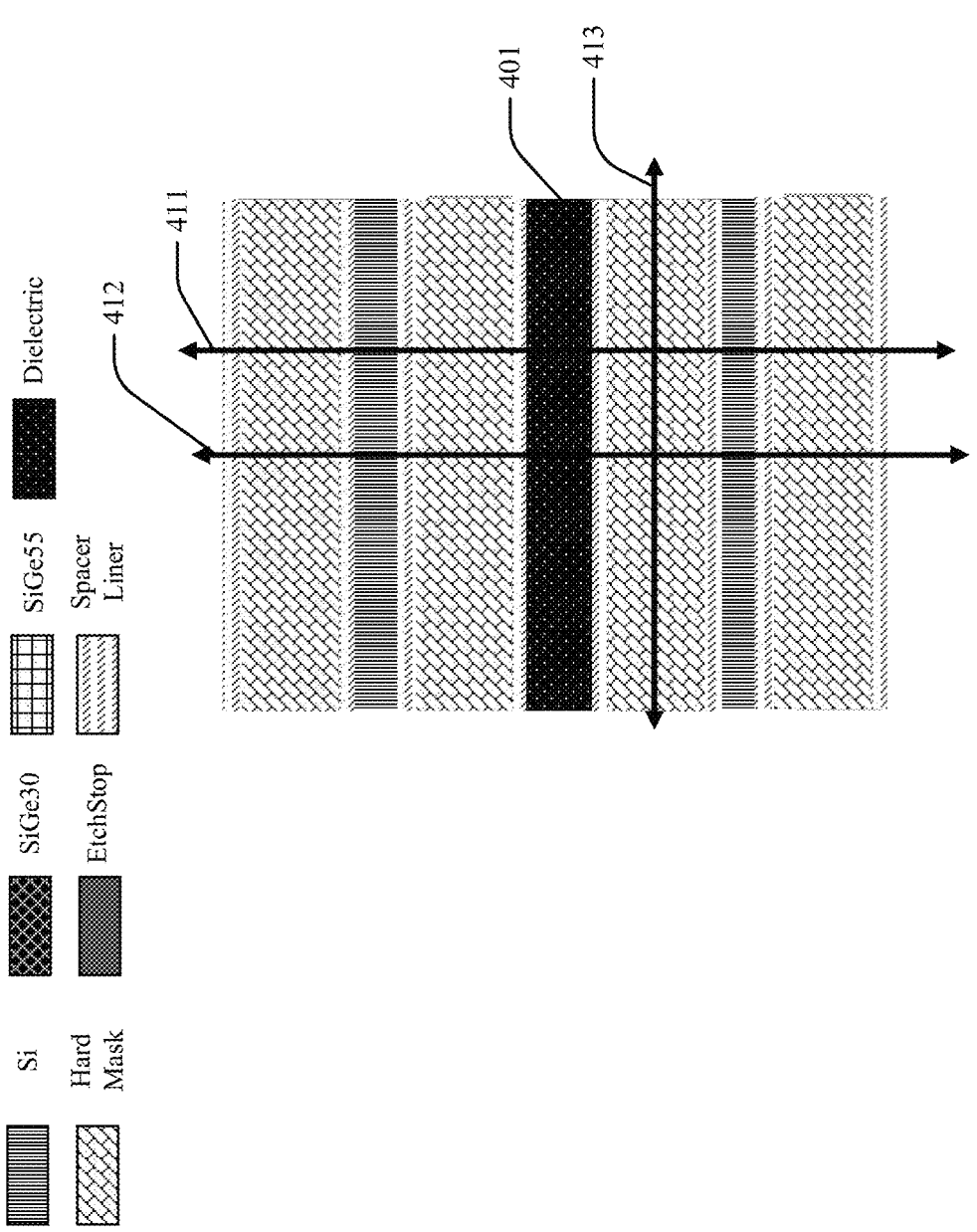
FIG. 4A illustrates a top-down view of an example, non-limiting third stage of production of a semiconductor device in accordance with one or more embodiments described herein.

FIG. 4A illustrates a top-down view of an example, non-limiting third stage of production of a semiconductor device in accordance with one or more embodiments described herein. As shown by FIG. 4A, a dielectric bar 401 can be deposited within dielectric bar channel 303. In an embodiment, dielectric bar 401 can be formed by an atomic layer deposition process, or another suitable chemical vapor deposition process, and an isotropic etch back. FIG. 4A further comprises lines 411, 412 and 413 utilized to illustrate cross-sections below.

Figure 4B:
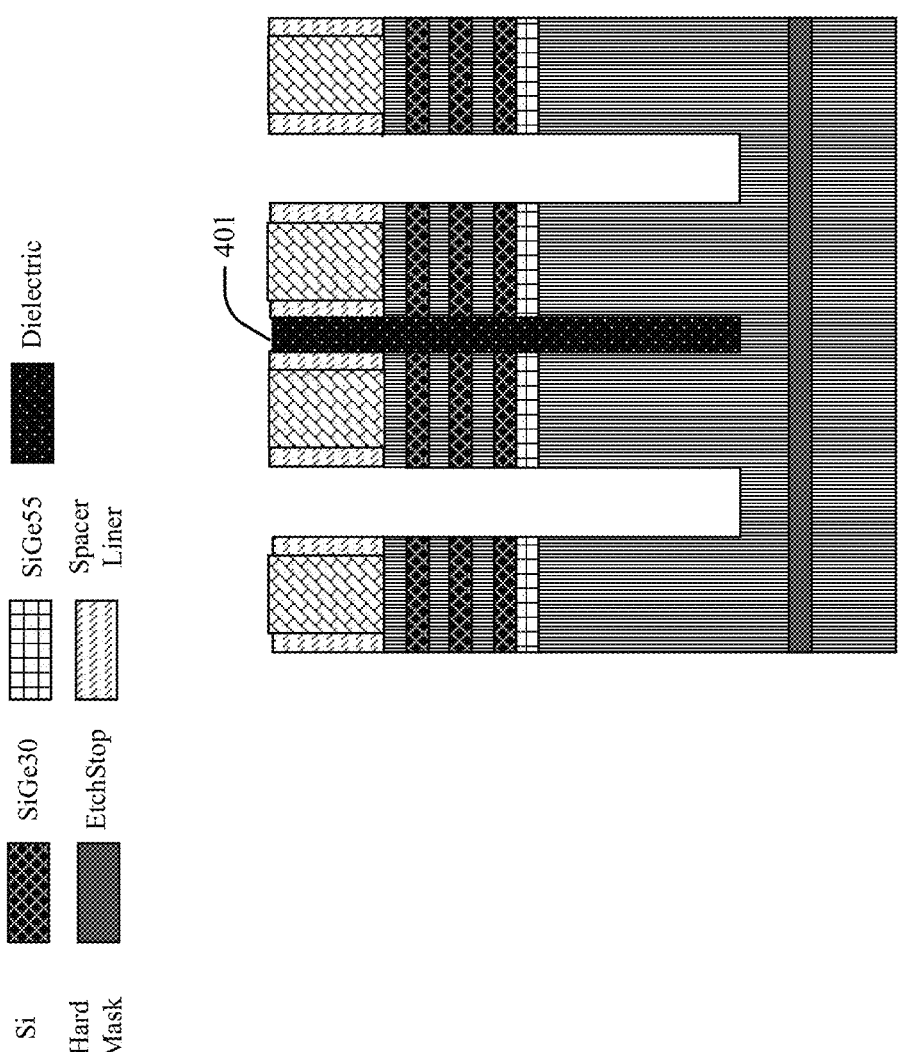
FIG. 4B illustrates a cross-section of an example, non-limiting third stage of production of a semiconductor device in accordance with one or more embodiments described herein.

FIG. 4B illustrates a cross-section along line 412 of FIG. 4A. As shown, dielectric bar 401 has been deposited in dielectric bar channel 303.

Figure 5A:
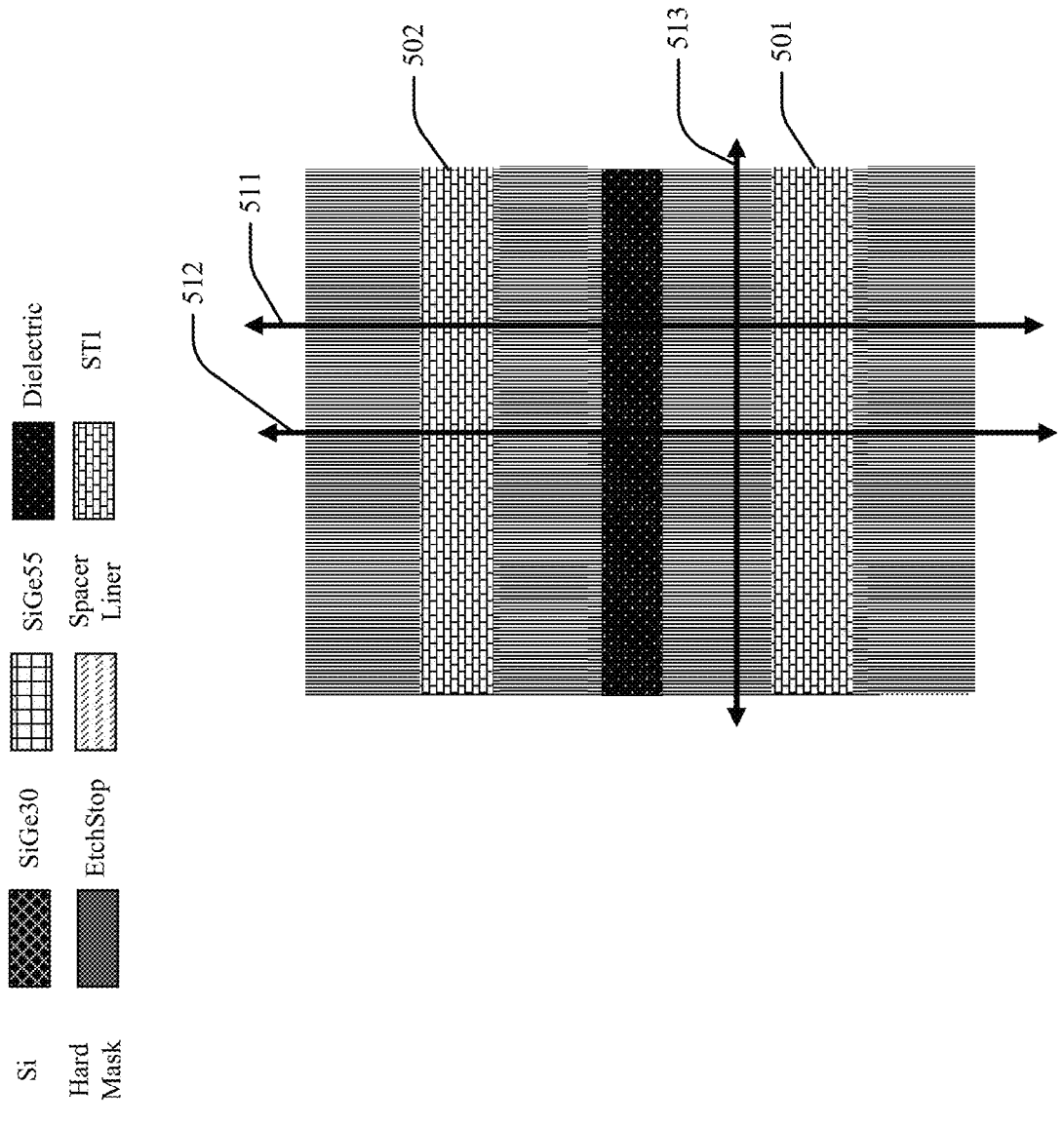
FIG. 5A illustrates a top-down view of a fourth stage of production of a semiconductor device in accordance with one or more embodiments described herein.

FIG. 5A illustrates a top-down view of a fourth stage of production of a semiconductor device in accordance with one or more embodiments described herein. As shown by FIG. 5A, the hardmask pillars have been removed and shallow trench isolation (STI) regions 501 and 502 have been formed within shallow trench isolation channels 302 and 304 respectively. FIG. 5A further comprises lines 511, 512 and 513 utilized to illustrate cross-sections below.

Figure 5B:
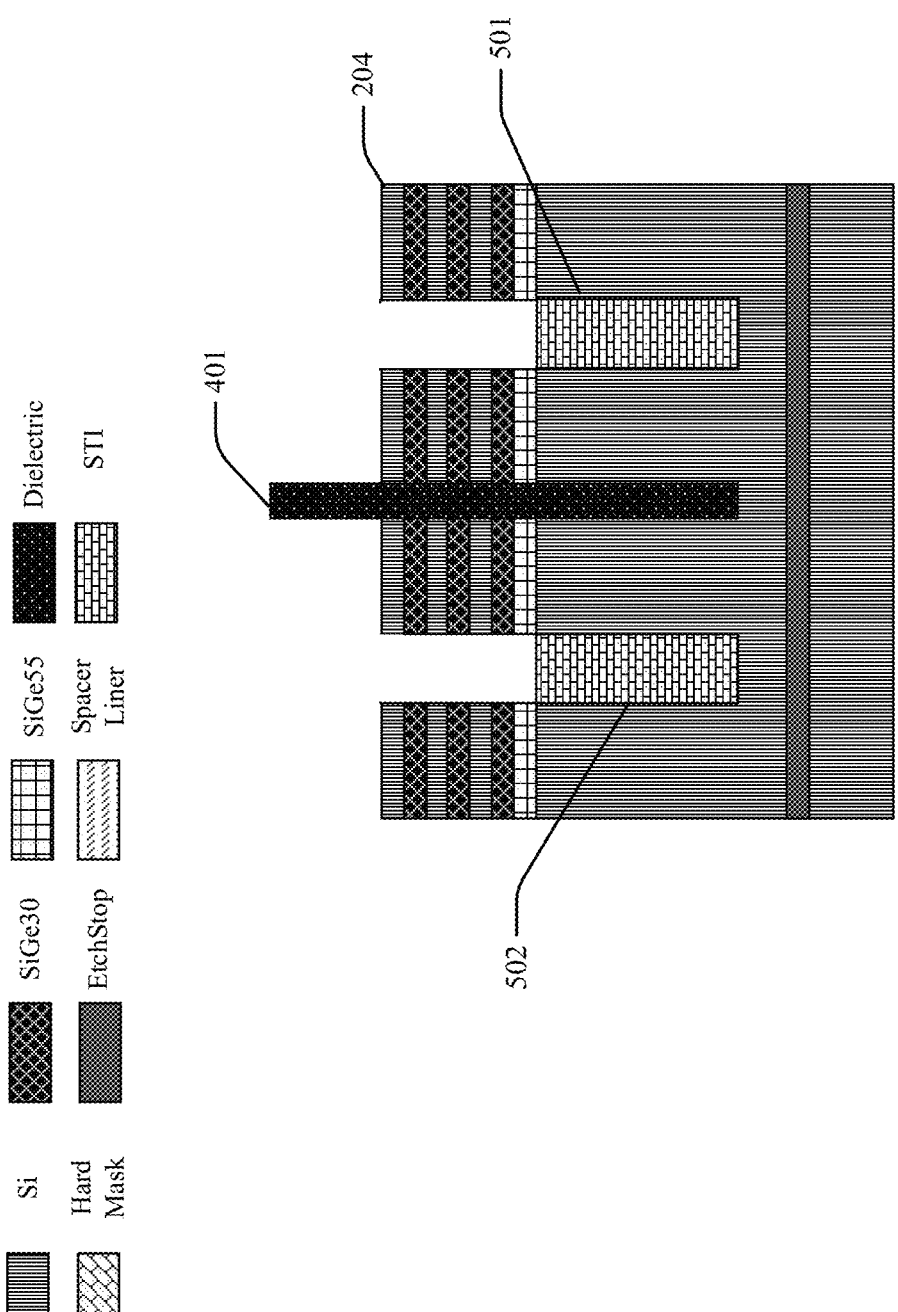
FIG. 5B illustrates a cross-section view of a fourth stage of production of a semiconductor device in accordance with one or more embodiments described herein.

FIG. 5B illustrates a cross-section along line 512 of FIG. 5A. As shown, hardmask pillars 206 and 207 have been removed, and the top portion of dielectric bar 401 is exposed. Further, STI regions 501 and 502 have been formed. In an embodiment, STI regions 501 and 502 can comprise a dielectric material such as silicon dioxide or another suitable dielectric.

Figures 6A, 6B:
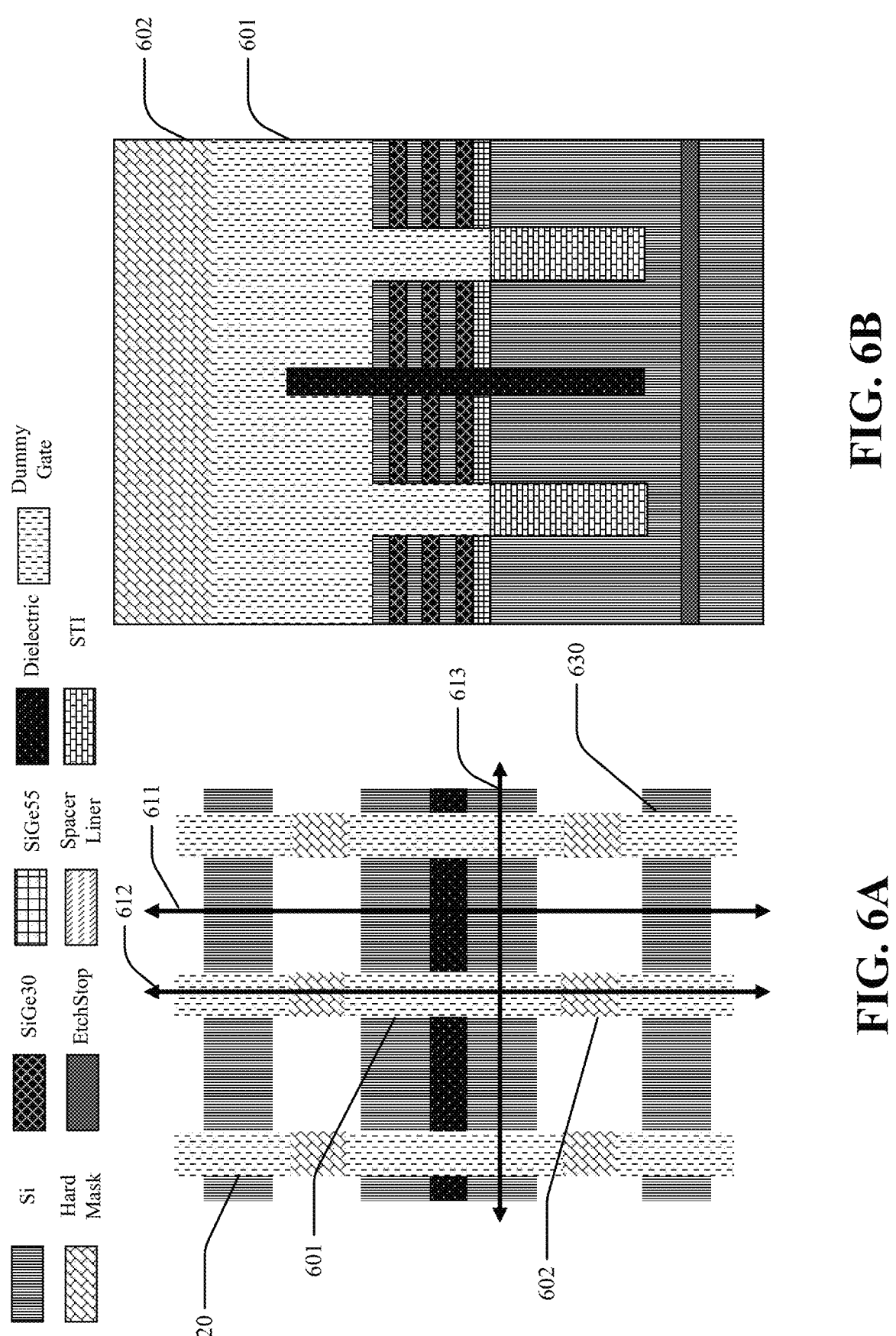
FIG. 6A illustrates a top-down view of an example, non-limiting, fifth stage of production of a semiconductor device, in accordance with one or more embodiments described herein.
FIGS. 6B, 6C and 6D illustrate various cross-sections of a fifth stage of production of a semiconductor device, in accordance with one or more embodiments described herein.

FIG. 6A illustrates a top-down view of an example, non-limiting, fifth stage of production of a semiconductor device, in accordance with one or more embodiments described herein. As shown by FIG. 6A, one or more dummy gates, such as dummy gate 601 can be patterned across the substrate and a hardmask 602 can be patterned on top of the dummy gate 601. FIG. 6A further comprises lines 611, 612 and 613 utilized to illustrate cross-sections below.

Figures 6C, 6D:
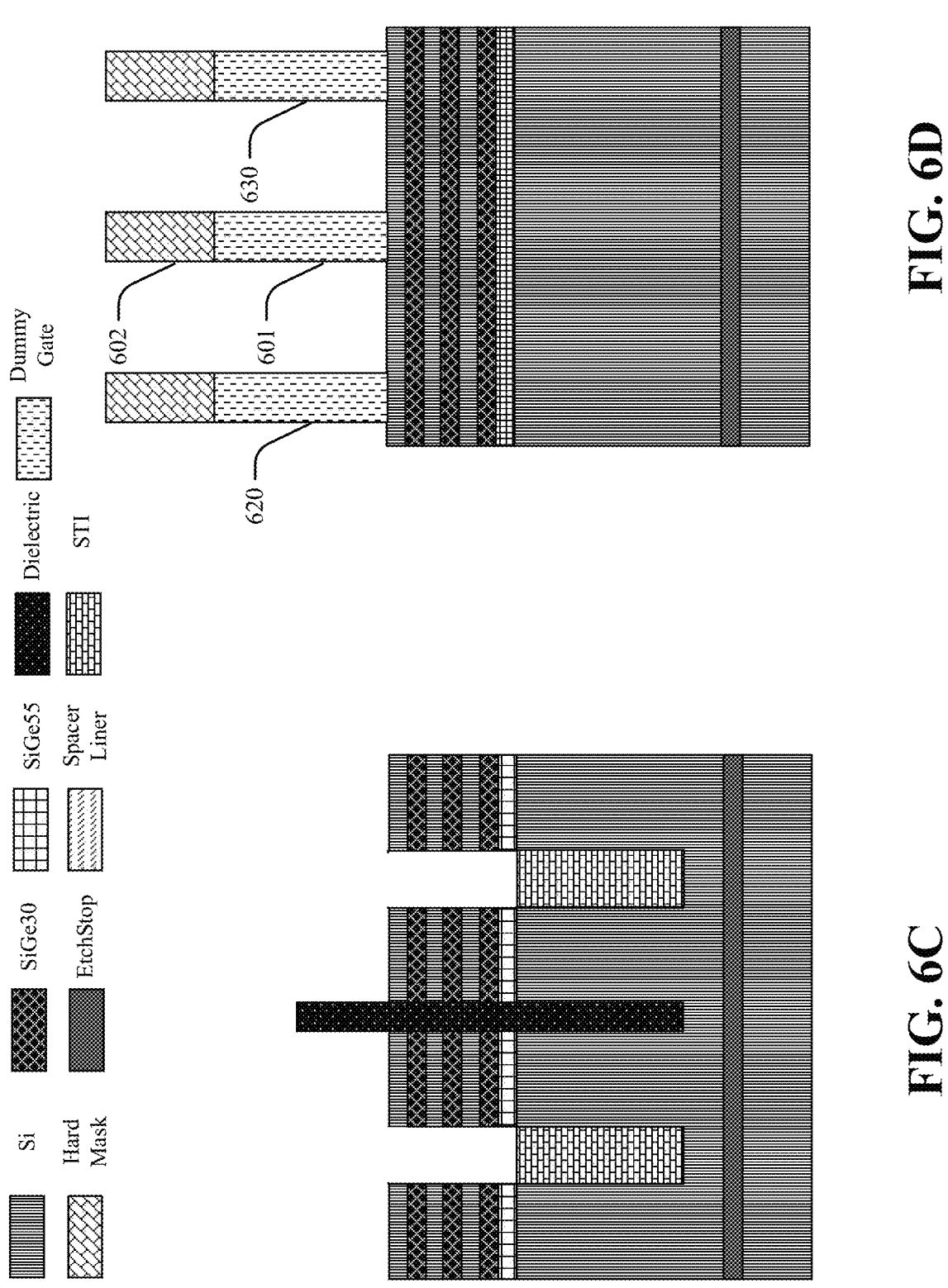

FIGS. 6B, 6C and 6D illustrate various cross-sections of a fifth stage of production of a semiconductor device, in accordance with one or more embodiments described herein. FIG. 6B illustrates a cross-section along line 612 of FIG. 6A. As shown, dummy gate 601 has been patterned across the substrate with hardmask 602 patterned on top. In an embodiment, dummy gate 601 can comprise a material such as polysilicon, or another suitable material. FIG. 6C illustrates a cross-section along line 611 of FIG. 6A. As shown, no dummy gate is patterned over this portion of the semiconductor device. FIG. 6D illustrates a cross-section along line 613 of FIG. 6A. As shown, dummy gates 620, 601 and 630 have been patterned across the semiconductor device.

Figures 7A, 7B, 7C:
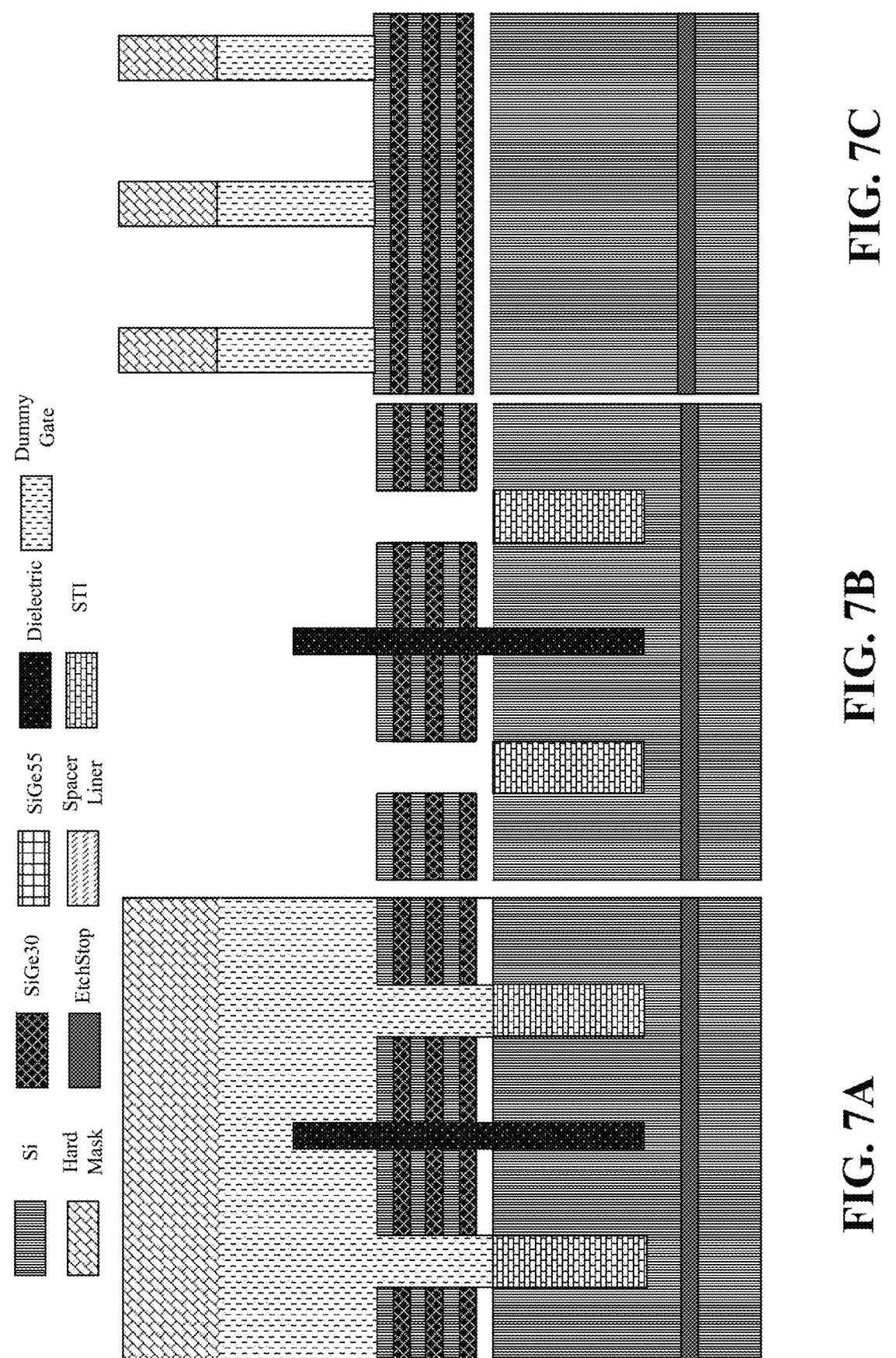
FIGS. 7A, 7B and 7C illustrate various cross-sections of a sixth stage of production of a semiconductor device, in accordance with one or more embodiments described herein.

FIGS. 7A, 7B and 7C illustrate various cross-sections of a sixth stage of production of a semiconductor device, in accordance with one or more embodiments described herein. FIG. 7A illustrates a cross-section along line 612 of FIG. 6A, FIG. 7B illustrates a cross-section along line 611 of FIG. 6A, and FIG. 7C illustrates a cross-section along line 613 of FIG. 6A. As shown by FIGS. 7A, 7B and 7C SiGe55 layer 203 can be removed from the semiconductor device.

Figures 8A, 8B:
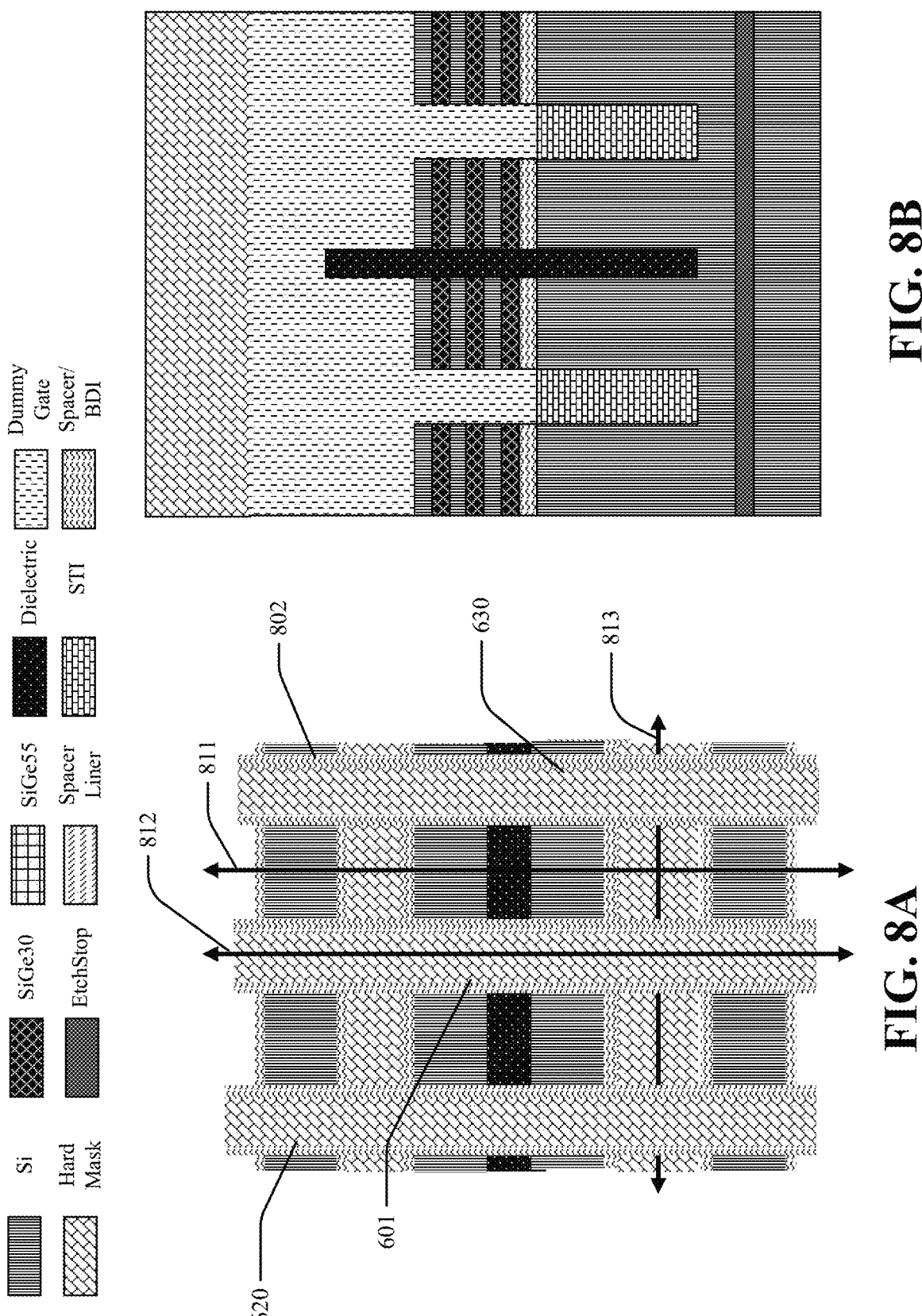
FIG. 8A illustrates a top-down view of an example, non-limiting, seventh stage of production of a semiconductor device, in accordance with one or more embodiments described herein.
FIGS. 8B, 8C and 8D illustrate various cross-sections of a seventh stage of production of a semiconductor device, in accordance with one or more embodiments described herein.

FIG. 8A illustrates a top-down view of an example, non-limiting, seventh stage of production of a semiconductor device, in accordance with one or more embodiments described herein. As shown by FIG. 8A, a spacer material 802 can be deposited on the sidewalls of dummy gate 620, 601 and 630. Additionally, as described in greater detail below, a bottom dielectric isolation (BDI) can be deposited in the areas vacated by the removal of SiGe55 layer 203. FIG. 8A further comprises lines 811, 812 and 813 utilized to illustrate cross-sections below.

Figures 8C, 8D:
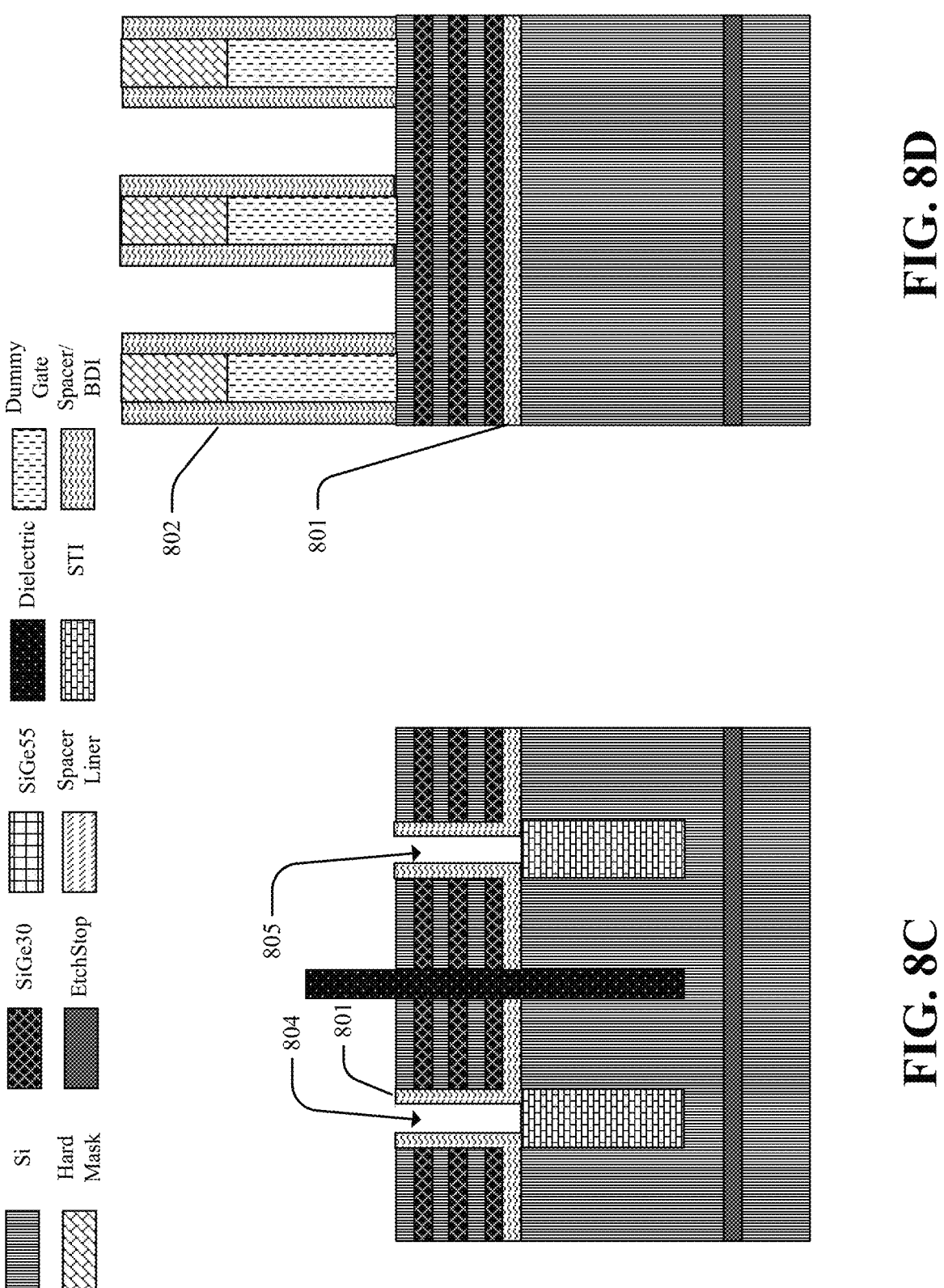

FIGS. 8B, 8C and 8D illustrate various cross-sections of a seventh stage of production of a semiconductor device, in accordance with one or more embodiments described herein. FIG. 8B illustrates a cross-section along line 811 of FIG. 8A. FIG. 8C illustrates a cross-section along line 812 of FIG. 8A. As shown, BDI layer 801 has been deposited in the regions vacated by SiGe55 layer 203. Further, BDI layer 801 can extend up the sidewalls of channels 804 and 805. FIG. 8D illustrates a cross-section along line 813 of FIG. 8A. As shown, spacer material 802 can be deposited along the sidewalls of the dummy gates. In an embodiment, BDI layer 801 and spacer material 802 can comprise the same material, such as a dielectric insulation material.

Figures 9A, 9B:
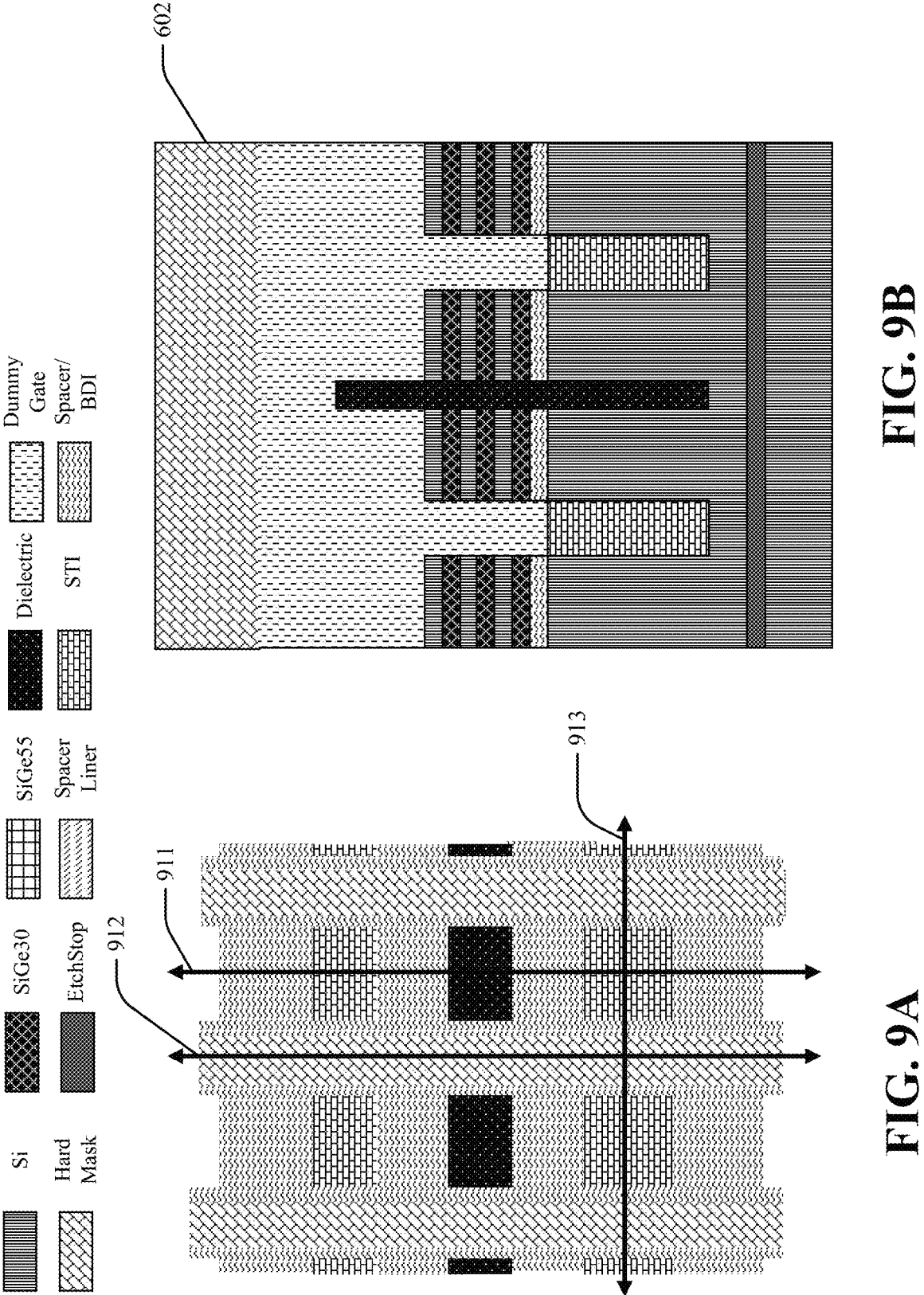
FIG. 9A illustrates a top-down view of an example, non-limiting, eight stage of production of a semiconductor device, in accordance with one or more embodiments described herein.
FIGS. 9B, 9C and 9D illustrate various cross-sections of an eighth stage of production of a semiconductor device, in accordance with one or more embodiments described herein.

FIG. 9A illustrates a top-down view of an example, non-limiting, eighth stage of production of a semiconductor device, in accordance with one or more embodiments described herein. As shown by FIG. 9A, an etching process can remove silicon layers 204 and SiGe30 layers 205 from regions of the semiconductor device not covered by the hardmask to expose BDI layer 801. FIG. 9A further comprises lines 911, 912 and 913 utilized to illustrate cross-sections below.

Figures 9C, 9D:
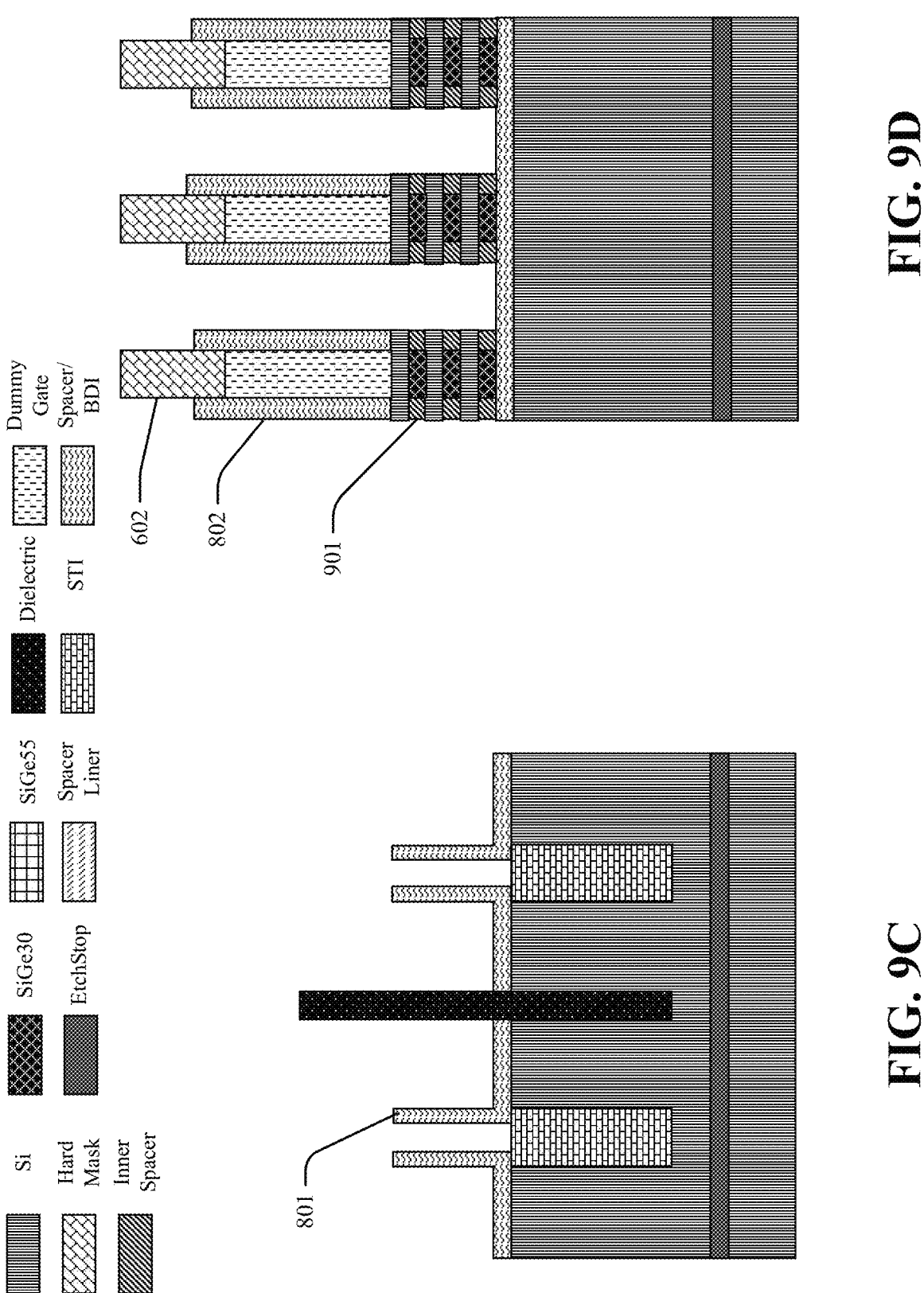

FIGS. 9B, 9C and 9D illustrate various cross-sections of an eighth stage of production of a semiconductor device, in accordance with one or more embodiments described herein. FIG. 9B illustrates a cross-section along line 912 of FIG. 9A. As shown, hardmask 602 protects the regions below during the etching process. FIG. 9C illustrates a cross-section along line 911 of FIG. 9A. As shown, since FIG. 9C is not covered by hardmask 602, the layers of silicon and SiGe30 can be removed by an etching process to expose BDI layer 801. FIG. 9D illustrates a cross-section along line 913 of FIG. 9A. As shown, portions of the silicon and SiGe30 layers not covered by hardmask 602 have been removed. Further, inner spacer 901 can be patterned on sidewall portion of the SiGe30 layers.

Figures 10A, 10B:
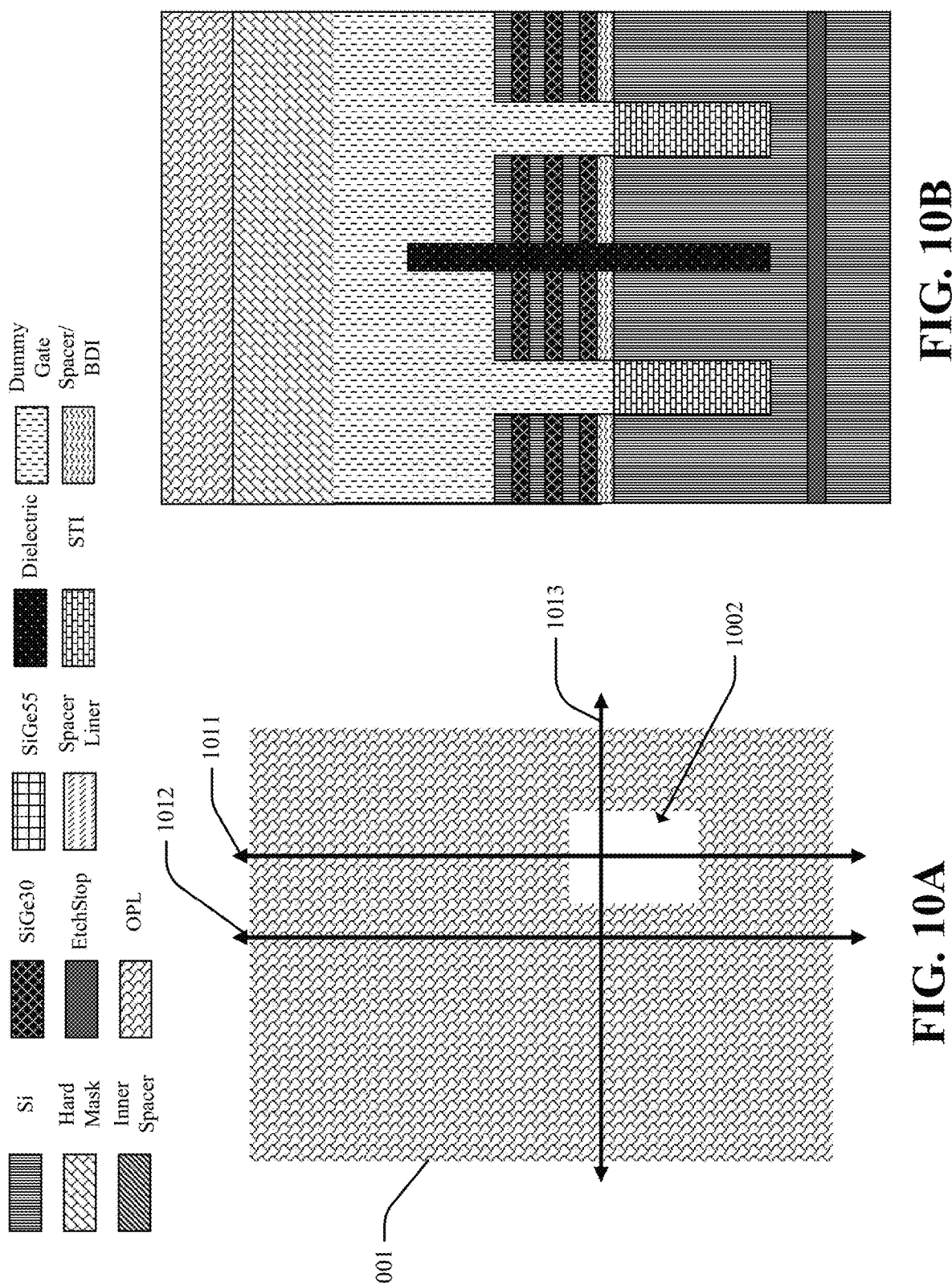
FIG. 10A illustrates a top-down view of an example, non-limiting, ninth stage of production of a semiconductor device, in accordance with one or more embodiments described herein.
FIGS. 10B, 10C and 10D illustrate various cross-sections of a ninth stage of production of a semiconductor device, in accordance with one or more embodiments described herein.

FIG. 10A illustrates a top-down view of an example, non-limiting, ninth stage of production of a semiconductor device, in accordance with one or more embodiments described herein. As shown by FIG. 10A, an organic planarization layer (OPL) 1001 can be deposited on the semiconductor device and a channel 1002 can be patterned through OPL 1001. FIG. 10A further comprises lines 1011, 1012 and 1013 utilized to illustrate cross-sections below.

Figures 10C, 10D:
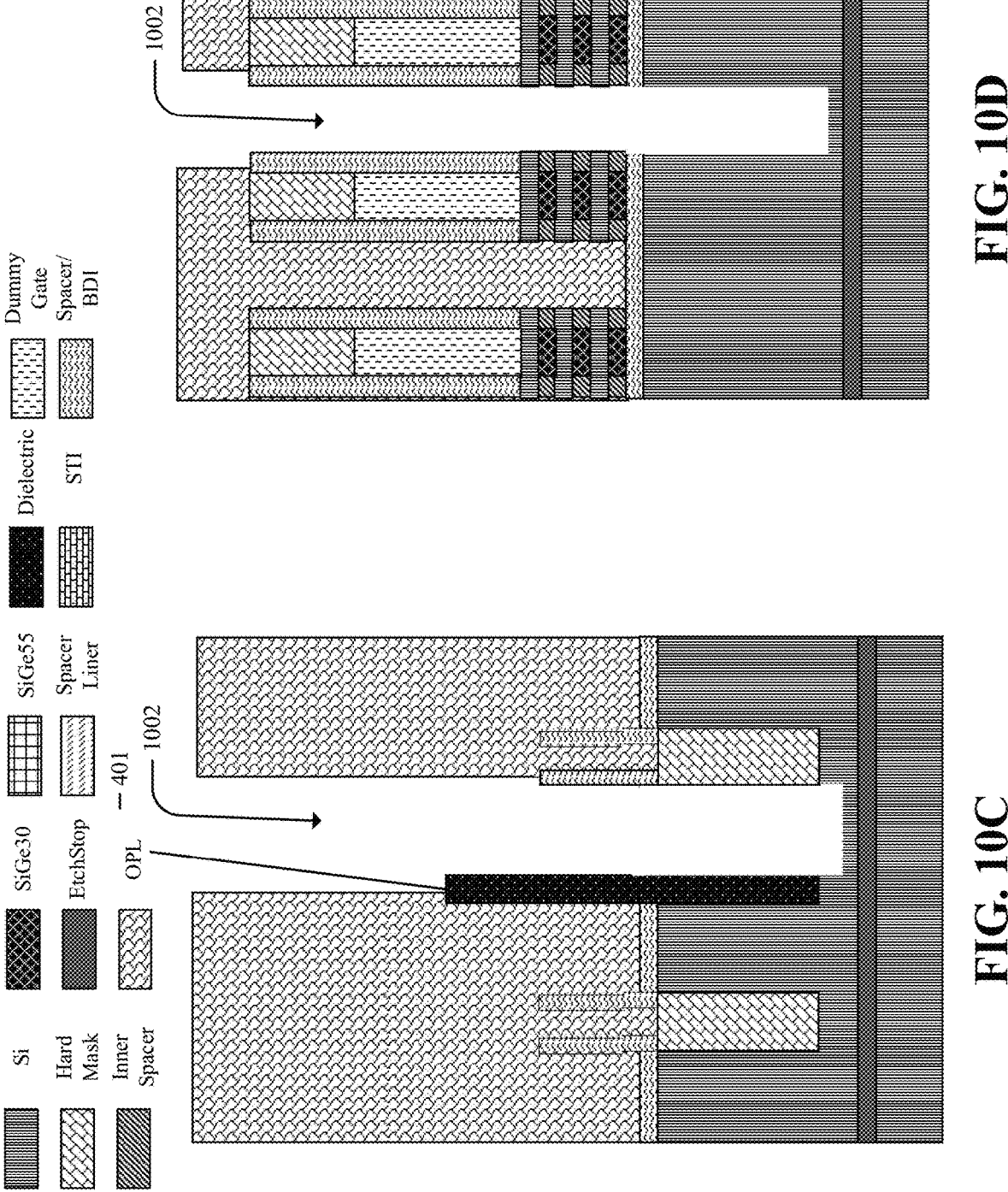

FIGS. 10B, 10C and 10D illustrate various cross-sections of a ninth stage of production of a semiconductor device, in accordance with one or more embodiments described herein. FIG. 10B illustrates a cross-section along line 1012 of FIG. 10A. FIG. 10C illustrates a cross-section along line 1011 of FIG. 10A. As shown by FIG. 10C, channel 1002 has been patterned through OPL 1001. In an embodiment, a portion of dielectric bar 401 can be exposed by channel 1002. FIG. 10D illustrates a cross-section along line 1013 of FIG. 10A. As shown, channel 1002 is patterned through OPL 1001.

Figure 11B:
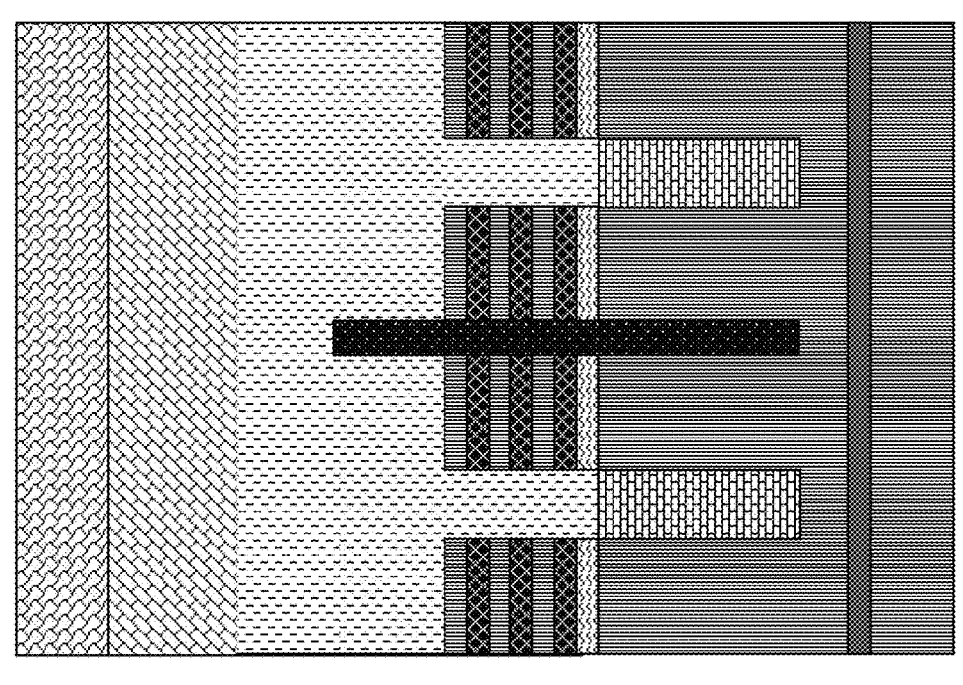
FIGS. 11B, 11C and 11D illustrate various cross-sections of a tenth stage of production of a semiconductor device, in accordance with one or more embodiments described herein.
Figure 11A:
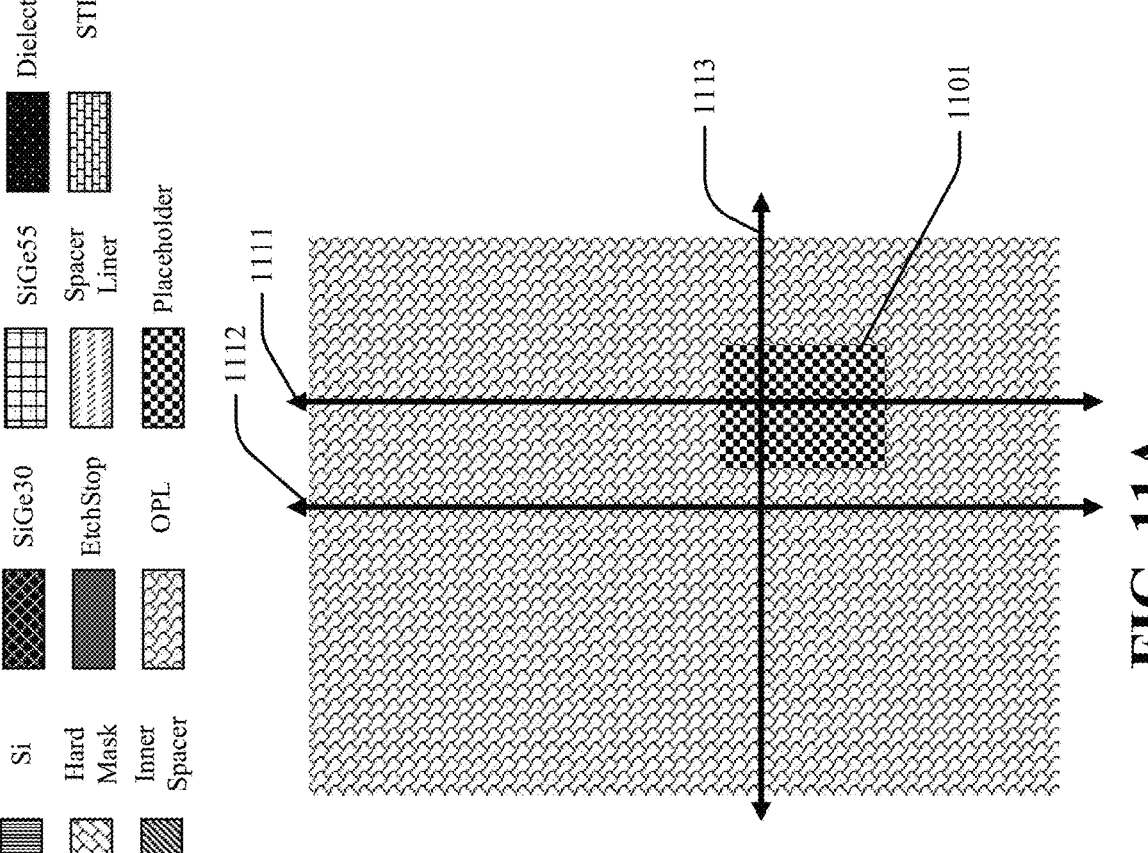
FIG. 11A illustrates a top-down view of an example, non-limiting, tenth stage of production of a semiconductor device, in accordance with one or more embodiments described herein.

FIG. 11A illustrates a top-down view of an example, non-limiting, tenth stage of production of a semiconductor device, in accordance with one or more embodiments described herein. As shown by FIG. 11A, a contact place holder 1101 can be deposited within channel 1002. In an embodiment, contact place holder 1101 can comprise a material such as TiOx, AlOx, SiC, or another suitable dielectric material. FIG. 11A further comprises lines 1111, 1112 and 1113 utilized to illustrate cross-sections below.

Figures 11C, 11D:
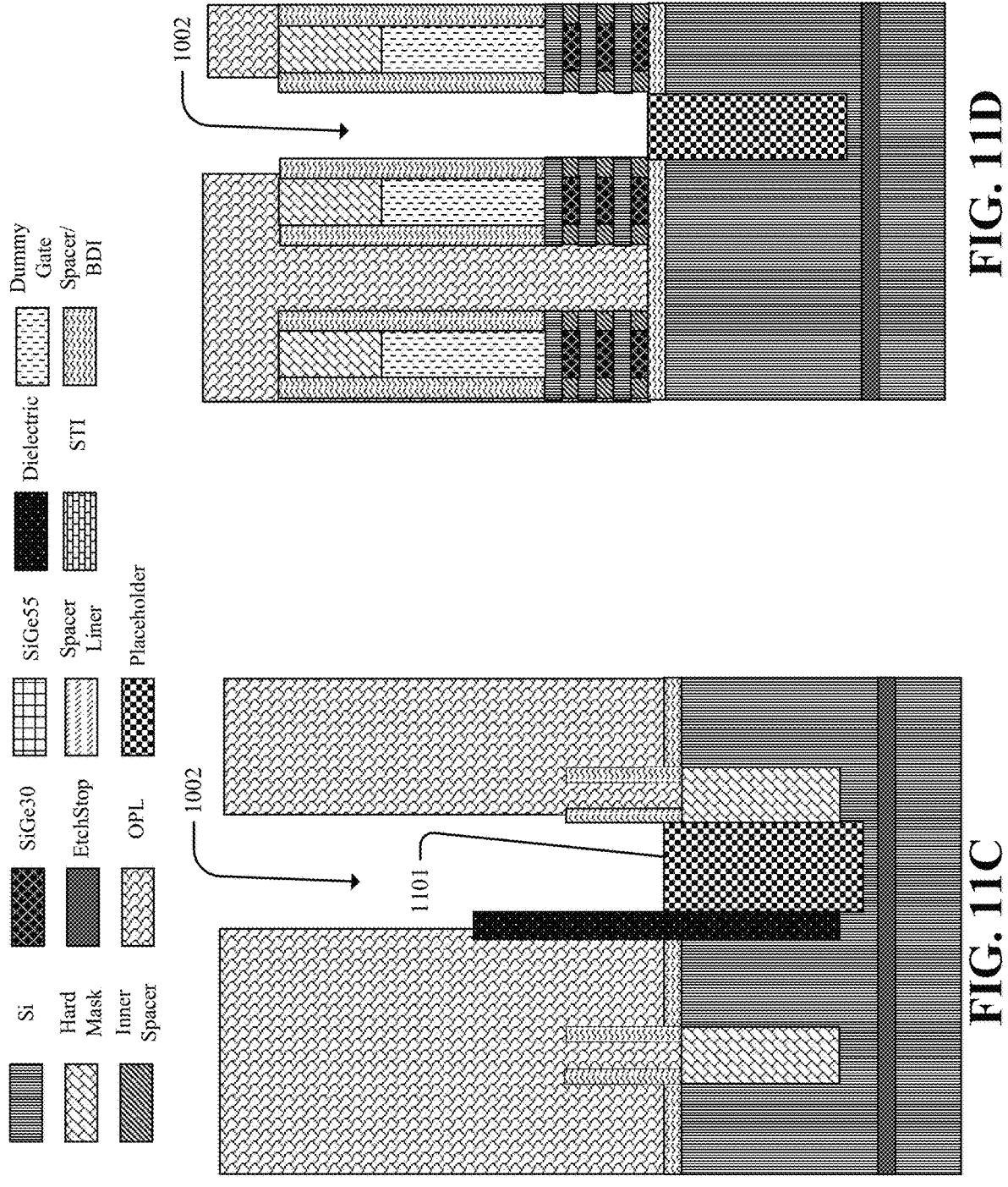

FIGS. 11B, 11C and 11D illustrate various cross-sections of a tenth stage of production of a semiconductor device, in accordance with one or more embodiments described herein. FIG. 11B illustrates a cross-section along line 1112 of FIG. 11A. FIG. 11C illustrates a cross-section along line 1111 of FIG. 11A. FIG. 11D illustrates a cross-section along line 1113 of FIG. 11A. As shown by FIGS. 11C and 11D, contact place holder 1101 can be deposited in a bottom portion of channel 1002.

Figures 12A, 12B:
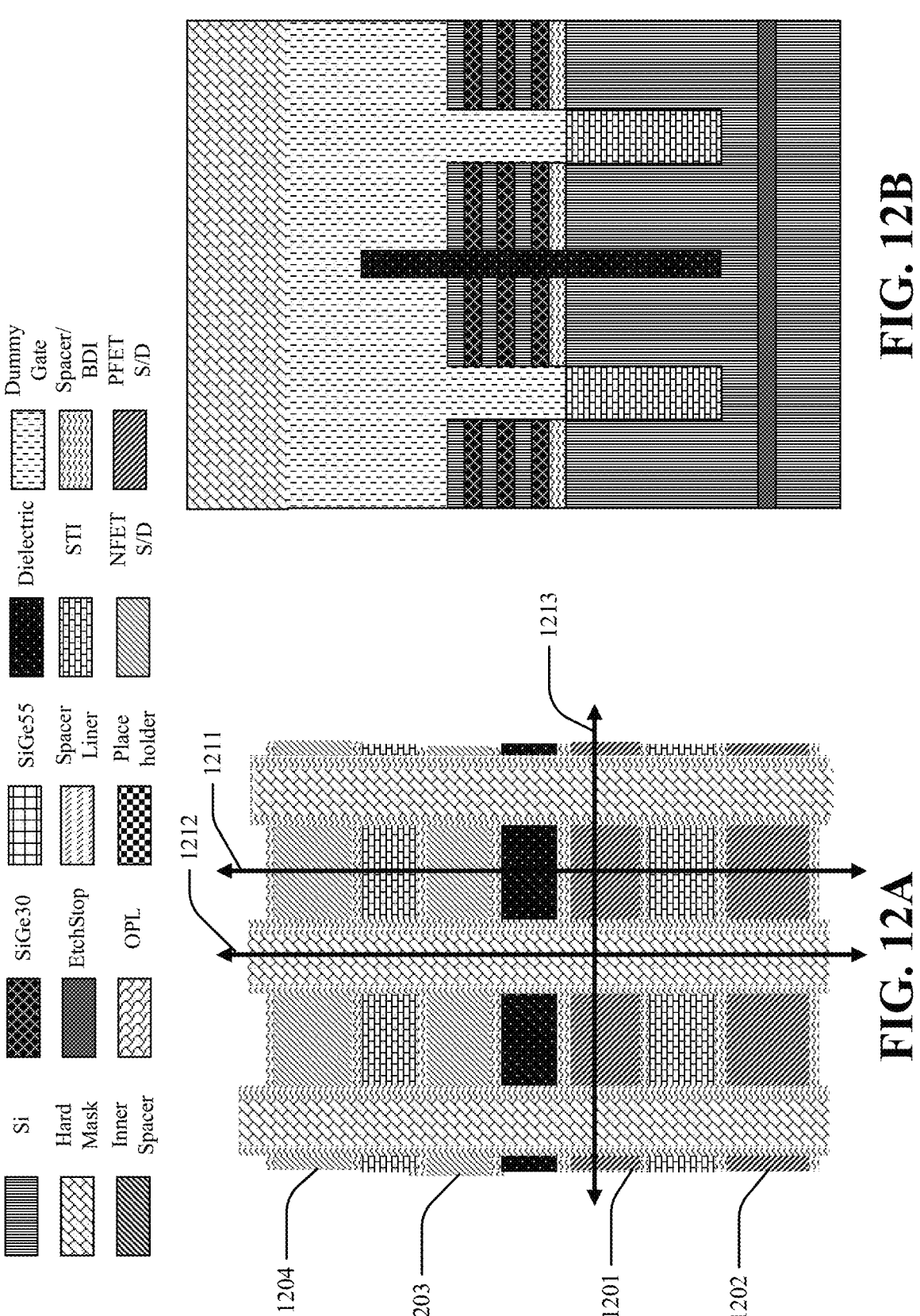
FIG. 12A illustrates a top-down view of an example, non-limiting, eleventh stage of production of a semiconductor device, in accordance with one or more embodiments described herein.
FIGS. 12B, 12C and 12D illustrate various cross-sections of an eleventh stage of production of a semiconductor device, in accordance with one or more embodiments described herein.

FIG. 12A illustrates a top-down view of an example, non-limiting, eleventh stage of production of a semiconductor device, in accordance with one or more embodiments described herein. As shown by FIG. 12A, OPL 1001 can be removed and source/drain epis 1201, 1202, 1203 and 1204 can be patterned. In an embodiment, source/drain epis 1201 and 1202 can be utilized for PFETs and source/drain epis 1203 and 1204 can be utilized for NFETs. FIG. 12A further comprises lines 1211, 1212 and 1213 utilized to illustrate cross-sections below.

Figures 12C, 12D:
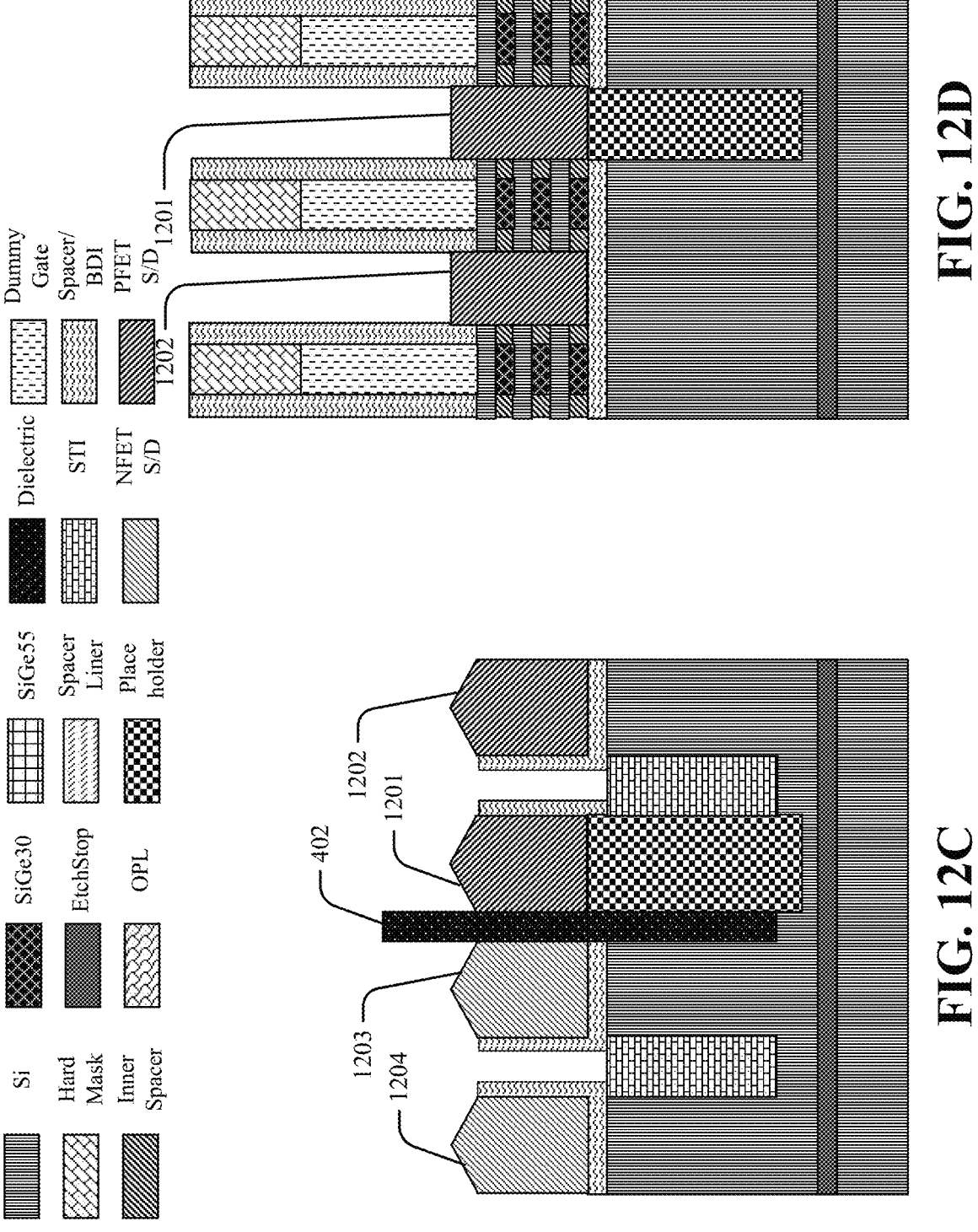

FIGS. 12B, 12C and 12D illustrate various cross-sections of an eleventh stage of production of a semiconductor device, in accordance with one or more embodiments described herein. FIG. 12B illustrates a cross-section along line 1212 of FIG. 12A. FIG. 12C illustrates a cross-section alone line 1211 of FIG. 12A. As shown, source/drain epis 1201, 1202, 1203 and 1204 have been patterned. As shown, source/drain epi 1201 is located adjacent to dielectric bar 401 and on top of the contact place holder. FIG. 12D illustrates a cross-section along line 1213 of FIG. 12A. As shown by FIG. 12D, source/drain epis 1201 and 1202 have been formed, wherein source/drain epi 1201 is located on top of the contact place holder.

Figures 13A, 13B:
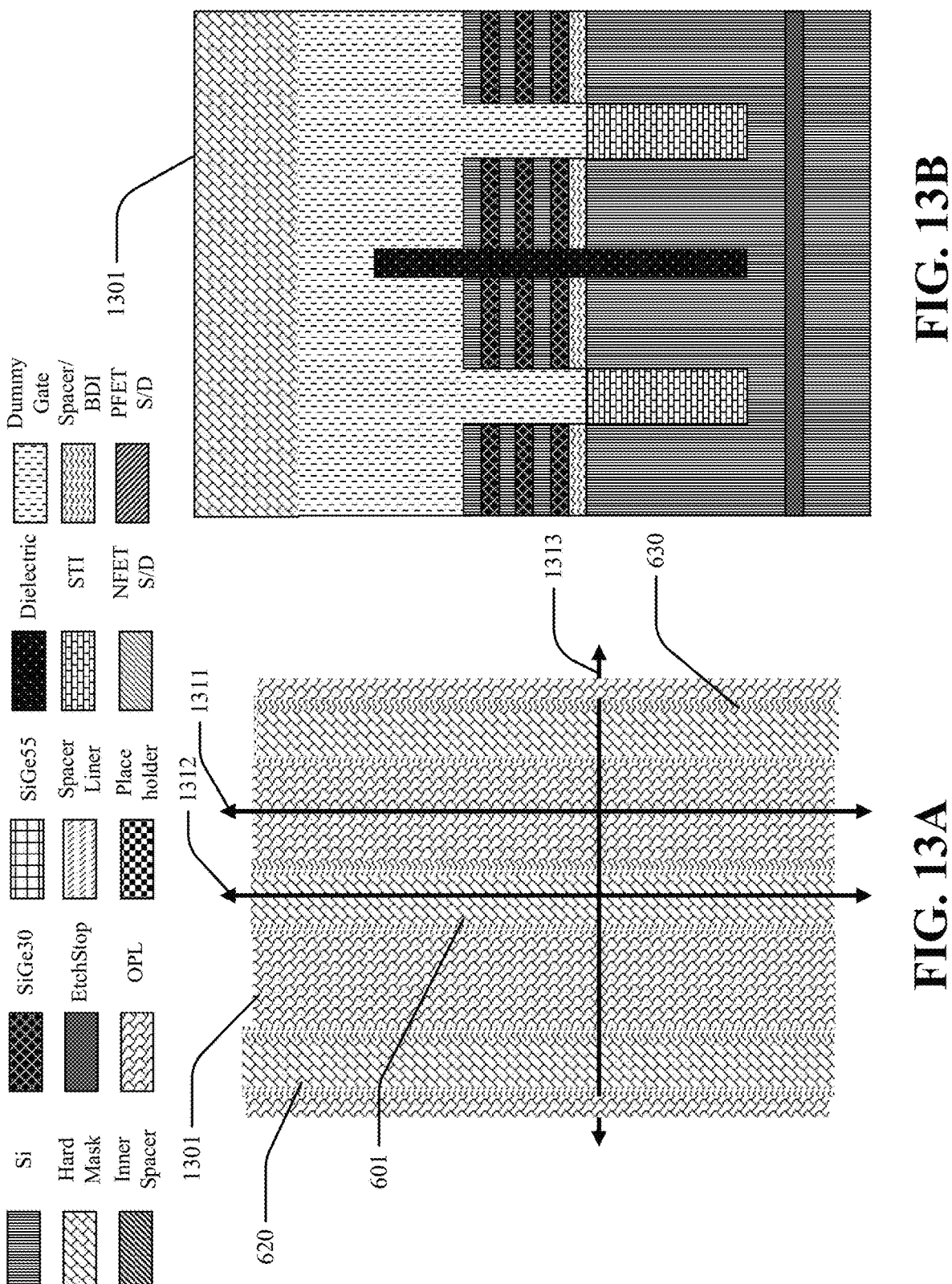
FIG. 13A illustrates a top-down view of an example, non-limiting, twelfth stage of production of a semiconductor device, in accordance with one or more embodiments described herein.
FIGS. 13B, 13C and 13D illustrate various cross-sections of a twelfth stage of production of a semiconductor device, in accordance with one or more embodiments described herein.

FIG. 13A illustrates a top-down view of an example, non-limiting, twelfth stage of production of a semiconductor device, in accordance with one or more embodiments described herein. As shown by FIG. 13A, a second OPL layer 1301 can be deposited between, dummy gates 620, 601 and 630. FIG. 13A further comprises lines 1311, 1312 and 1313 utilized to illustrate cross-sections below.

Figures 13C, 13D:
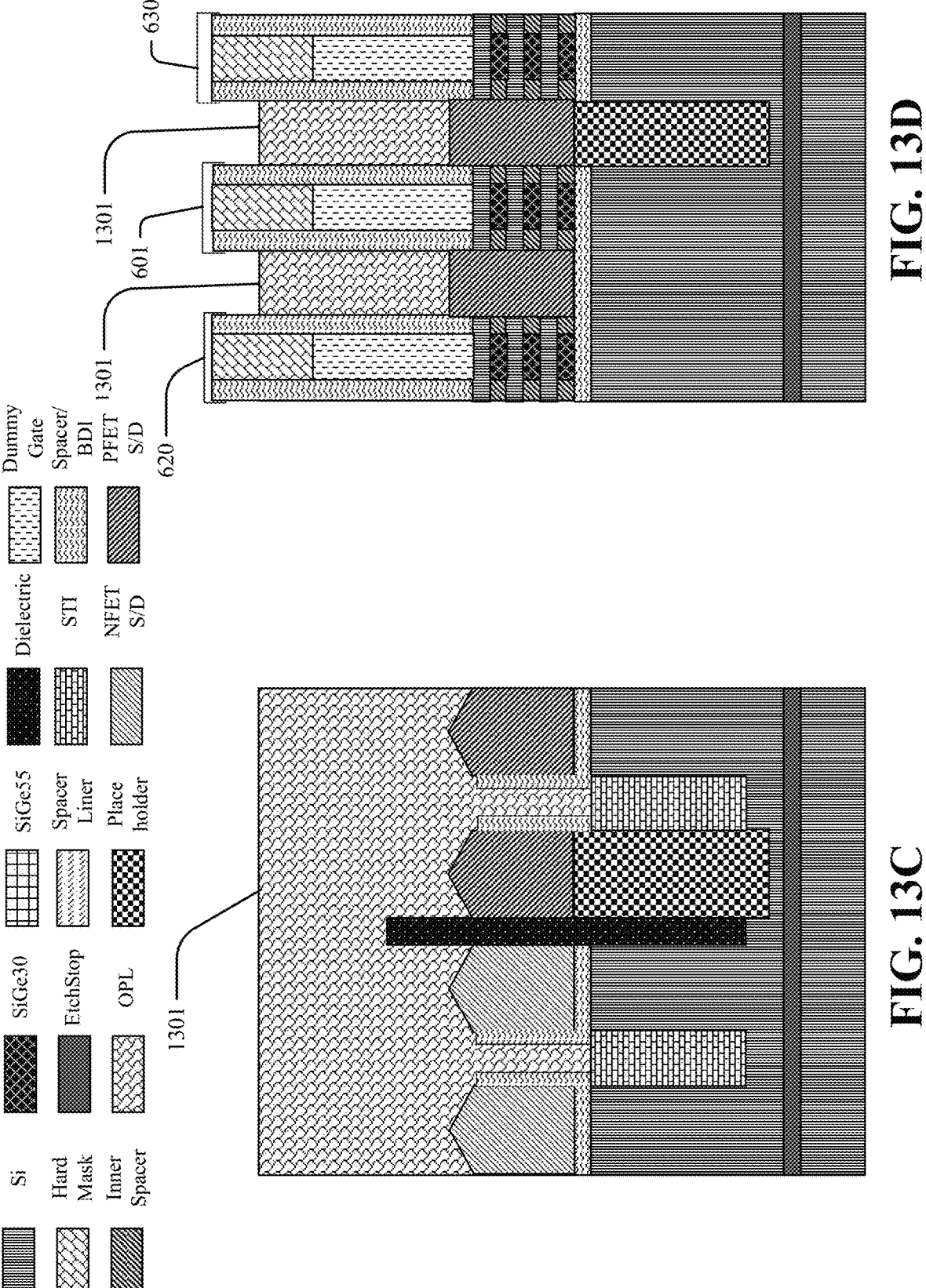

FIGS. 13B, 13C and 13D illustrate various cross-sections of a twelfth stage of production of a semiconductor device, in accordance with one or more embodiments described herein. FIG. 13B illustrates a cross-section along line 1312, FIG. 13C illustrates a cross-section along line 1311, and FIG. 13D illustrates a cross-section along line 1313. As shown by FIGS. 13B, 13C and 13D, second OPL layer 1301 can be deposited on the semiconductor device between dummy gates 620, 601 and 630.

Figures 14A, 14B, 14C:
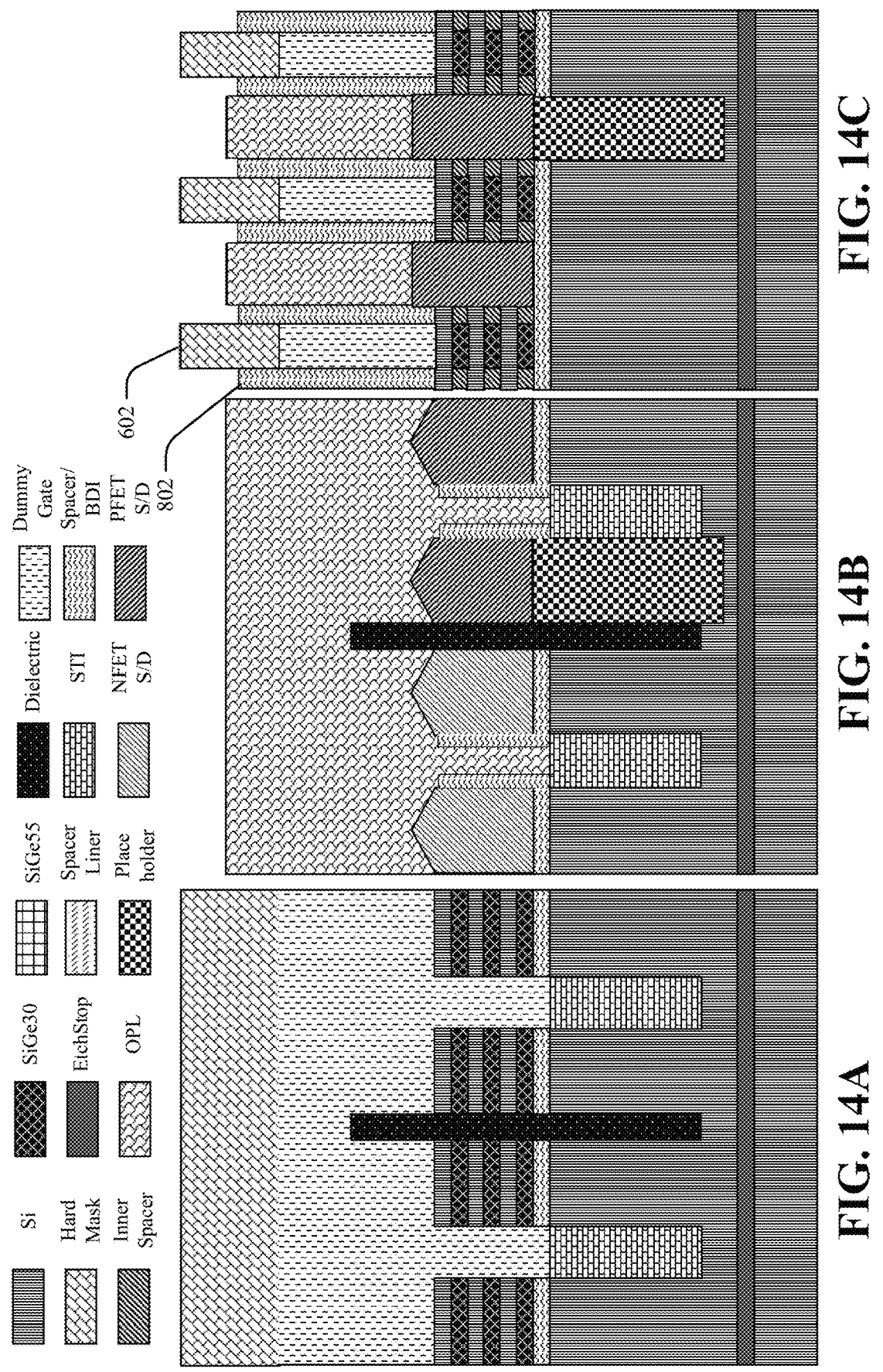
FIGS. 14A, 14B and 14C illustrate various cross-sections of a thirteenth stage of production of a semiconductor device, in accordance with one or more embodiments described herein.

FIGS. 14A, 14B and 14C illustrate various cross-sections of a thirteenth stage of production of a semiconductor device, in accordance with one or more embodiments described herein. FIG. 14A illustrates a cross-section along line 1312, FIG. 14B illustrates a cross-section along line 1311, and FIG. 14C illustrates a cross-section along line 1313. As shown by FIG. 14C, spacer material 802 can be recessed to expose the sides of hardmask 602.

Figures 15A, 15B:
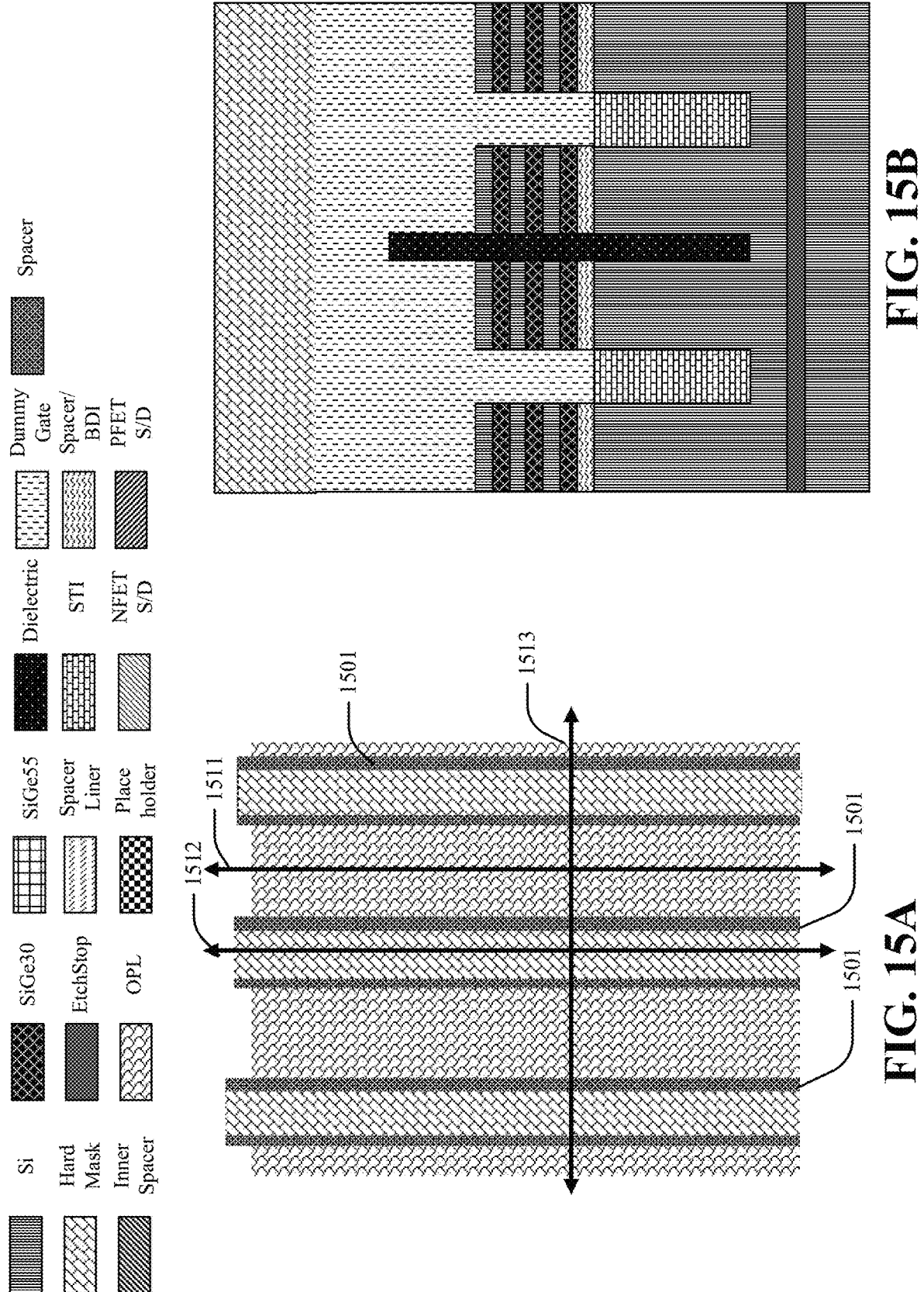
FIG. 15A illustrates a top-down view of an example, non-limiting, fourteenth stage of production of a semiconductor device, in accordance with one or more embodiments described herein.
FIGS. 15B, 15C and 15D illustrate various cross-sections of a fourteenth stage of production of a semiconductor device, in accordance with one or more embodiments described herein.

FIG. 15A illustrates a top-down view of an example, non-limiting, fourteenth stage of production of a semiconductor device, in accordance with one or more embodiments described herein. As shown by FIG. 15A, a second spacer 1501 can be deposited on the sidewalls of the exposed portions of hardmask 602. In an embodiment, second spacer 1501 can comprise materials such as AlN, AlOx, SiC, or another suitable material. FIG. 15A further comprises lines 1511, 1512 and 1513 utilized to illustrate cross-sections below.

Figures 15C, 15D:
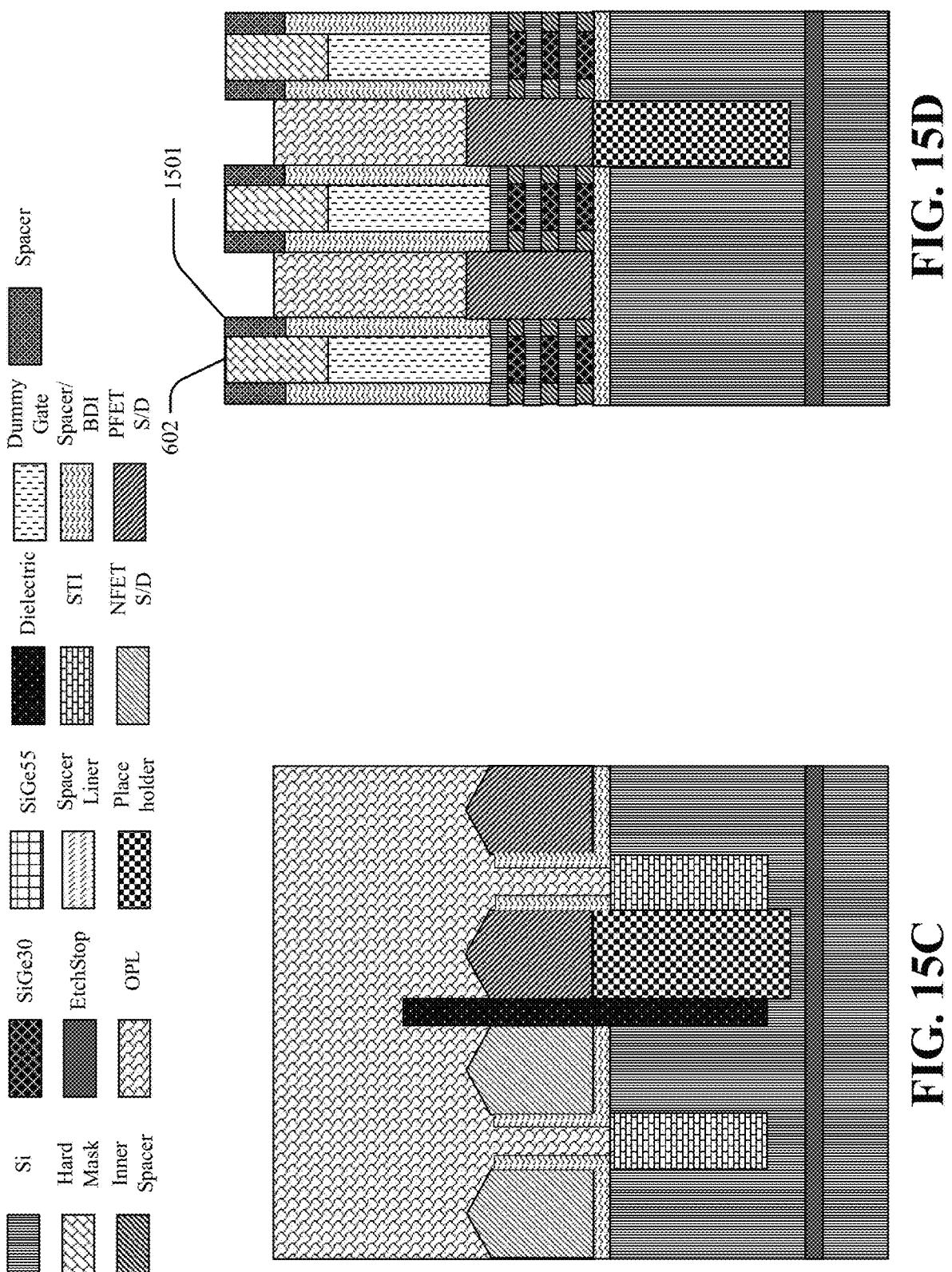

FIGS. 15B, 15C and 15D illustrate various cross-sections of a fourteenth stage of production of a semiconductor device, in accordance with one or more embodiments described herein. FIG. 15B illustrates a cross-section along line 1512, FIG. 15C illustrates a cross-section along line 1511, and FIG. 15D illustrates a cross-section along line 1513. As shown by FIG. 15D, second spacer 1501 has been deposited on the sidewalls of hardmask 602.

Figures 16A, 16B:
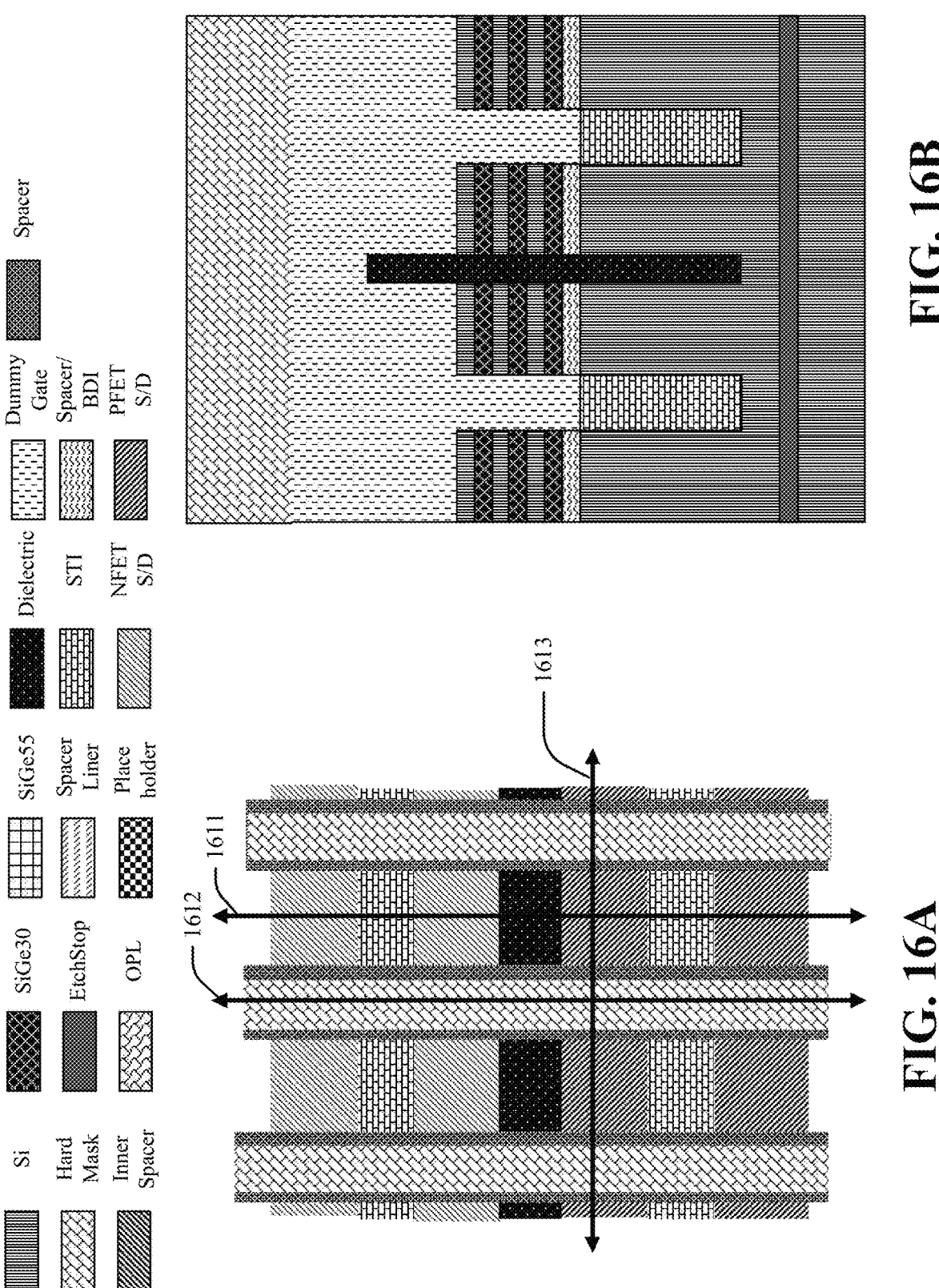
FIG. 16A illustrates a top-down view of an example, non-limiting, fifteenth stage of production of a semiconductor device, in accordance with one or more embodiments described herein.
FIGS. 16B, 16C and 16D illustrate various cross-sections of a fifteenth stage of production of a semiconductor device, in accordance with one or more embodiments described herein.

FIG. 16A illustrates a top-down view of an example, non-limiting, fifteenth stage of production of a semiconductor device, in accordance with one or more embodiments described herein. As shown, second OPL layer 1301 can be removed to facilitate removal of a portion of BDI layer 801. FIG. 16A further comprises lines 1611, 1612 and 1613 utilized to illustrate cross-sections below.

Figures 16C, 16D:
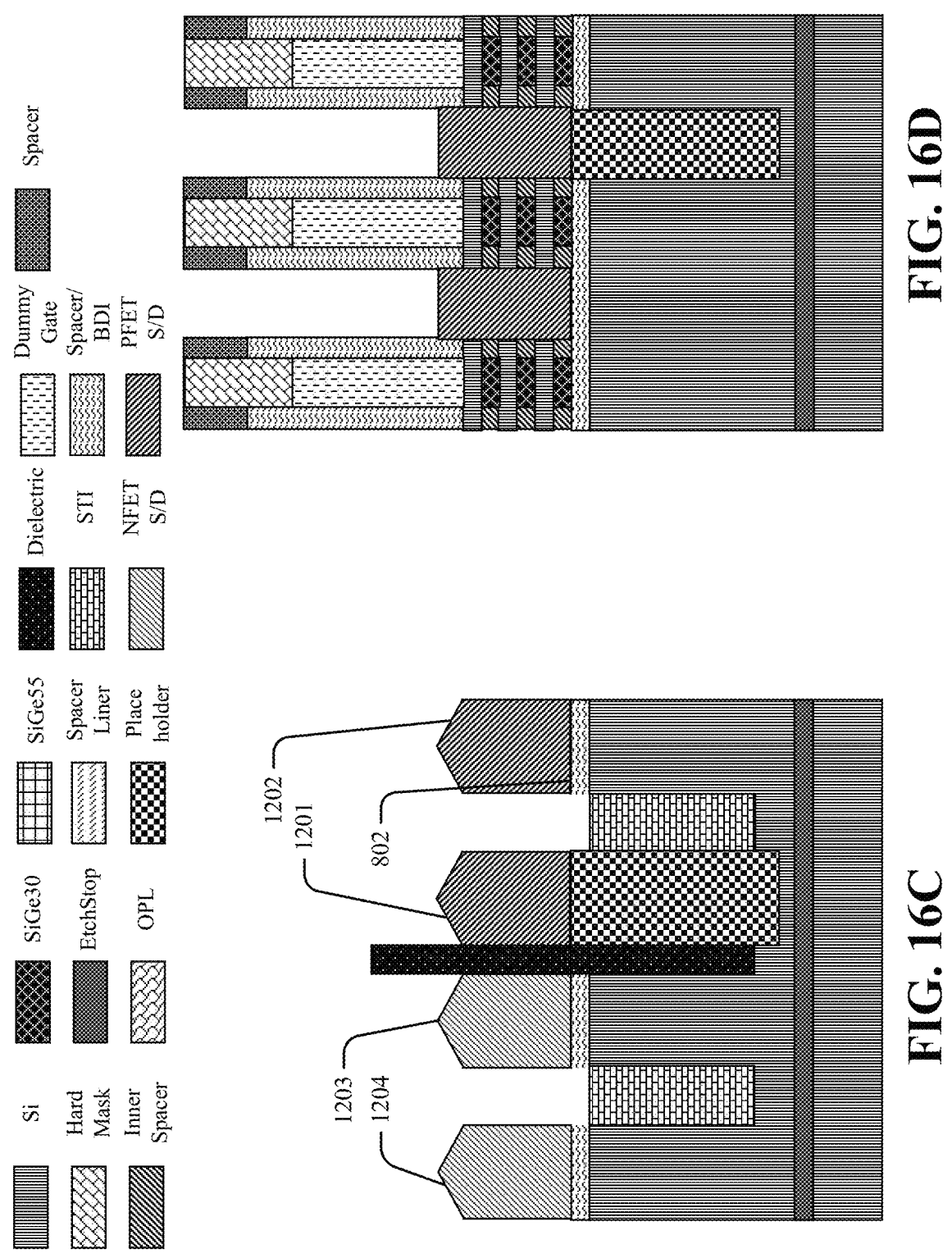

FIGS. 16B, 16C and 16D illustrate various cross-sections of a fifteenth stage of production of a semiconductor device, in accordance with one or more embodiments described herein. FIG. 16B illustrates a cross-section along line 1612, FIG. 16C illustrates a cross-section along line 1611, and FIG. 16D illustrates a cross-section along line 1613. As shown by FIG. 16C, the portions of BDI layer 801 along the side walls of source/drain epis 1201, 1202, 1203 and 1204 can be removed.

Figures 17A, 17B:
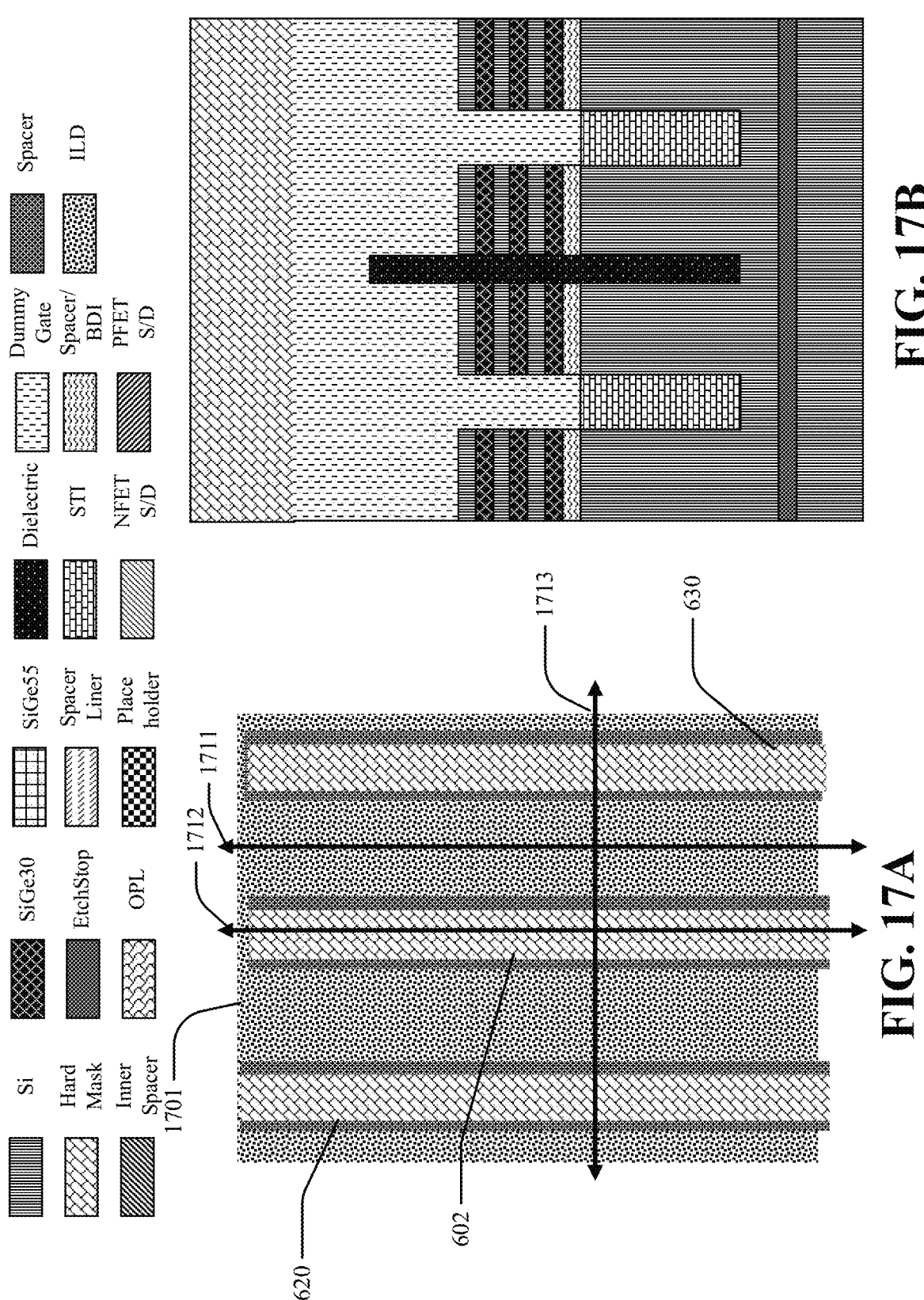
FIG. 17A illustrates a top-down view of an example, non-limiting, sixteenth stage of production of a semiconductor device, in accordance with one or more embodiments described herein.
FIGS. 17B, 17C and 17D illustrate various cross-sections of a sixteenth stage of production of a semiconductor device, in accordance with one or more embodiments described herein.

FIG. 17A illustrates a top-down view of an example, non-limiting, sixteenth stage of production of a semiconductor device, in accordance with one or more embodiments described herein. As shown an intermediate layer dielectric (ILD) 1701 can be deposited between dummy gates 620, 601 and 630. In an embodiment, ILD 1701 can comprise $SiO_2$ or another suitable dielectric material. FIG. 17A further comprises lines 1711, 1712 and 1713 utilized to illustrate cross-sections below.

Figures 17C, 17D:
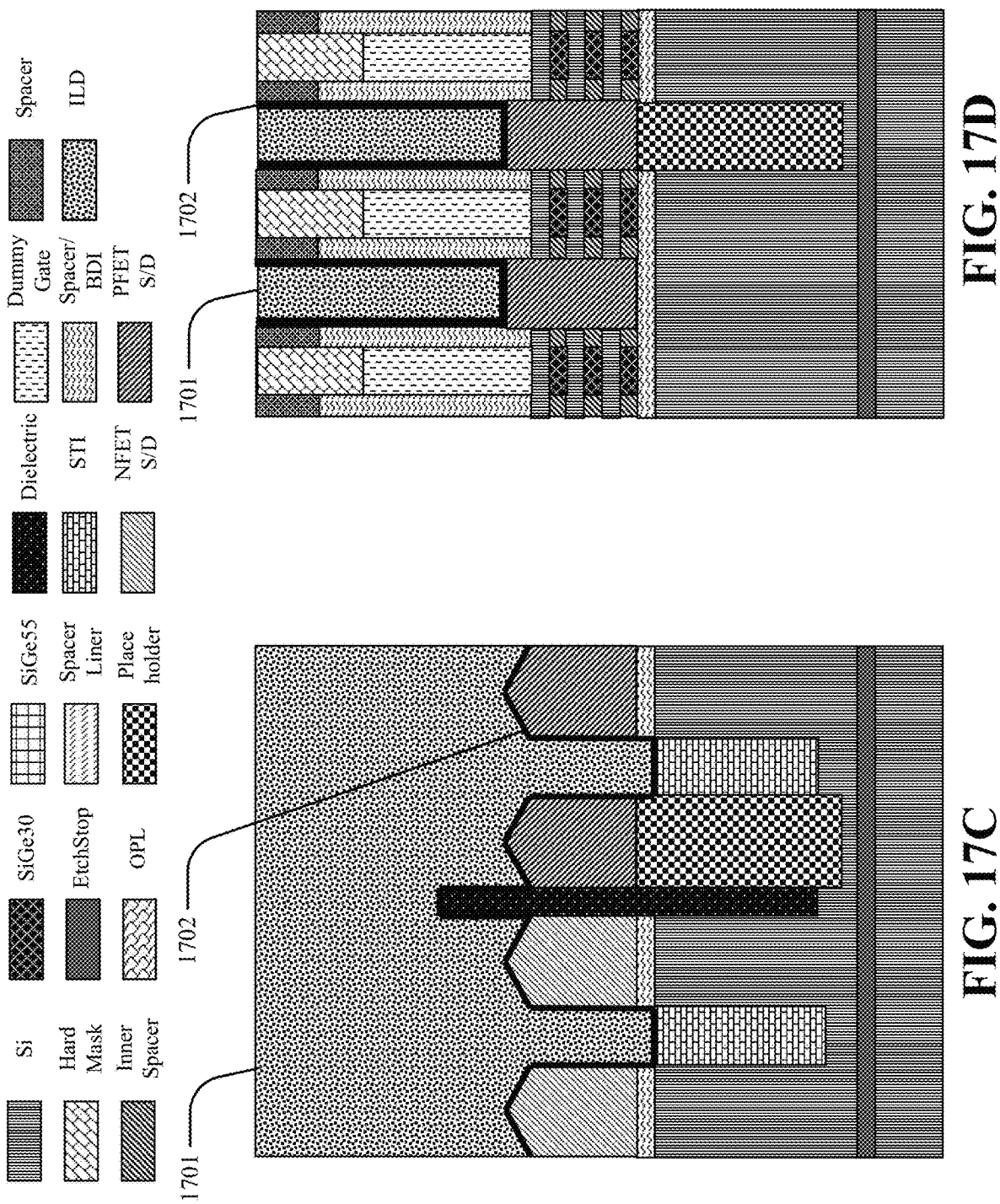

FIGS. 17B, 17C and 17D illustrate various cross-sections of a sixteenth stage of production of a semiconductor device, in accordance with one or more embodiments described herein. FIG. 17B illustrates a cross-section along line 1712, FIG. 17C illustrates a cross-section along line 1711, and FIG. 17D illustrates a cross-section along line 1713. As shown by FIGS. 17C and 17D, a liner 1702 can be deposited prior to deposition of ILD 1701. In an embodiment, liner 1702 can comprise a material such as SiN. In an embodiment, ILD 1701 can serve as a protective layer during later fabrication steps and liner 1702 can serve as an etch-stop layer for removal of ILD 1701.

Figures 18A, 18B, 18C:
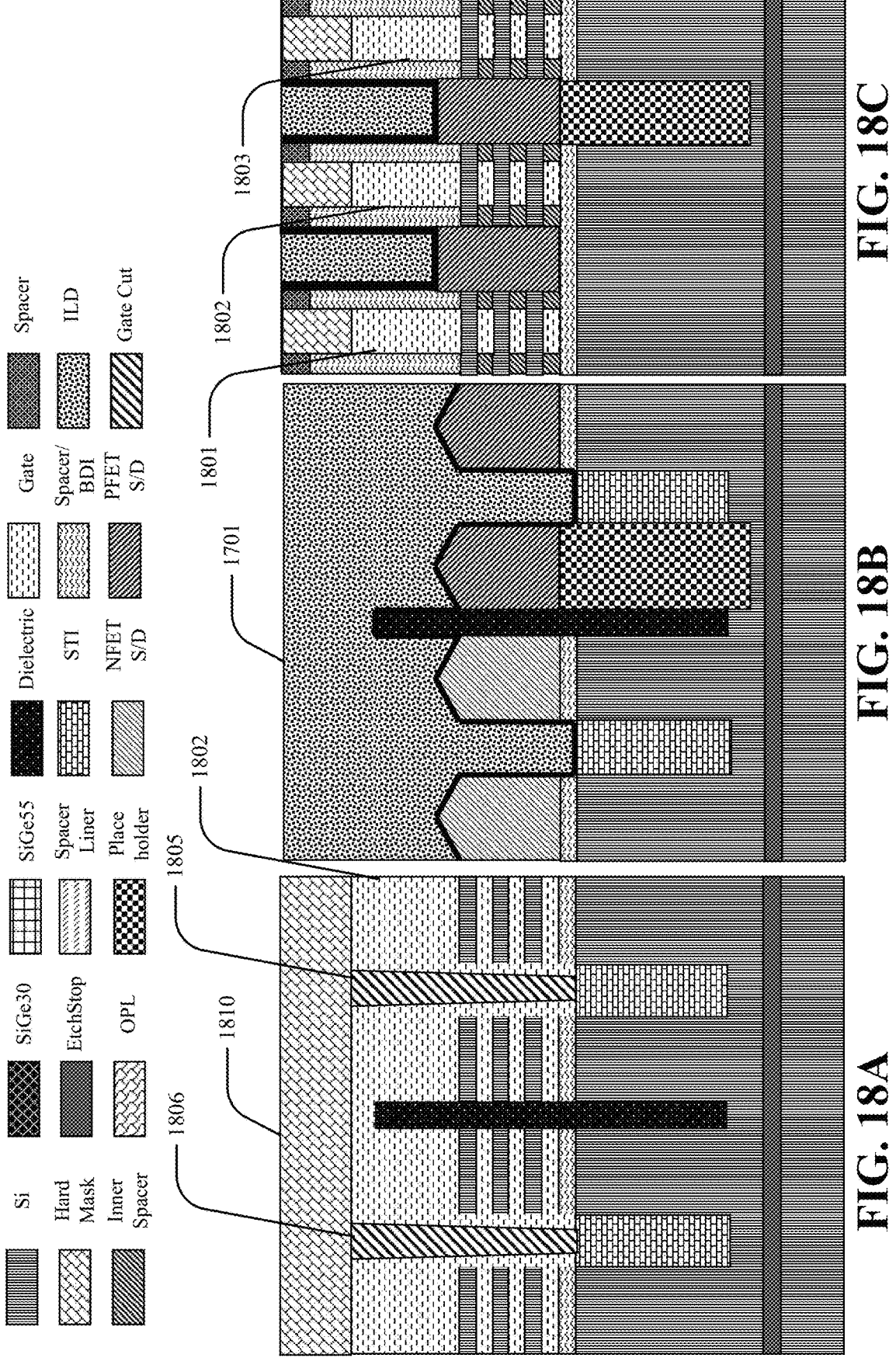
FIGS. 18A, 18B and 18C illustrate various cross-sections of a seventeenth stage of production of a semiconductor device, in accordance with one or more embodiments described herein.

FIGS. 18A, 18B and 18C illustrate various cross-sections of a seventeenth stage of production of a semiconductor device, in accordance with one or more embodiments described herein. FIG. 18A illustrates a cross-section along line 1712, FIG. 18B illustrates a cross-section along line 1711, and FIG. 18C illustrates a cross-section along line 1713. As shown by FIG. 18A, hardmask 602, dummy gates 620, 601 and 630 and SiGe30 layers can be removed and replace by a metallization process to form gates 1801, 1802 and 1803. Gate cuts 1805 and 1806 can be patterned above STI regions 501 and 502. A second hardmask 1810 can then be patterned on top of the gates 1801, 1802 and 1803. As shown by FIG. 18B, ILD 1701 can protect portions of the semiconductor device during gate formation.

Figures 19A, 19B:
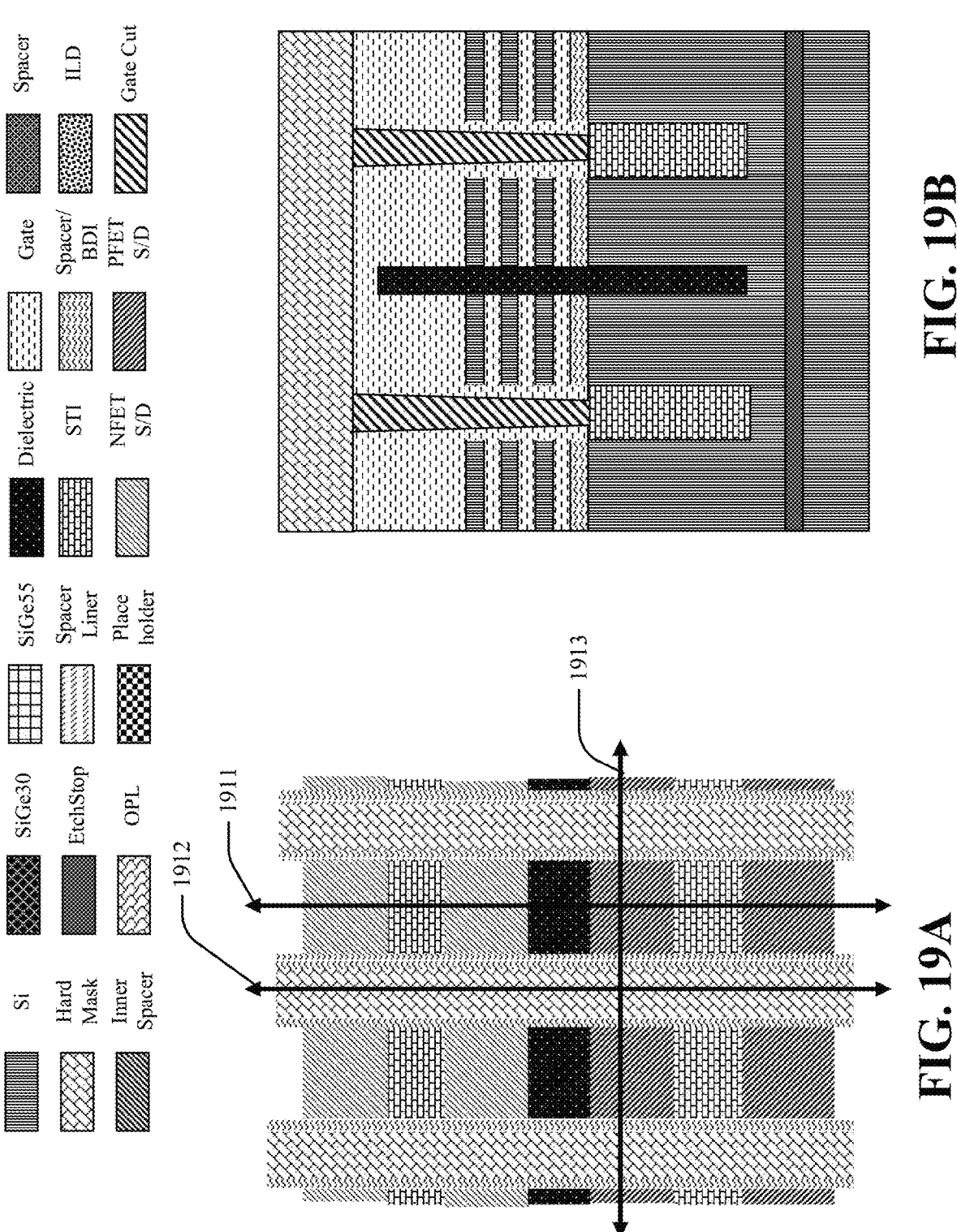
FIG. 19A illustrates a top-down view of an example, non-limiting, eighteenth stage of production of a semiconductor device in accordance with one or more embodiments described herein.
FIGS. 19B, 19C and 19D illustrate various cross-sections of an eighteenth stage of production of a semiconductor device, in accordance with one or more embodiments described herein.

FIG. 19A illustrates a top-down view of an example, non-limiting, eighteenth stage of production of a semiconductor device in accordance with one or more embodiments described herein. As shown by FIG. 19A, ILD 1701 and liner 1702 can be removed after formation of gates 1801, 1802 and 1803 using an etching or other suitable process. For example, liner 1702 can serve as an etch-stop layer during removal of ILD 1701, and then can be removed. FIG. 19A further comprises lines 1911, 1912 and 1913 utilized to illustrate cross-sections below.

Figure 19D:
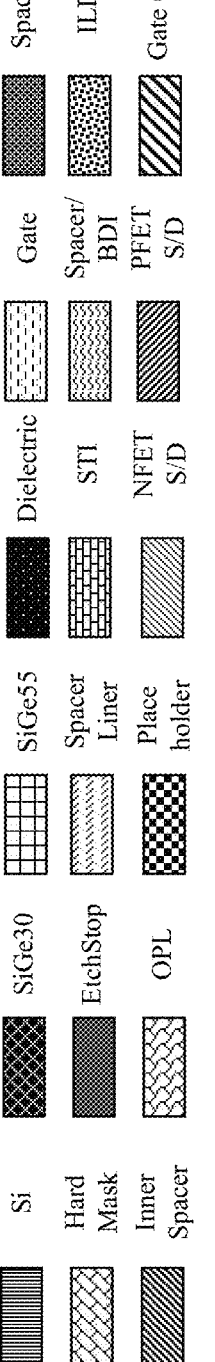
Figure 19D:
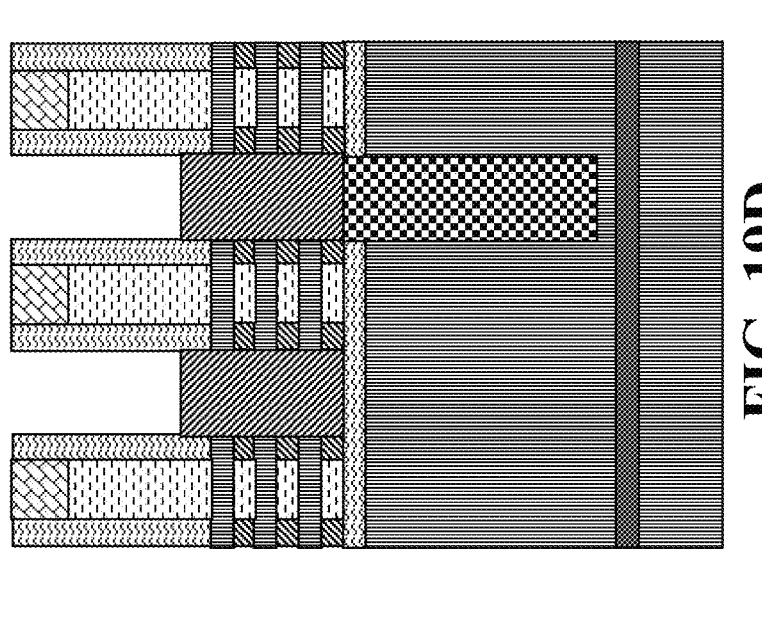
Figure 19C:
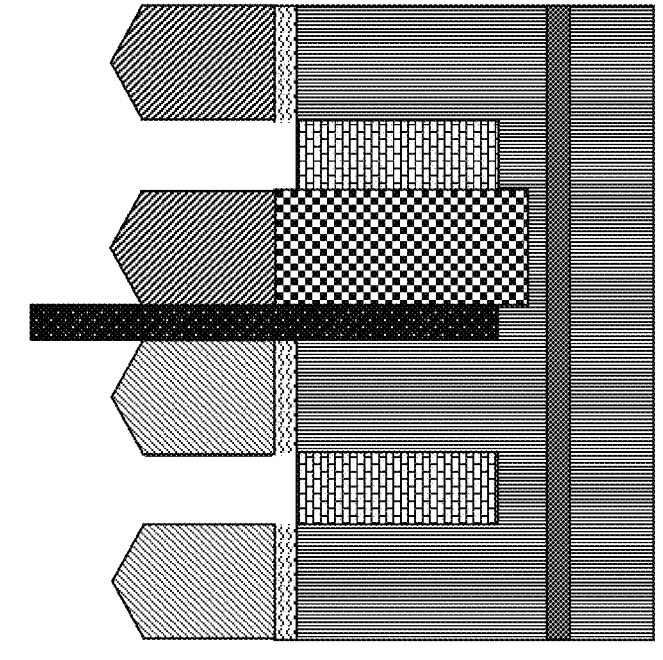

FIGS. 19B, 19C and 19D illustrate various cross-sections of an eighteenth stage of production of a semiconductor device, in accordance with one or more embodiments described herein. FIG. 19B illustrates a cross-section along line 1912, FIG. 19C illustrates a cross-section along line 1911, and FIG. 19D illustrates a cross-section along line 1913. As shown, ILD 1701 and liner 1702 can be removed after formation of gates 1801, 1802 and 1803.

Figures 20A, 20B:
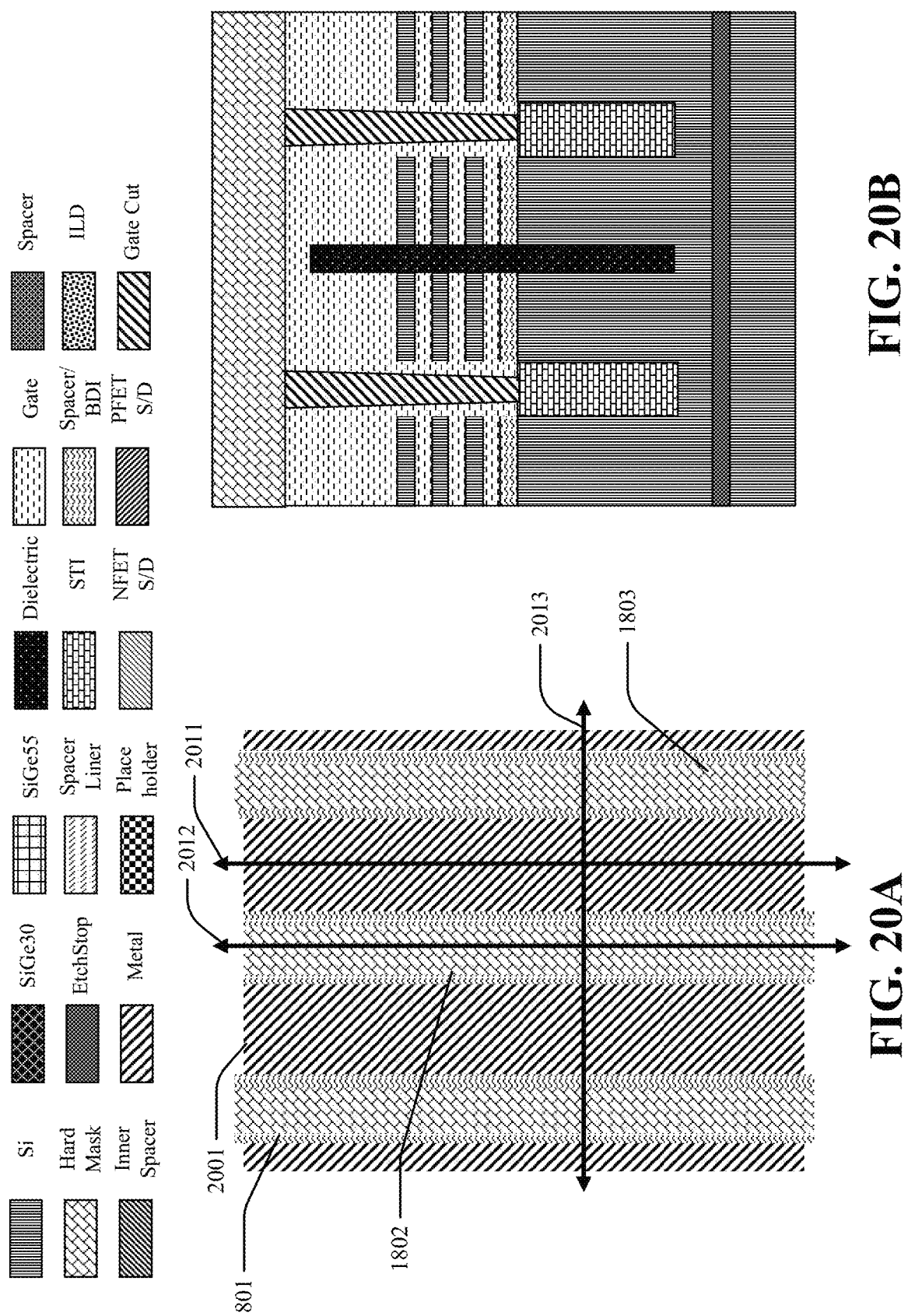
FIG. 20A illustrates a top-down view of an example, non-limiting, nineteenth stage of production of a semiconductor device, in accordance with one or more embodiments described herein.
FIGS. 20B, 20C and 20D illustrate various cross-sections of a nineteenth stage of production of a semiconductor device, in accordance with one or more embodiments described herein.

FIG. 20A illustrates a top-down view of an example, non-limiting, nineteenth stage of production of a semiconductor device, in accordance with one or more embodiments described herein. As shown by FIG. 20A, a metal layer 2001 can be deposited between gates 1801, 1802 and 1803. As will be described in greater detail below in further production stages, metal layer 2001 can be further formed to produce one or more contacts. In an embodiment, metal layer 2001 can comprise materials such as, but not limited to, aluminum, nickel, chromium, gold, germanium, copper, silver, titanium, tungsten, platinum, tantalum or another suitable metal. FIG. 20A further comprises lines 2011, 2012 and 2013 utilized to illustrate cross-sections below.

Figures 20C, 20D:
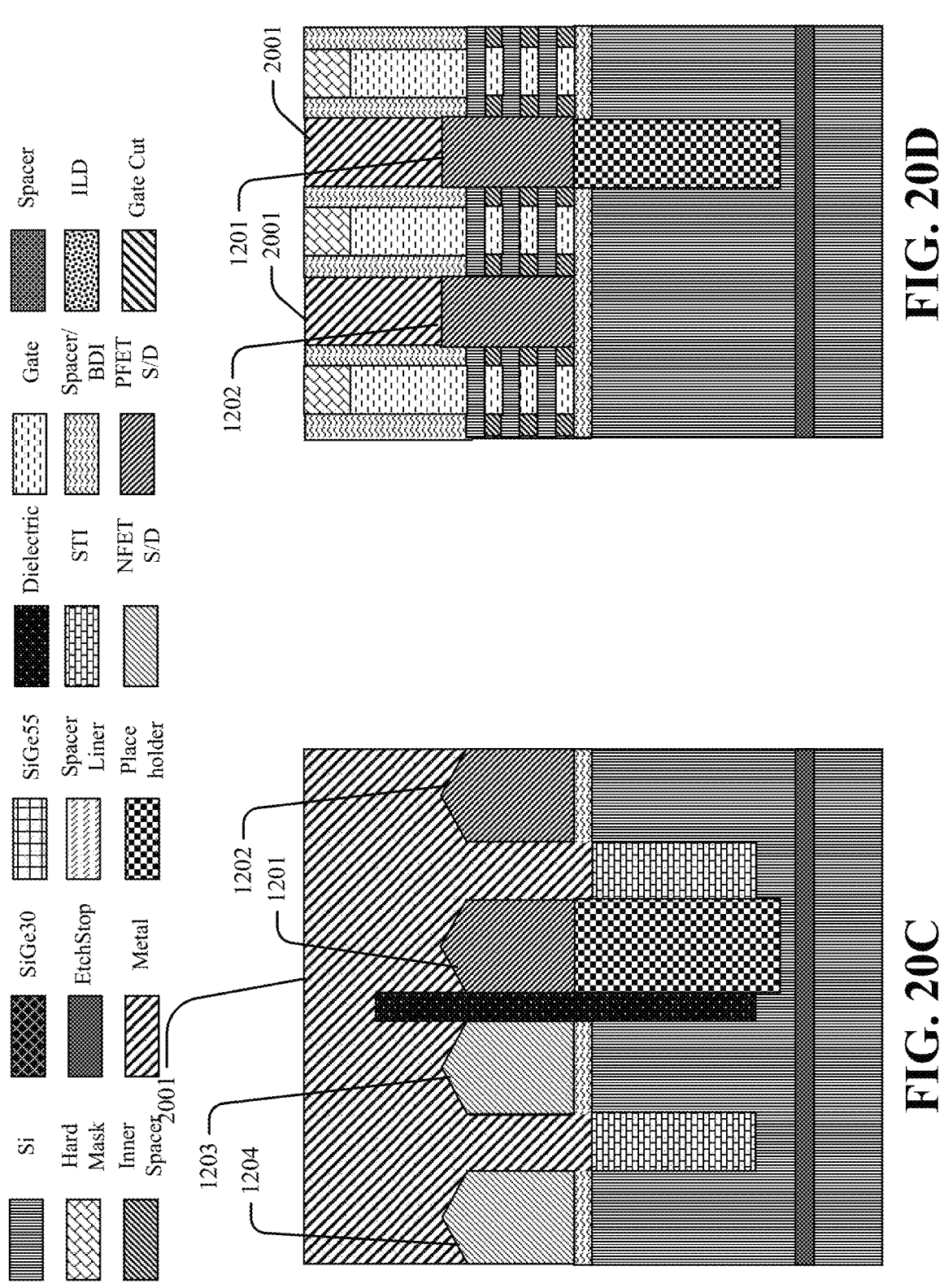

FIGS. 20B, 20C and 20D illustrate various cross-sections of a nineteenth stage of production of a semiconductor device, in accordance with one or more embodiments described herein. FIG. 20B illustrates a cross-section along line 2012, FIG. 20C illustrates a cross-section along line 2011, and FIG. 20D illustrates a cross-section along line 2013. As shown, metal layer 2001 can be deposited onto source/drain epis 1201, 1202, 1203 and 1204, and will facilitate production of contacts in further stages of production.

Figures 21A, 21B:
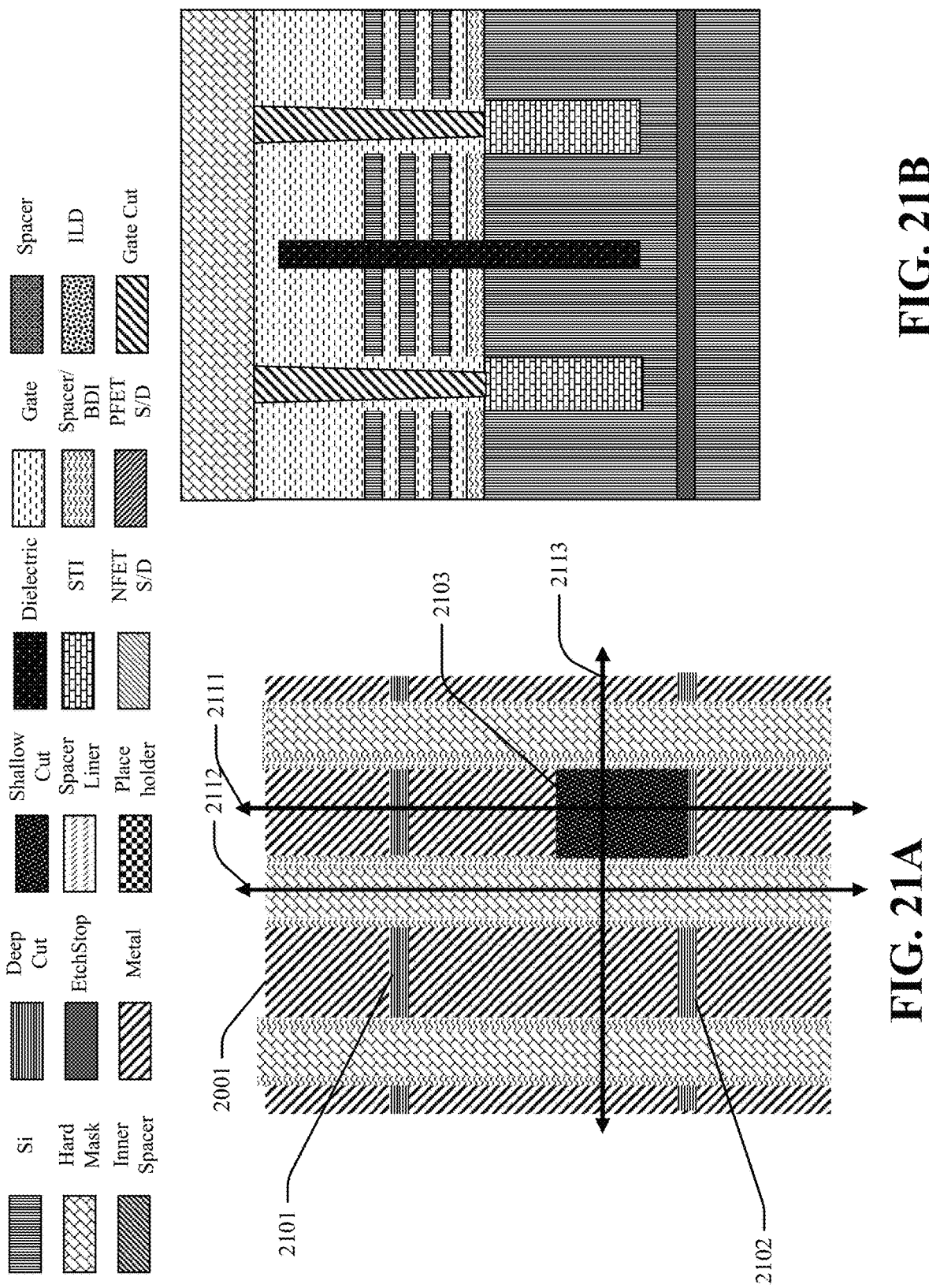
FIG. 21A illustrates a top-down view of an example, non-limiting, twentieth stage of production of a semiconductor device, in accordance with one or more embodiments described herein.
FIGS. 21B, 21C and 21D illustrate various cross-sections of a twentieth stage of production of a semiconductor device, in accordance with one or more embodiments described herein.

FIG. 21A illustrates a top-down view of an example, non-limiting, twentieth stage of production of a semiconductor device, in accordance with one or more embodiments described herein. As shown, metal layer 2001 can be divided to form two or more metal contacts by deep contact cuts 2101 and 2102 and by shallow contact cut 2103. FIG. 21A further comprises lines 2111, 2112 and 2113 utilized to illustrate cross-sections below.

Figures 21C, 21D:
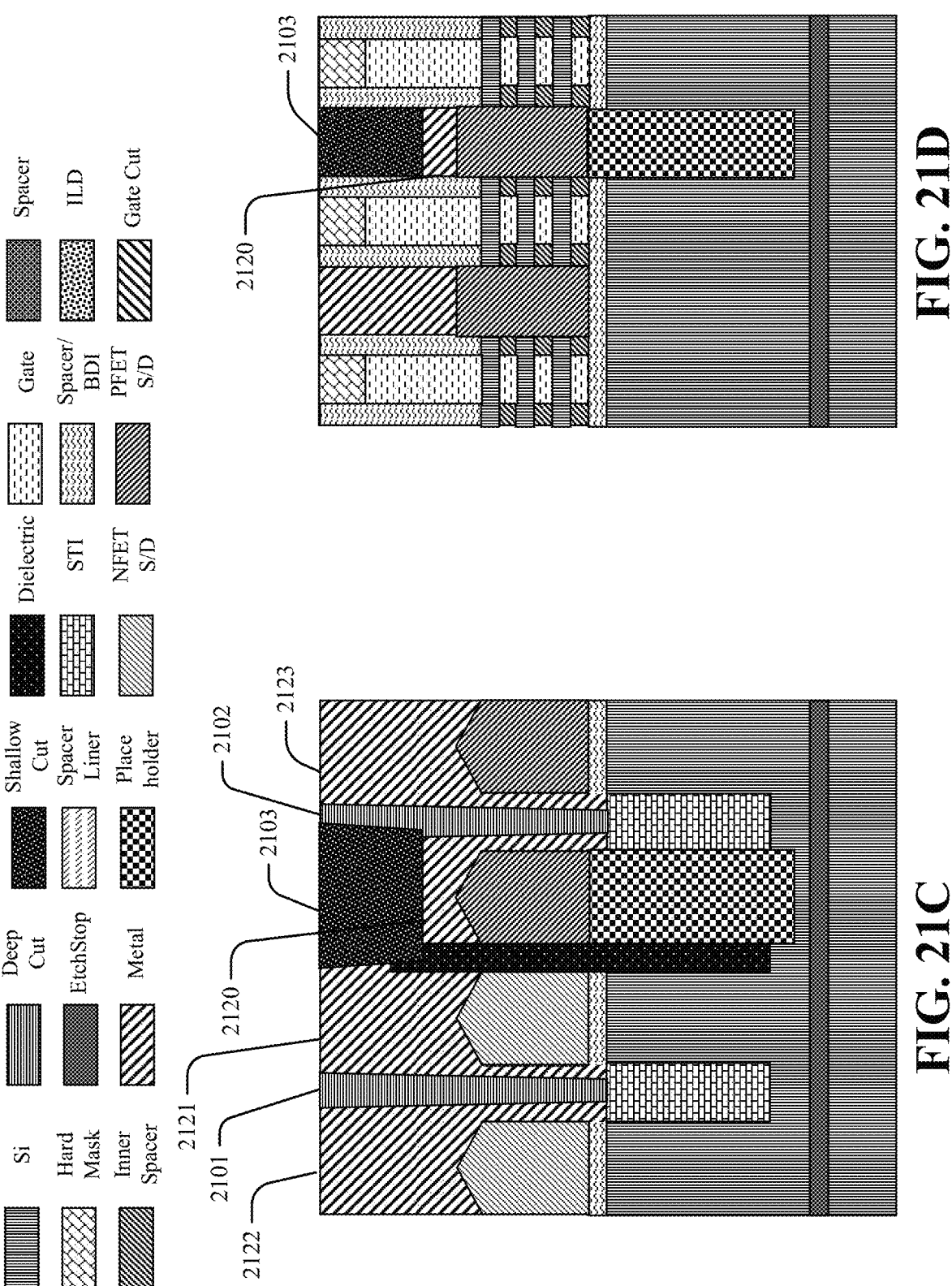

FIGS. 21B, 21C and 21D illustrate various cross-sections of a twentieth stage of production of a semiconductor device, in accordance with one or more embodiments described herein. FIG. 21B illustrates a cross-section along line 2112, FIG. 21C illustrates a cross-section along line 2111, and FIG. 21D illustrates a cross-section along line 2113. As shown, deep contact cuts 2101 and 2102 and shallow contact cut 2103 divide metal layer 2001 into contact 2122, 2121, 2120 and 2123, wherein each contact is in direct contact with a single source/drain epi. As shown, shallow contact cut 2103 can partially overlap with dielectric bar 401.

Figures 22A, 22B:
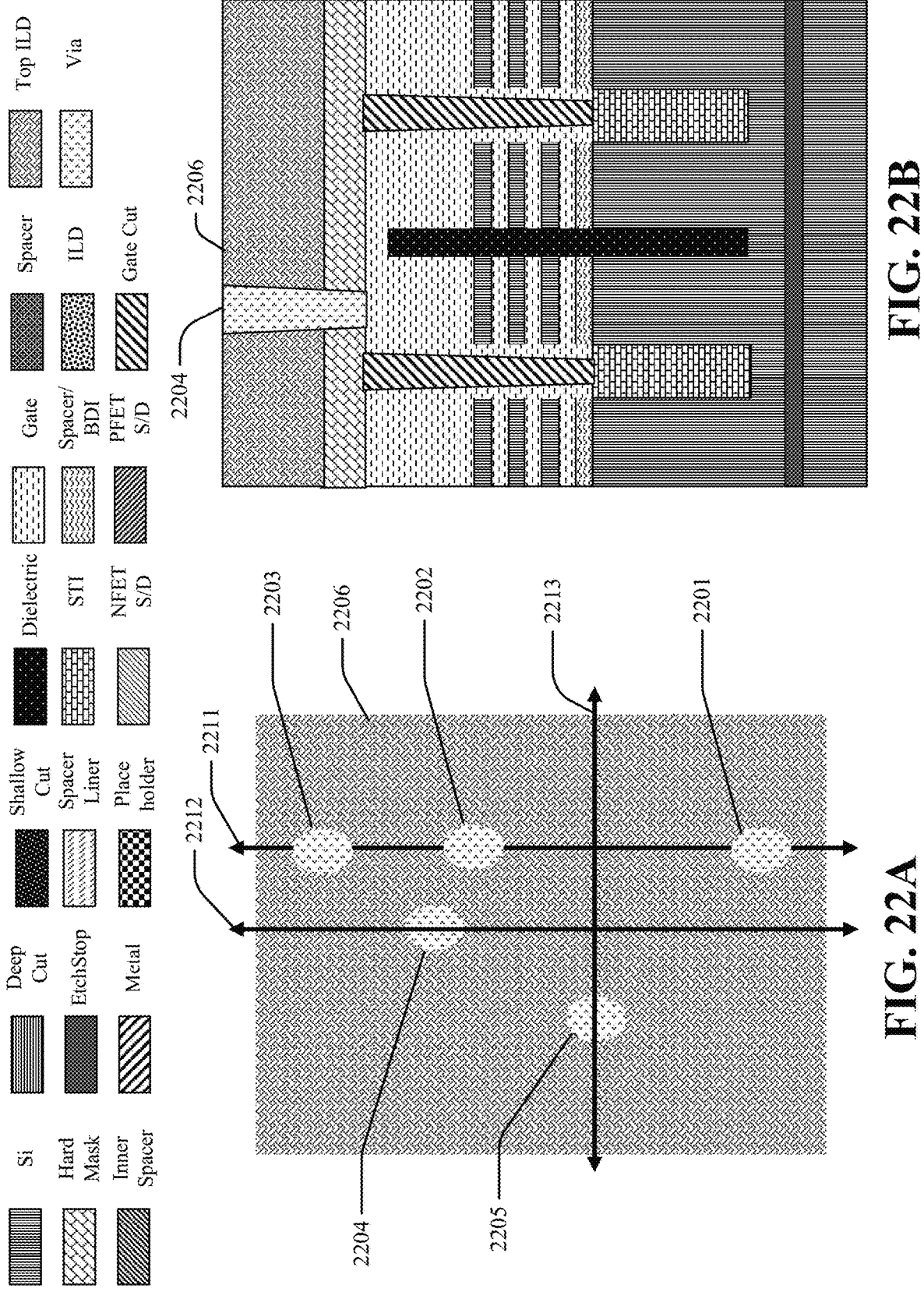
FIG. 22A illustrates a top-down view of an example, non-limiting further stage of production of a semiconductor device in accordance with one or more embodiments described herein.
FIGS. 22B, 22C and 22D illustrate various cross-sections of a twenty-first stage of production of a semiconductor device in accordance with one or more embodiments described herein.

FIG. 22A illustrates a top-down view of an example, non-limiting further stage of production of a semiconductor device in accordance with one or more embodiments described herein. As shown, one or more vias, such as vias 2201, 2202, 2203, 2204 and 2205 can be patterned and ILD 2206 can be deposited on top of the device. FIG. 22A further comprises lines 2211, 2212 and 2213 utilized to illustrate cross-sections below.

Figures 22C, 22D:
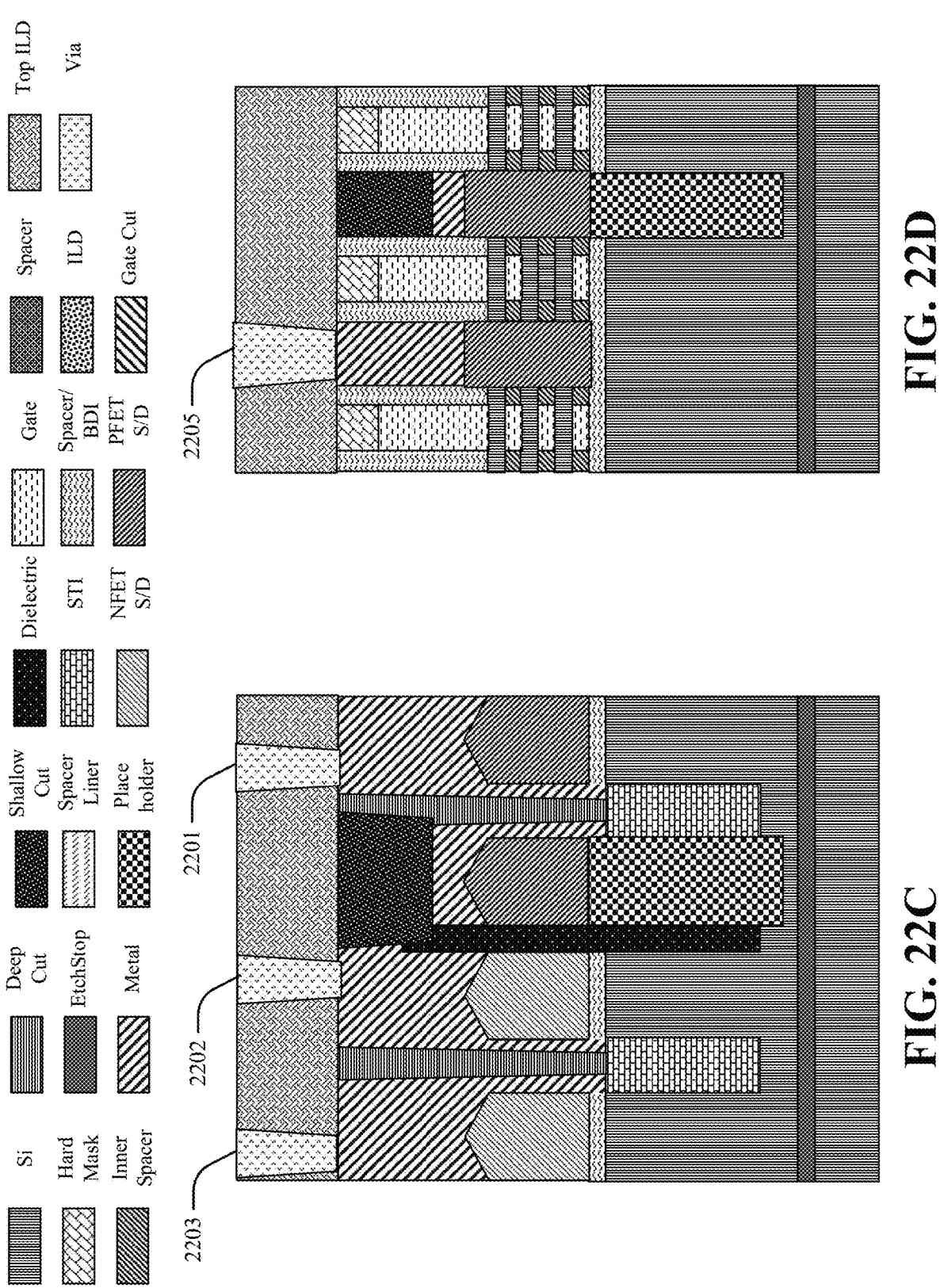

FIGS. 22B, 22C and 22D illustrate various cross-sections of a twenty-first stage of production of a semiconductor device in accordance with one or more embodiments described herein. FIG. 22B illustrates a cross-section along line 2212, FIG. 22C illustrates a cross-section along line 2211, and FIG. 22D illustrates a cross-section along line 2213. As shown, vias 2201, 2202, 2203, 2204 and 2205 can be patterned and ILD 2206 can be deposited on top of the device.

Figure 23A:
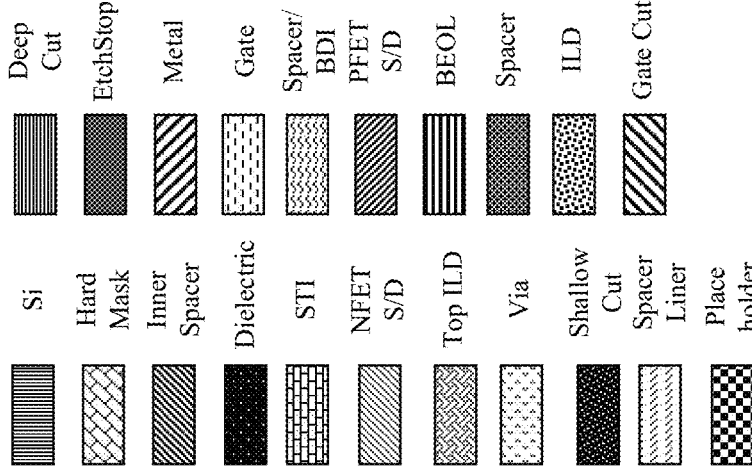
FIGS. 23A, 23B and 23C illustrate various cross-sections of a twenty-second stage of production of a semiconductor device in accordance with one or more embodiments described herein.
Figure 23A:
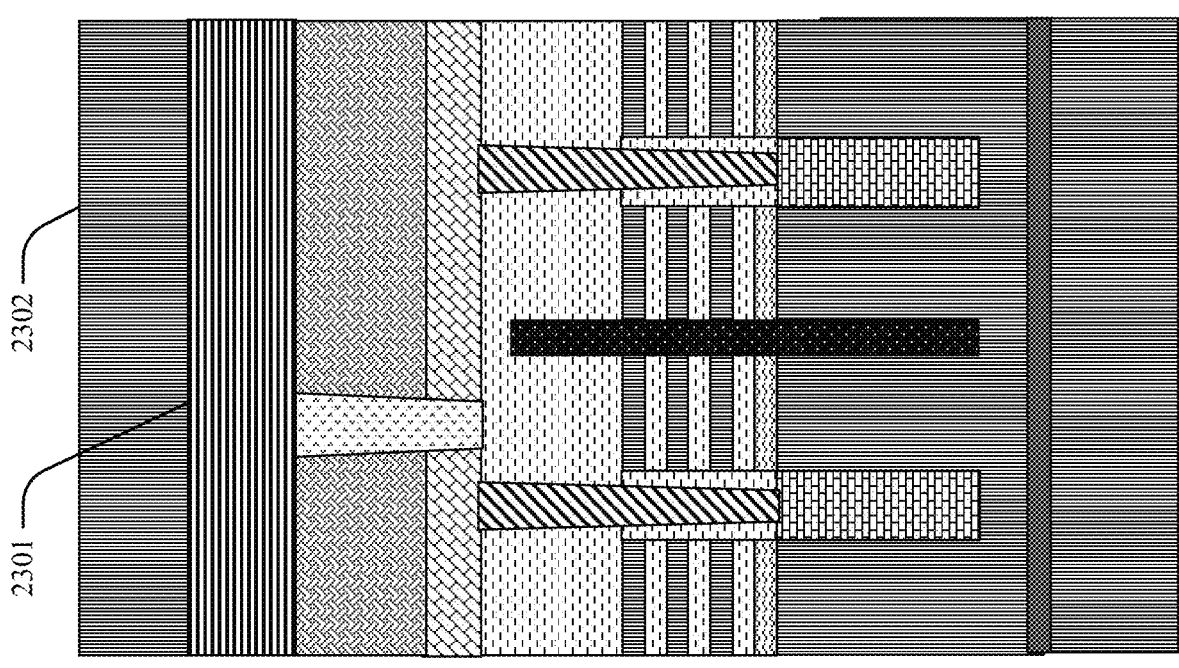
Figures 23B, 23C:
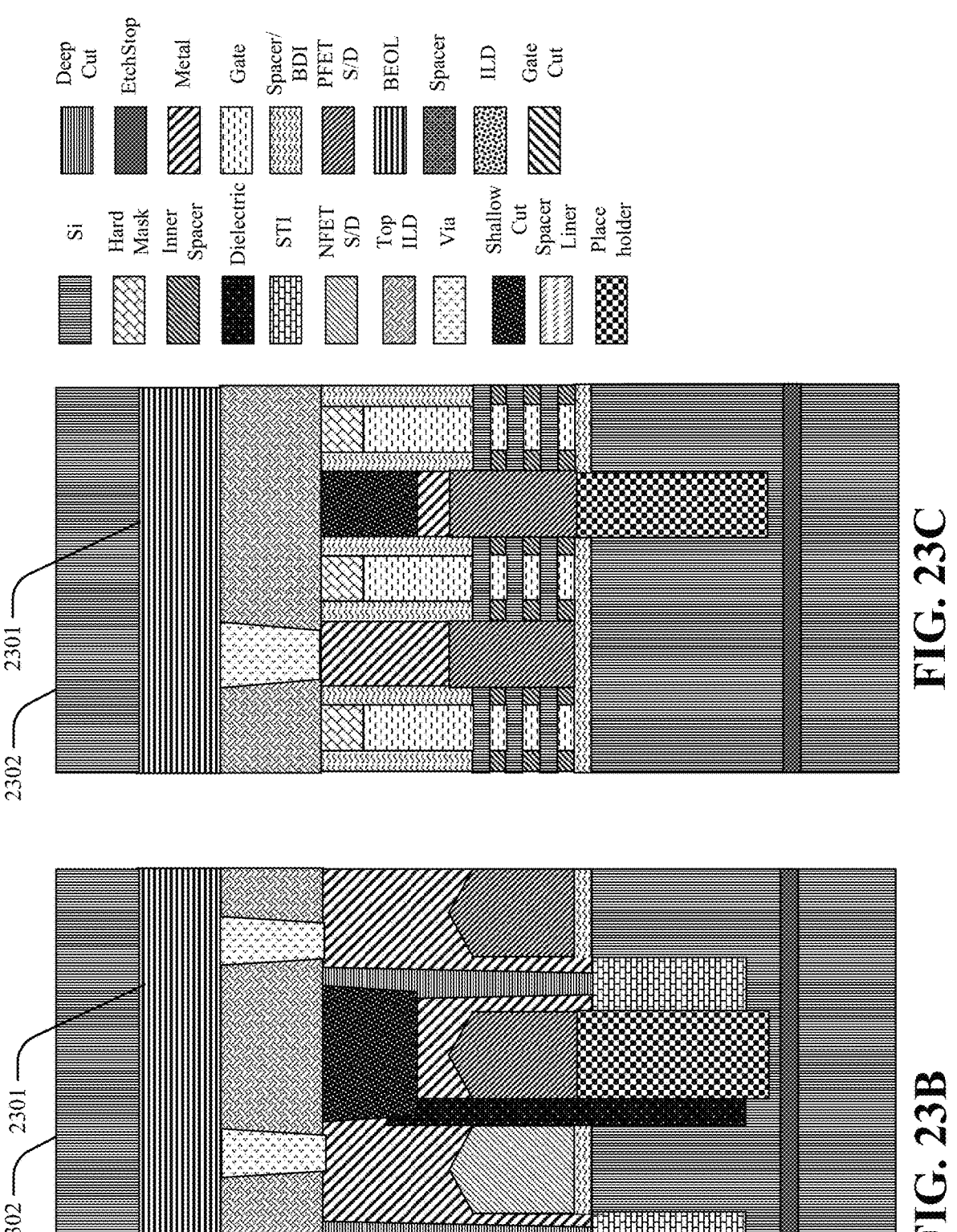

FIGS. 23A, 23B and 23C illustrate various cross-sections of a twenty-second stage of production of a semiconductor device in accordance with one or more embodiments described herein. FIG. 23A illustrates a cross-section along line 2212, FIG. 23B illustrates a cross-section along line 2211, and FIG. 23C illustrates a cross-section along line 2213. As shown, a back end of line formation (BEOL) 2301 can be formed to connect to vias 2201, 2202, 2203, 2204 and 2205 and a carrier wafer 2302 can be formed to enable the semiconductor device to be flipped onto carrier wafer 2302 in further stages of production.

Figure 24A:
FIGS. 24A, 24B and 24C illustrate various cross-sections of a twenty-third stage of production of a semiconductor device in accordance with one or more embodiments described herein.
Figure 24A:
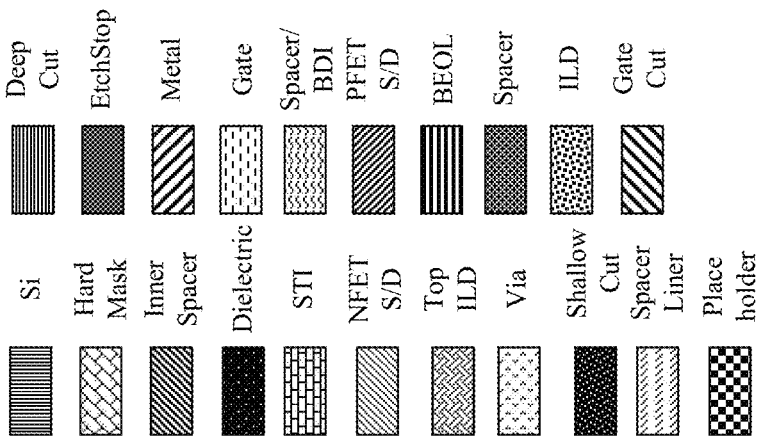
Figure 24A:
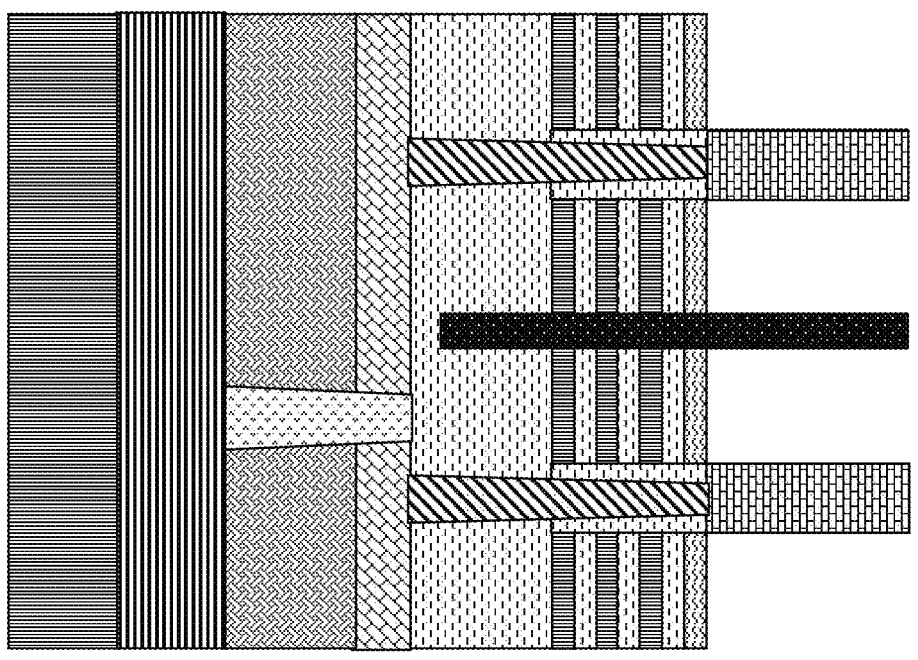
Figures 24B, 24C:
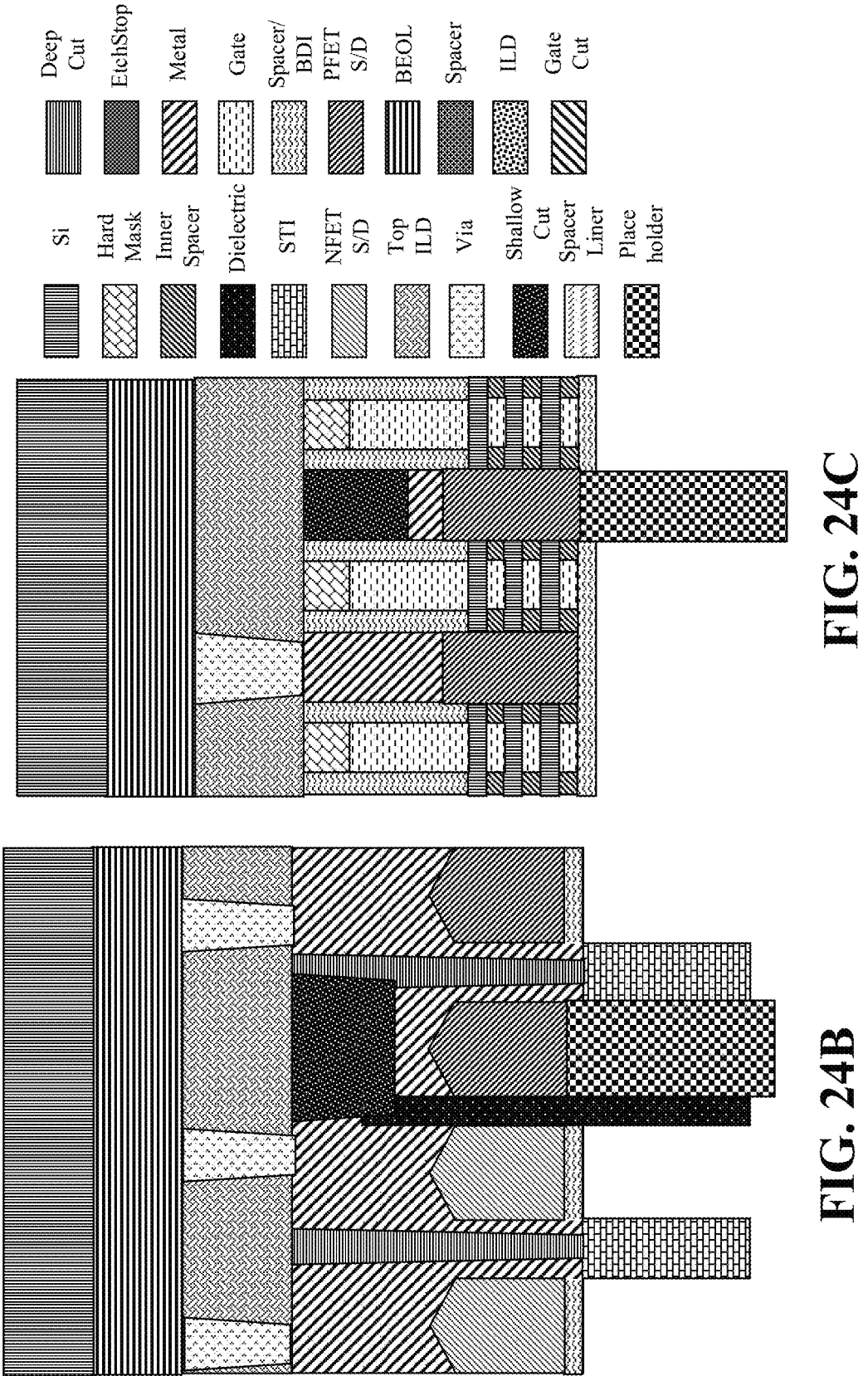

FIGS. 24A, 24B and 24C illustrate various cross-sections of a twenty-third stage of production of a semiconductor device in accordance with one or more embodiments described herein. FIG. 24A illustrates a cross-section along line 2212, FIG. 24B illustrates a cross-section along line 2211, and FIG. 24C illustrates a cross-section along line 2213. As shown, substrate 201 and etch stop layer 202 can be removed to expose the bottom of the semiconductor device.

Figure 25A:
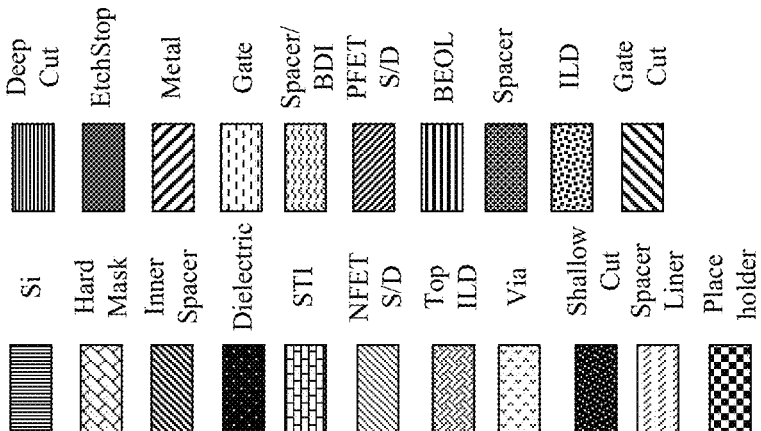
Figure 25A:
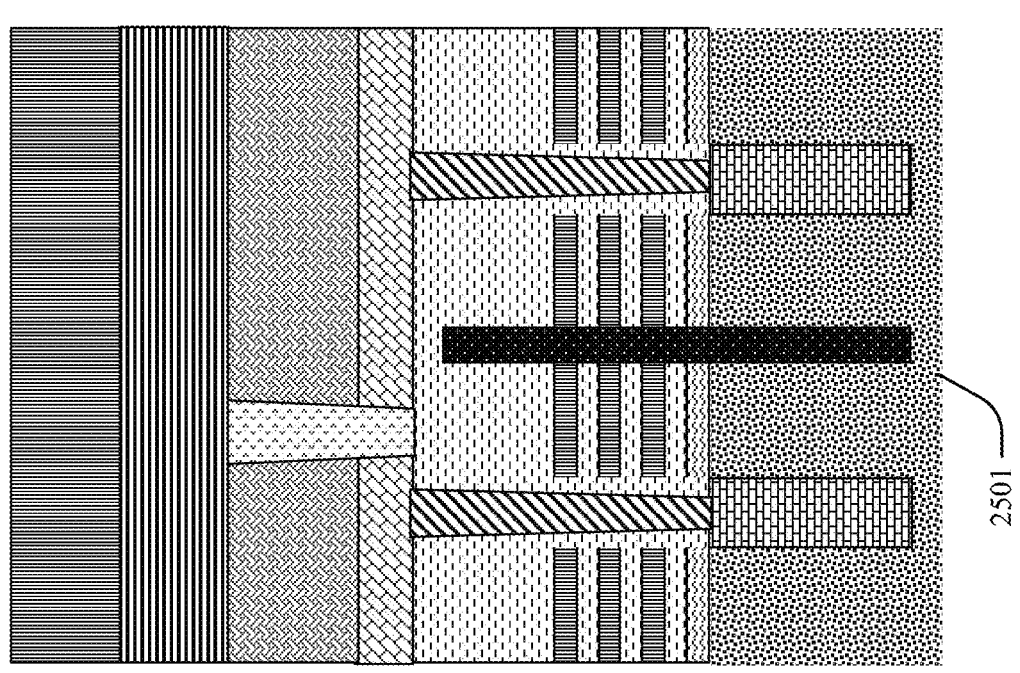

FIGS. 25A, 25B and 25C illustrate various cross-sections of a twenty-fourth stage of production of a semiconductor device in accordance with one or more embodiments described herein. FIG. 25A illustrates a cross-section along line 2212, FIG. 25B illustrates a cross-section along line 2211, and FIG. 25C illustrates a cross-section along line 2213. As shown, a backside ILD layer 2501 can be deposited, and a chemical-mechanical polishing (CMP) process can be utilized to expose the bottom of contact place holder 1101.

Figure 26A:
FIGS. 26A, 26B and 26C illustrate various cross-sections of a twenty-fifth stage of production of a semiconductor device in accordance with one or more embodiments described herein.
Figure 26A:
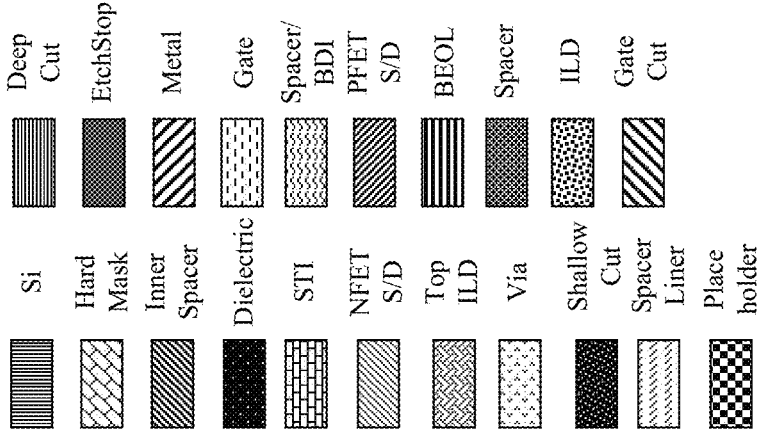
Figure 26A:
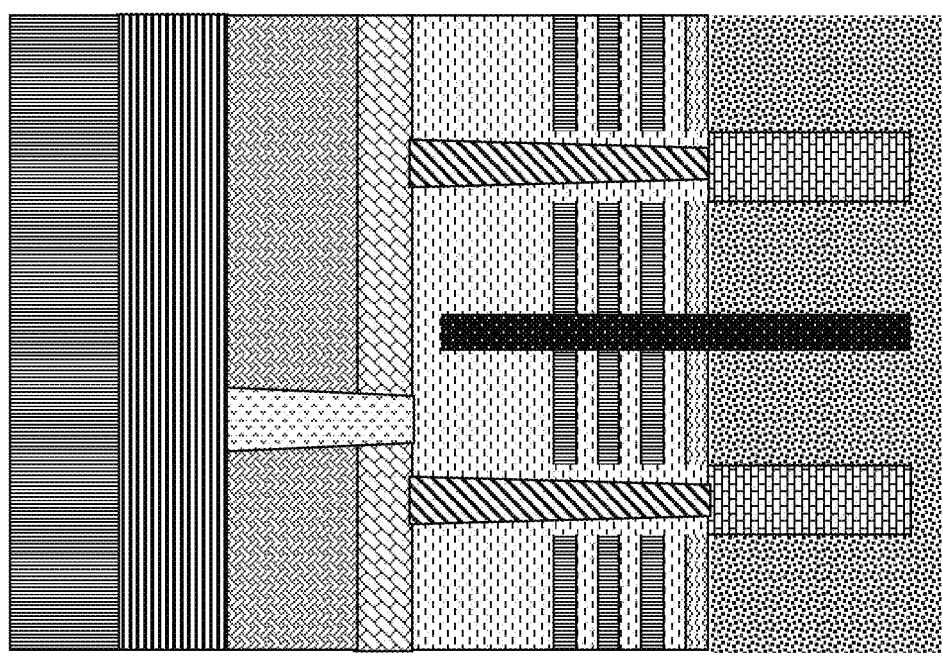
Figures 26B, 26C:
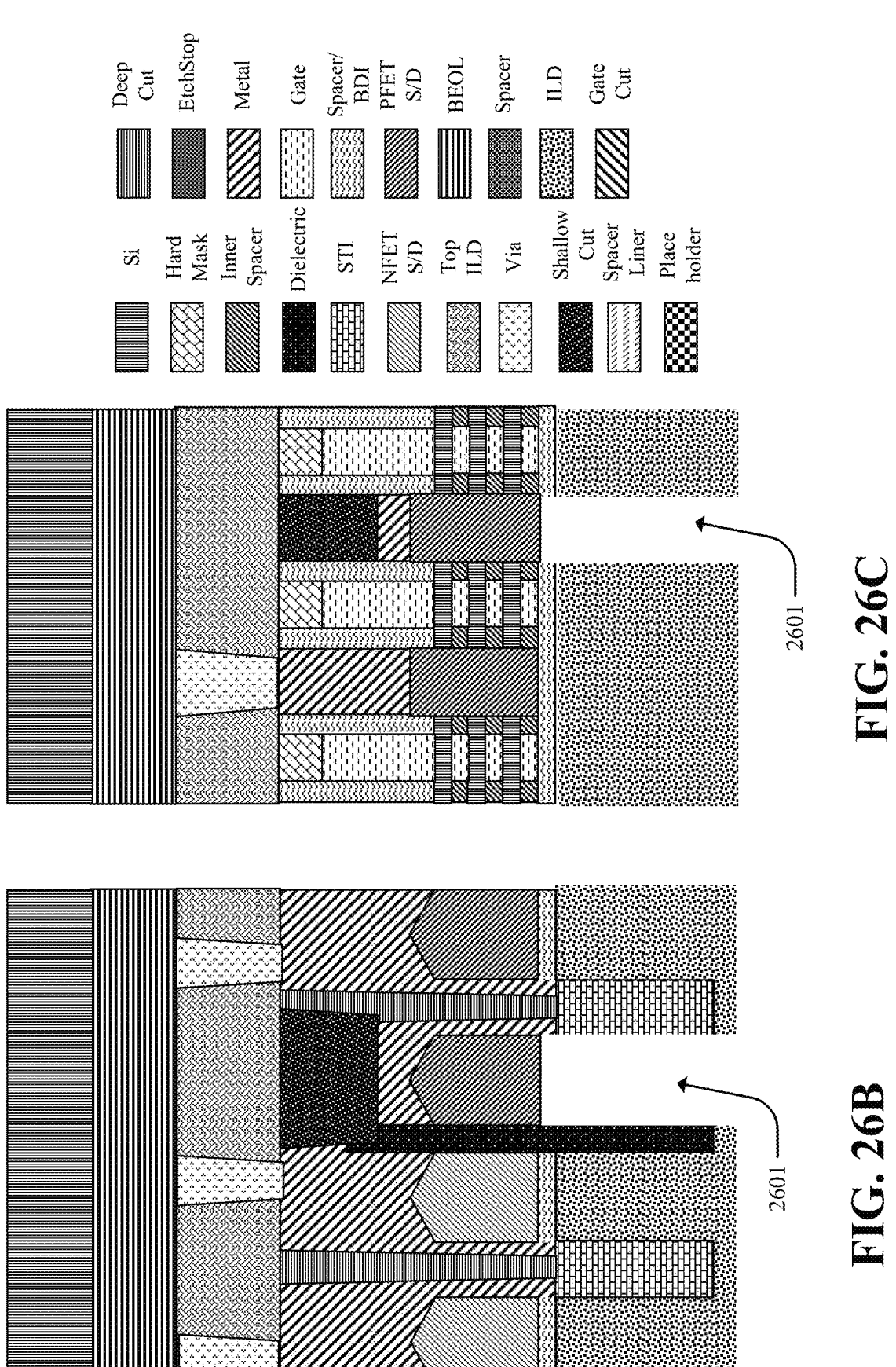

FIGS. 26A, 26B and 26C illustrate various cross-sections of a twenty-fifth stage of production of a semiconductor device in accordance with one or more embodiments described herein. FIG. 26A illustrates a cross-section along line 2212, FIG. 26B illustrates a cross-section along line 2211, and FIG. 26C illustrates a cross-section along line 2213. As shown, contact place holder 1101 can be removed via and etching processes to form channel 2601.

Figure 27A:
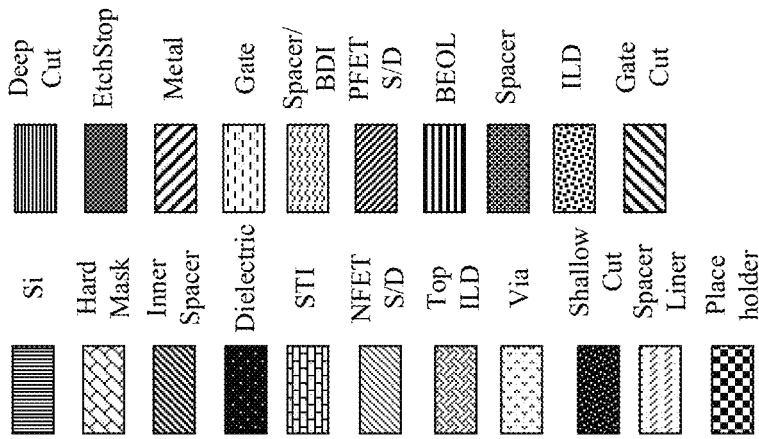
FIGS. 27A, 27B and 27C illustrate various cross-sections of a twenty-fifth stage of production of a semiconductor device in accordance with one or more embodiments described herein.
Figure 27A:
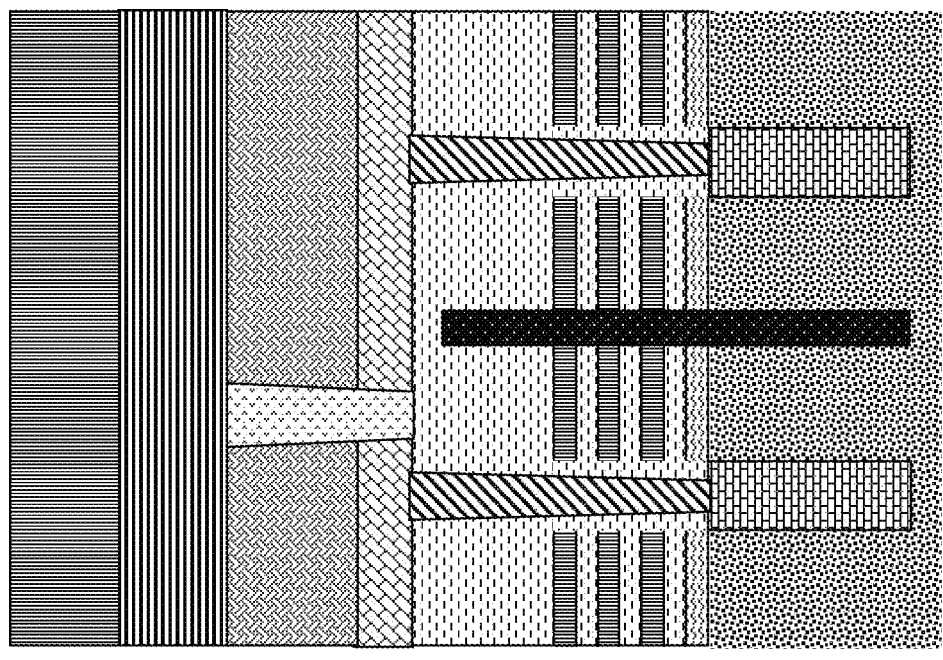
Figures 27B, 27C:
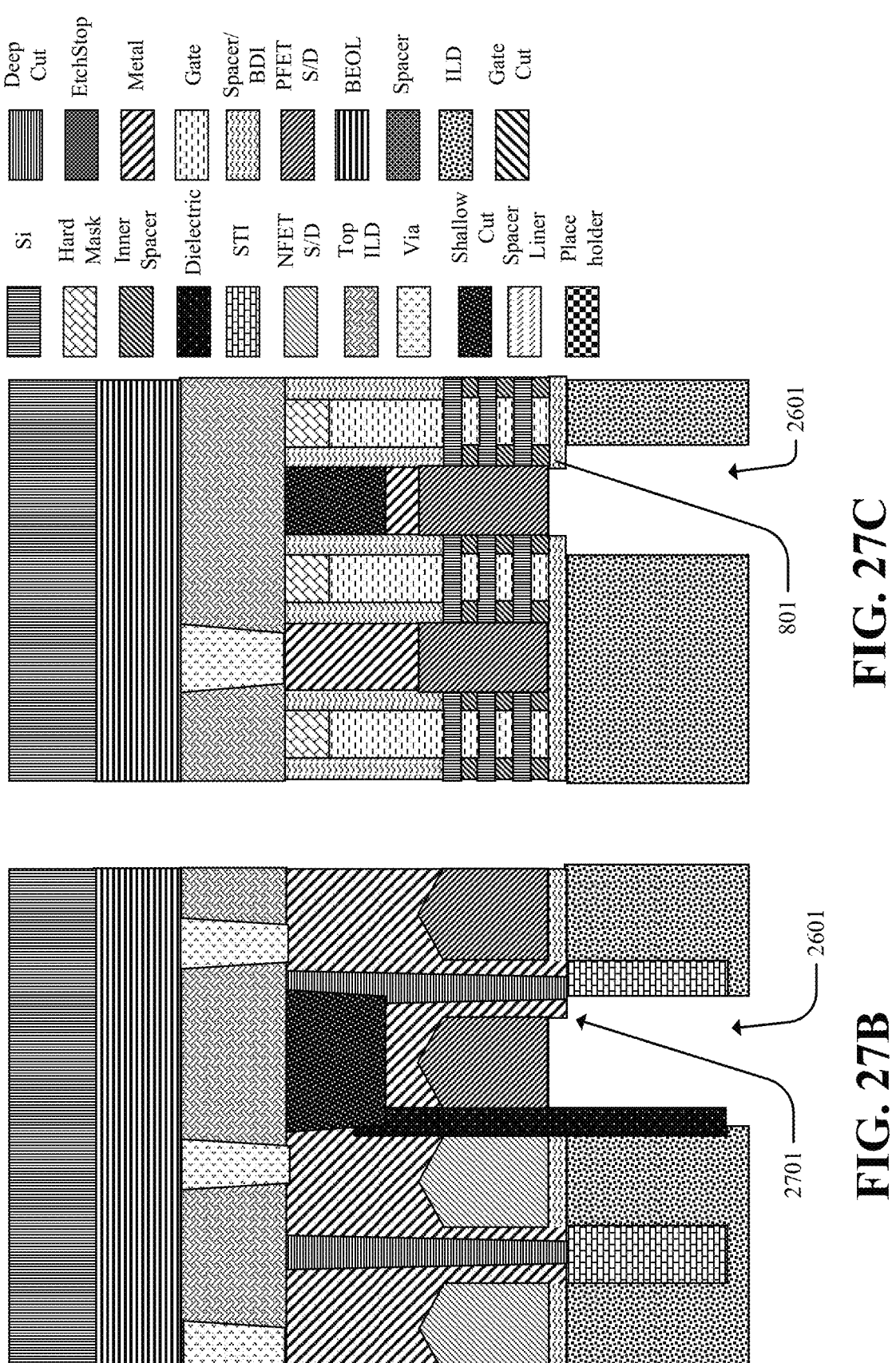

FIGS. 27A, 27B and 27C illustrate various cross-sections of a twenty-fifth stage of production of a semiconductor device in accordance with one or more embodiments described herein. FIG. 27A illustrates a cross-section along line 2212, FIG. 27B illustrates a cross-section along line 2211, and FIG. 27C illustrates a cross-section along line 2213. As shown, channel 2601 can be widened to an asymmetric shape to expose a portion 2701 of contact 2120 and BDI layer 801.

Figure 28A:
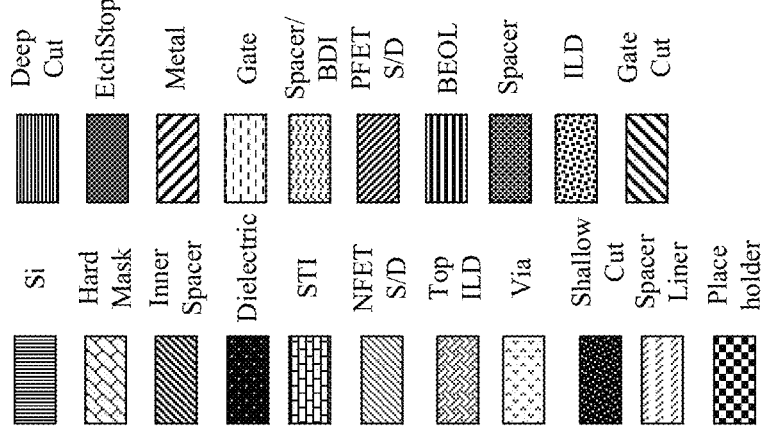
FIGS. 28A, 28B and 28C illustrate various cross-sections of a twenty-sixth stage of production of a semiconductor device in accordance with one or more embodiments described herein.
Figure 28A:
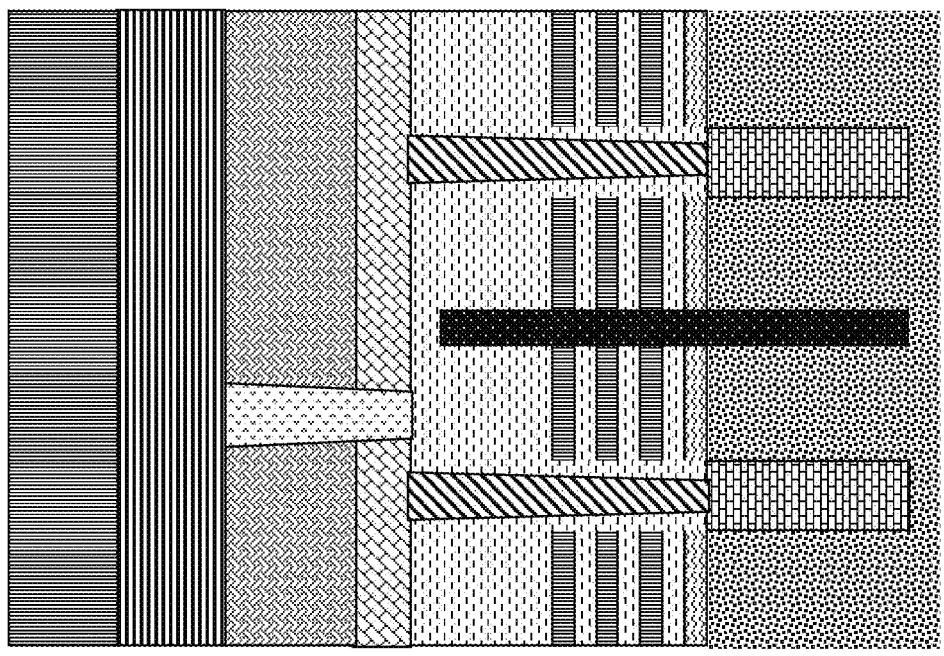
Figure 28C:
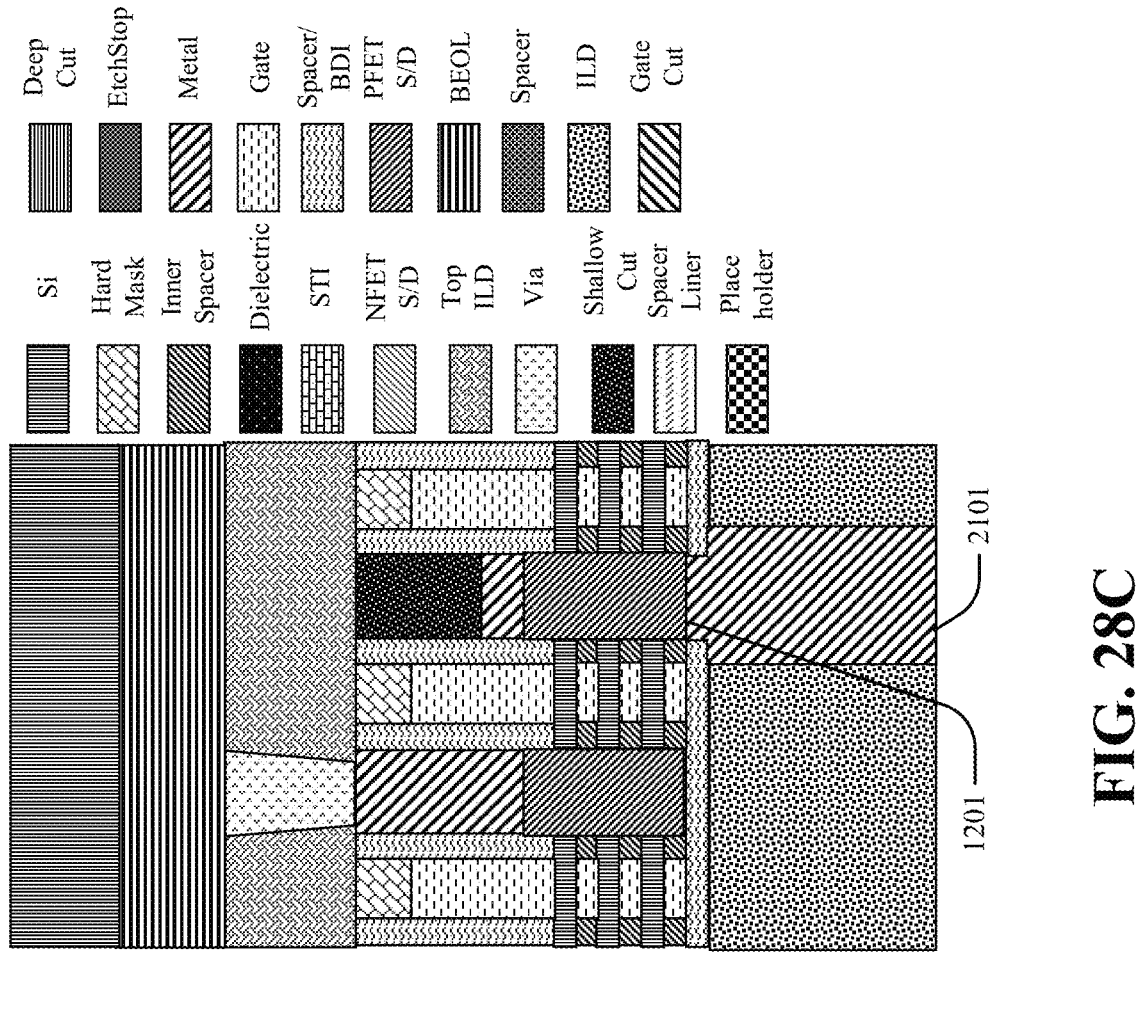
Figure 28B:
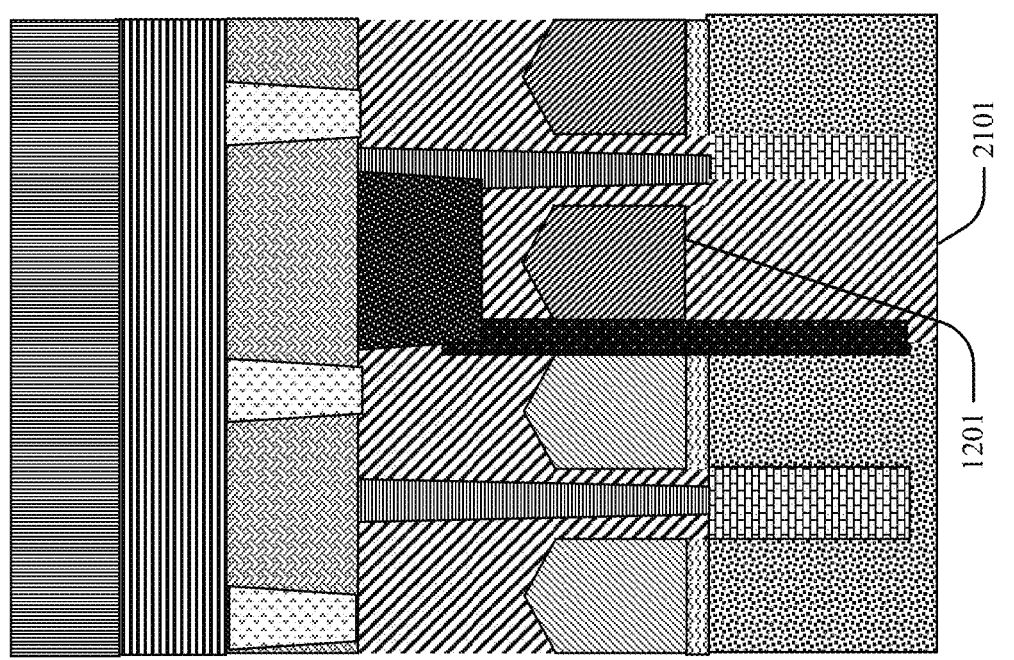

FIGS. 28A, 28B and 28C illustrate various cross-sections of a twenty-sixth stage of production of a semiconductor device in accordance with one or more embodiments described herein. FIG. 28A illustrates a cross-section along line 2212, FIG. 28B illustrates a cross-section along line 2211, and FIG. 28C illustrates a cross-section along line 2213. As shown, additional metal can be deposited in channel 2601 to expand contact 2120. As shown by FIG. 28B, contact 2120 now wraps around source/drain epi 1201 and is in contact with a top portion, a sidewall portion and a bottom portion of source/drain epi 1201. Furthermore, as shown, contact 2101 now comprises an asymmetric shape that extends towards source/drain epi 1201 and dielectric bar 401. Due to contact 2101 wrapping around source/drain epi 1201, contact 2101 and source/drain epi share a large amount of surface area, and resistance between source/drain epi 1201 and contact 2101 is reduced when compared to other designs.

Figure 29A:
FIGS. 29A, 29B and 29C illustrate various cross-sections of a twenty-seventh stage of production of a semiconductor device in accordance with one or more embodiments described herein.
Figures 29B, 29C:
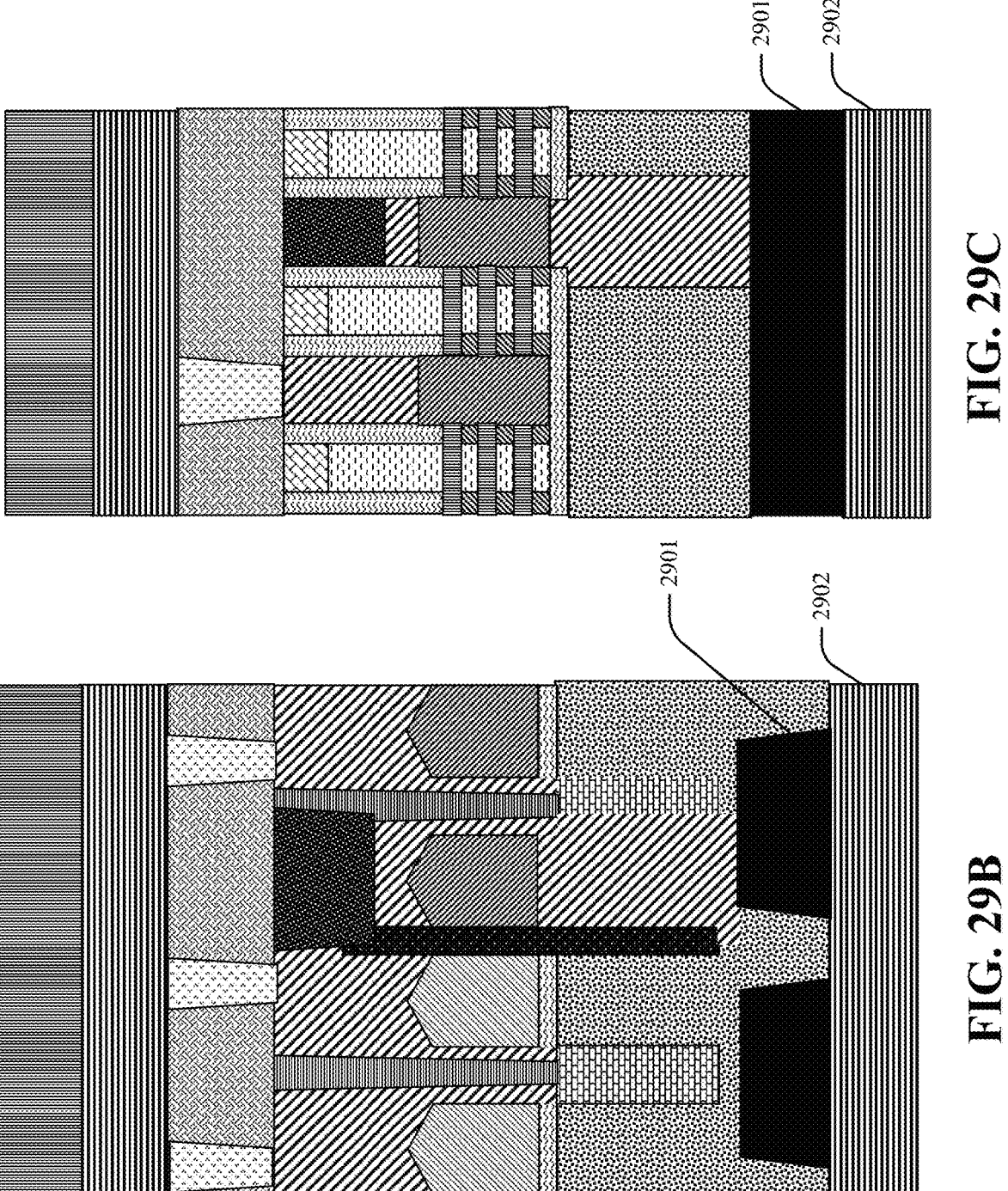

FIGS. 29A, 29B and 29C illustrate various cross-sections of a twenty-seventh stage of production of a semiconductor device in accordance with one or more embodiments described herein. FIG. 29A illustrates a cross-section along line 2212, FIG. 29B illustrates a cross-section along line 2211, and FIG. 29C illustrates a cross-section along line 2213. As shown, buried power rail 2901 and backside power delivery network 2902 can be formed on the bottom of the device. Accordingly, power can be supplied to source/drain epi 1201 via backside power delivery network 2902, buried power rail 2901 and contact 2101.

Figure 30:
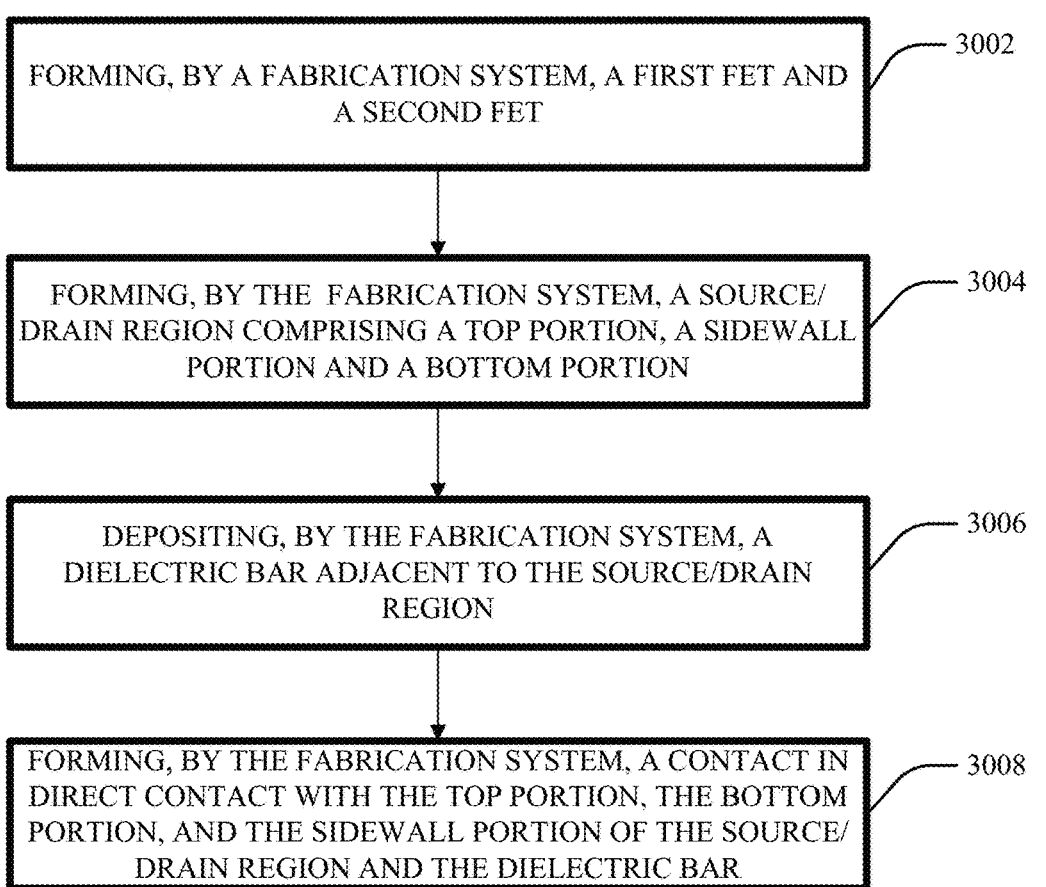
FIG. 30 illustrates a flow diagram of an example, non-limiting method of fabrication, by a fabrication system, of a semiconductor device in accordance with one or more embodiments described herein.

FIG. 30 illustrates a flow diagram of an example, non-limiting method of fabrication 3000, by a fabrication system, of a semiconductor device in accordance with one or more embodiments described herein.

At 3002, method 3000 can comprise, forming, by the fabrication system, a first FET and a second FET. For example, a nanosheet fabrication system can form a PFET and an NFET connected by one or more gates.

At 3004, method 3000 can comprise forming, by the fabrication system, a source/drain region comprising a top portion, a sidewall portion and a bottom portion. In an embodiment, the source/drain region can be located within the first FET or the second FET.

At 3006, method 3000 can comprise depositing, by the fabrication system, a dielectric bar adjacent to the source/drain region. For example, the dielectric bar can isolate the first FET from the second FET.

At 3008, method 3000 can comprise forming, by the fabrication system, a contact in direct contact with the top portion, the bottom portion, and the sidewall portion of the source/drain region and the dielectric bar.

An advantage of such methods, devices and/or systems is that they enabled semiconductor devices with increased performance. For example, having the contact wrap around a source/drain epi, surface area between the source/drain epi and the contact is increased, thereby decreasing resistance between the contact and the source/drain epi and improving performance of the semiconductor device.

What is claimed is:

1. A semiconductor device comprising:
a source/drain region comprising a top portion, a first sidewall portion, a second sidewall portion, and a bottom portion;
a dielectric bar in contact with the second sidewall portion of the source/drain region; and
a contact in direct contact with the top portion, the first sidewall portion and the bottom portion of the source/drain region and with the dielectric bar.

2. The semiconductor device of claim 1, further comprising a first FET and a second FET, wherein the dielectric bar is located between the first FET and the second FET.

3. The semiconductor device of claim 1, wherein the dielectric bar comprises a first portion above the source/drain region and a second portion below the source/drain region.

4. The semiconductor device of claim 3, wherein the contact is in direct contact with the first portion of the dielectric bar and the second portion of the dielectric bar.

5. The semiconductor device of claim 1, further comprising a backside power delivery network coupled to a bottom portion of the contact, wherein the contact comprises an asymmetric extension towards the second sidewall portion.

6. The semiconductor device of claim 2, wherein the dielectric bar isolates a first gate region of the first FET and a second gate region of the second FET.

7. The semiconductor device of claim 2, wherein the first FET comprises a first type of FET and the second FET comprises a second type of FET.

8. A semiconductor device comprising:
a source/drain region located at a boundary between a first FET and a second FET and in contact with a dielectric bar on one side; and
a contact that surrounds the source/drain region on at least three sides.

9. The semiconductor device of claim 8, wherein the source/drain region is isolated by a dielectric bar.

10. The semiconductor device of claim 9, further comprising a contact cut over the contact.

11. The semiconductor device of claim 10, wherein the contact cut partially overlaps with the dielectric bar.

12. The semiconductor device of claim 8, wherein the first FET comprises a first type of FET and the second FET comprises a second type of FET.

13. The semiconductor device of claim 8, further comprising a backside power delivery network coupled to the contact.

* * * * *